United States Patent
Ishibashi et al.

(10) Patent No.: US 9,923,063 B2
(45) Date of Patent: *Mar. 20, 2018

(54) GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

(71) Applicant: SUMITOMO ELECTRIC INDUSTRIES, LTD., Osaka-shi, Osaka (JP)

(72) Inventors: Keiji Ishibashi, Itami (JP); Takuya Yanagisawa, Itami (JP); Koji Uematsu, Itami (JP); Yuki Seki, Itami (JP); Yoshiyuki Yamamoto, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/767,706

(22) PCT Filed: Nov. 12, 2013

(86) PCT No.: PCT/JP2013/080550
§ 371 (c)(1),
(2) Date: Aug. 13, 2015

(87) PCT Pub. No.: WO2014/125688
PCT Pub. Date: Aug. 21, 2014

(65) Prior Publication Data
US 2015/0380496 A1    Dec. 31, 2015

(30) Foreign Application Priority Data

Feb. 18, 2013 (JP) .................. 2013-029119
Feb. 18, 2013 (JP) .................. 2013-029123
Feb. 18, 2013 (JP) .................. 2013-029126

(51) Int. Cl.
*H01L 21/683* (2006.01)
*H01L 29/20* (2006.01)
(Continued)

(52) U.S. Cl.
CPC ...... *H01L 29/2003* (2013.01); *H01L 21/0242* (2013.01); *H01L 21/0254* (2013.01);
(Continued)

(58) Field of Classification Search
CPC ....... H01L 29/20; H01L 21/02; H01L 21/306; H01L 21/683; H01L 33/00; H01L 33/32
(Continued)

(56) References Cited

U.S. PATENT DOCUMENTS 5,406,123 A    4/1995  Narayan
6,391,748 B1   5/2002  Temkin et al.
(Continued)

FOREIGN PATENT DOCUMENTS

CN    1960014 A    5/2007
CN    102157638 A   8/2011
(Continued)

OTHER PUBLICATIONS

Notice of Allowance issued in related U.S. Appl. No. 14/097,460 on Dec. 8, 2015.
(Continued)

*Primary Examiner* — Asok Kumar Sarkar
*Assistant Examiner* — Dmitriy Yemelyanov
(74) *Attorney, Agent, or Firm* — Drinker Biddle & Reath LLP

(57) ABSTRACT

A group III nitride composite substrate with a diameter of 75 mm or more includes a support substrate and a group III nitride film with a thickness of 50 nm or more and less than 10 μm that are bonded to each other. A ratio $s_t/m_t$ of a standard deviation $s_t$ of the thickness of the group III nitride
(Continued)

film to a mean value $m_t$ of the thickness thereof is 0.01 or more and 0.5 or less, and a ratio $s_o/m_o$ of a standard deviation $s_o$ of an absolute value of an off angle between a main surface of the group III nitride film and a plane of a predetermined plane orientation to a mean value $m_o$ of the absolute value of the off angle is 0.005 or more and 0.6 or less.

14 Claims, 15 Drawing Sheets

(51) Int. Cl.
    H01L 33/32      (2010.01)
    H01L 33/00      (2010.01)
    H01L 21/02      (2006.01)
    H01L 21/306     (2006.01)
(52) U.S. Cl.
    CPC .. *H01L 21/02389* (2013.01); *H01L 21/02439* (2013.01); *H01L 21/02587* (2013.01); *H01L 21/02609* (2013.01); *H01L 21/30604* (2013.01); *H01L 21/30621* (2013.01); *H01L 21/30625* (2013.01); *H01L 21/6835* (2013.01); *H01L 33/0079* (2013.01); *H01L 33/32* (2013.01); *H01L 2221/6835* (2013.01); *H01L 2221/68327* (2013.01); *H01L 2221/68345* (2013.01); *H01L 2221/68381* (2013.01); *H01L 2924/0002* (2013.01)
(58) Field of Classification Search
    USPC .......................................... 257/615; 438/478
    See application file for complete search history.

(56) References Cited

U.S. PATENT DOCUMENTS

| | | | |
|---|---|---|---|
| 6,413,627 B1 | 7/2002 | Motoki et al. | |
| 6,521,514 B1 | 2/2003 | Gehrke et al. | |
| 6,617,060 B2 | 9/2003 | Weeks, Jr. et al. | |
| 6,673,149 B1 | 1/2004 | Solomon et al. | |
| 6,989,202 B2 | 1/2006 | Asai et al. | |
| 7,803,717 B2 | 9/2010 | Rawdanowicz et al. | |
| 9,136,337 B2* | 9/2015 | Ishibashi | H01L 21/2007 |
| 9,312,165 B2 | 4/2016 | Hachigo et al. | |
| 2004/0056211 A1 | 3/2004 | Popiolkowski et al. | |
| 2004/0072410 A1 | 4/2004 | Motoki et al. | |
| 2004/0221799 A1* | 11/2004 | Nakayama | B24B 37/08 117/94 |
| 2004/0232440 A1 | 11/2004 | Ohtsuka et al. | |
| 2005/0103257 A1 | 5/2005 | Xu et al. | |
| 2005/0124161 A1 | 6/2005 | Rawdanowicz et al. | |
| 2006/0046331 A1 | 3/2006 | Kiyama et al. | |
| 2006/0189017 A1* | 8/2006 | Nogami | H01L 21/30612 438/46 |
| 2006/0267043 A1 | 11/2006 | Emerson et al. | |
| 2006/0278891 A1 | 12/2006 | Saxler et al. | |
| 2007/0051969 A1 | 3/2007 | Oshima et al. | |
| 2007/0096147 A1 | 5/2007 | Oshima | |
| 2007/0141823 A1 | 6/2007 | Preble et al. | |
| 2007/0158785 A1 | 7/2007 | D'Evelyn et al. | |
| 2007/0164306 A1 | 7/2007 | Nakahata et al. | |
| 2007/0281484 A1* | 12/2007 | Ishibashi | C09G 1/02 438/692 |
| 2008/0169483 A1* | 7/2008 | Kasai | H01L 21/187 257/183 |
| 2008/0296584 A1 | 12/2008 | Hachigo | |
| 2008/0315209 A1 | 12/2008 | Miura et al. | |
| 2009/0048659 A1 | 2/2009 | Weber et al. | |
| 2009/0127662 A1 | 5/2009 | Okahisa et al. | |
| 2009/0155987 A1 | 6/2009 | Lee | |
| 2009/0278233 A1 | 11/2009 | Pinnington et al. | |
| 2009/0315150 A1* | 12/2009 | Hirota | C30B 9/00 257/615 |
| 2010/0025228 A1 | 2/2010 | Tauzin et al. | |
| 2010/0164070 A1 | 7/2010 | Okahisa et al. | |
| 2010/0210089 A1 | 8/2010 | Kasai et al. | |
| 2010/0244196 A1 | 9/2010 | Yoshida | |
| 2010/0251865 A1* | 10/2010 | Ueno | C30B 25/18 83/13 |
| 2010/0295055 A1 | 11/2010 | Yamamoto | |
| 2010/0320506 A1 | 12/2010 | Varangis et al. | |
| 2011/0018003 A1 | 1/2011 | Okahisa et al. | |
| 2011/0101502 A1 | 5/2011 | Wang | |
| 2011/0108886 A1 | 5/2011 | Marchand et al. | |
| 2011/0121311 A1 | 5/2011 | Sato et al. | |
| 2011/0127581 A1 | 6/2011 | Bethoux et al. | |
| 2011/0133242 A1 | 6/2011 | Choi et al. | |
| 2011/0272734 A1 | 11/2011 | Hachigo et al. | |
| 2011/0298009 A1 | 12/2011 | Ikuta et al. | |
| 2012/0018855 A1 | 1/2012 | Colnat | |
| 2012/0070929 A1 | 3/2012 | Hashimoto et al. | |
| 2012/0174855 A1 | 7/2012 | Wei et al. | |
| 2012/0256297 A1 | 10/2012 | Morioka et al. | |
| 2012/0305066 A1 | 12/2012 | Fisher et al. | |
| 2013/0020580 A1 | 1/2013 | Evans et al. | |
| 2013/0032928 A1 | 2/2013 | Satoh et al. | |
| 2013/0082274 A1 | 4/2013 | Yang et al. | |
| 2013/0082280 A1 | 4/2013 | Lin et al. | |
| 2013/0137220 A1 | 5/2013 | Matsubara et al. | |
| 2013/0149492 A1 | 6/2013 | Yoon et al. | |
| 2013/0161636 A1 | 6/2013 | Werkhoven et al. | |
| 2013/0260093 A1 | 10/2013 | Wei et al. | |
| 2013/0285067 A1 | 10/2013 | Bethoux et al. | |
| 2013/0316507 A1 | 11/2013 | Saitoh et al. | |
| 2014/0103353 A1 | 4/2014 | Ishibashi et al. | |
| 2014/0225229 A1 | 8/2014 | Hachigo et al. | |
| 2014/0342127 A1 | 11/2014 | Dimitrakopoutos et al. | |
| 2015/0194442 A1 | 7/2015 | Ishibashi et al. | |

FOREIGN PATENT DOCUMENTS

| | | |
|---|---|---|
| JP | H09-219540 A | 8/1997 |
| JP | 2002-319545 A | 10/2002 |
| JP | 2003-165798 A | 6/2003 |
| JP | 2006-210660 A | 8/2006 |
| JP | 2008-010766 A | 1/2008 |
| JP | 2008-166646 A | 7/2008 |
| JP | 2008-303138 A | 12/2008 |
| JP | 2009-126722 A | 6/2009 |
| JP | 2009-182341 A | 8/2009 |
| JP | 2010-182936 A | 8/2010 |
| JP | 2010-269970 A | 12/2010 |
| JP | 2011-061084 A | 3/2011 |
| JP | 2011-135054 A | 7/2011 |
| JP | 2012-114263 A | 6/2012 |
| JP | 2012-230969 A | 11/2012 |
| JP | 2012-243792 A | 12/2012 |
| KR | 2004-0078211 A | 9/2004 |
| KR | 2008-0065792 A | 7/2008 |
| KR | 20090065860 A | 6/2009 |
| TW | 201230194 A | 7/2012 |
| WO | WO-2011/093481 A1 | 8/2011 |
| WO | WO-2012/066033 A1 | 5/2012 |
| WO | WO-2013/021902 A1 | 2/2013 |
| WO | WO-2015/053127 A1 | 4/2015 |

OTHER PUBLICATIONS

Extended European Search Report issued May 3, 2016 in European Patent Application No. 13845267.7.
Office Action issued Jun. 22, 2016 in Chinese Patent Application No. 201380046378.9 (6 pages) with an English Translation (4 pages).
Notice of Grounds of Rejection issued Feb. 14, 2017 in Japanese Patent Application No. 2013-179839 (2 pages) with an English translation (3 pages).
Notice of Grounds of Rejection issued Feb. 14, 2017 in Japanese Patent Application No. 2013-029115 (2 pages) with an English translation (2 pages).

(56) References Cited

OTHER PUBLICATIONS

Office Action issued Jan. 27, 2017 in U.S. Appl. No. 15/061,337.
Notice of Grounds of Rejection issued Dec. 6, 2016 in Japanese Patent Application No. 2013-029125 (3 pages) with an English Translation (3 pages).
Office Action dated Jun. 5, 2017 in U.S. Appl. No. 15/061,337.
Office Action dated Apr. 14, 2017 in U.S. Appl. No. 14/419,315.
Advisory Action dated May 16, 2017 in U.S. Appl. No. 15/061,337.
Notice of Allowance dated Aug. 1, 2017 in U.S. Appl. No. 14/419,315.
Office Action dated Jul. 13, 2017 in Taiwanese Patent Application No. 102133515 (6 pages) with an English translation (5 pages).
Office Action dated Aug. 29, 2017 in U.S. Appl. No. 15/061,337.
Advisory Action dated Sep. 12, 2017 in U.S. Appl. No. 15/061,337.
Notice of Allowance dated Oct. 25, 2017 in U.S. Appl. No. 14/419,315.
U.S. Appl. No. 15/879,018, filed Jan. 24, 2018, Ishibashi et al.

* cited by examiner

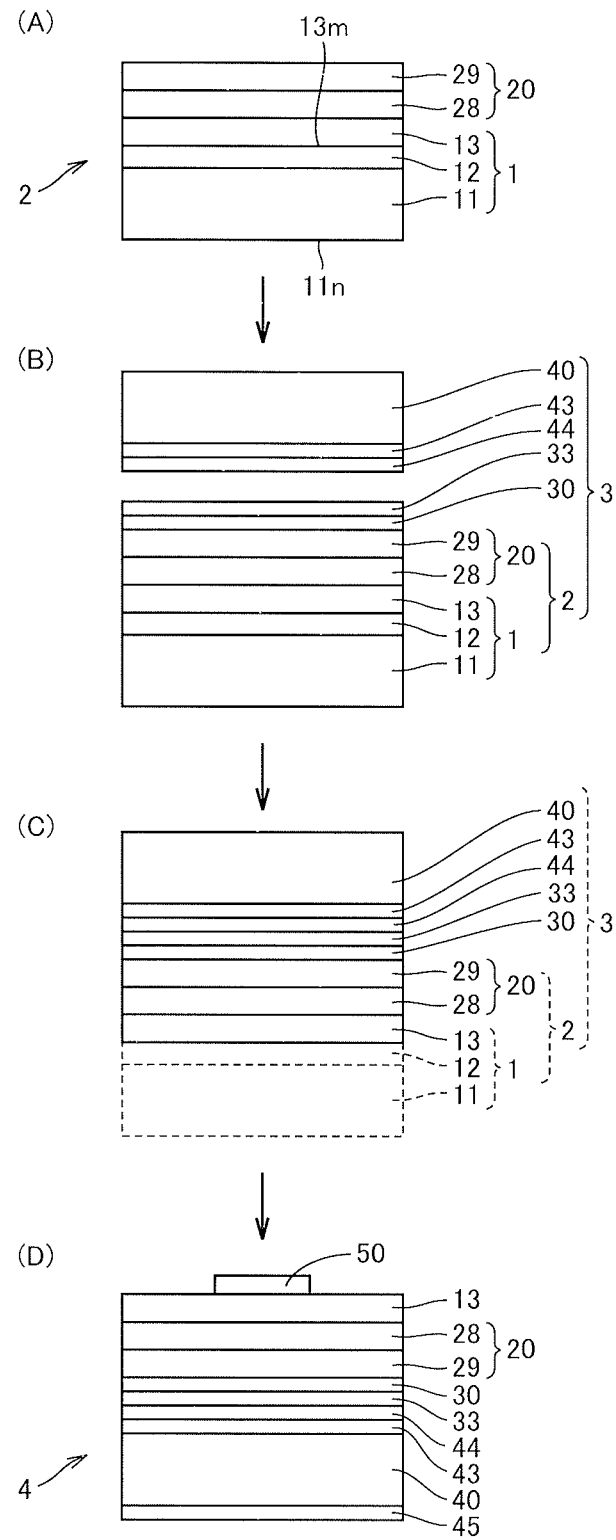

GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

TECHNICAL FIELD

The present invention relates to a group III nitride composite substrate and a method for manufacturing the same, a laminated group III nitride composite substrate, and a group III nitride semiconductor device and a method for manufacturing the same.

BACKGROUND ART

Group III nitrides such as GaN have superior semiconductor properties and are therefore used as materials suitable for semiconductor devices. In addition, group III nitrides such as GaN have excellent material properties different from those of Si, GaAs, SiC, or the like for different types of semiconductor devices such as light-emitting device and electronic device for example, and can therefore be used for a variety of devices.

For example, Japanese Patent Laying-Open No. 2009-126722 (PTD 1) discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof, a free-standing GaN substrate having a diameter of 100 mm and a thickness of 400 μm.

Japanese Patent Laying-Open No. 2008-010766 (PTD 2) discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 μm or more and 100 μm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 μm or 100 μm and bonded to the sapphire substrate.

Japanese Patent Laying-Open No. 2010-182936 (PTD 3) discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof, a composite substrate having a diameter of 50.8 mm and including a sapphire substrate, a GaN layer, and a joint layer formed by press fitting between the substrate and the GaN layer, in which the GaN layer has a thickness of 5 μm to 220 μm.

CITATION LIST

Patent Document

PTD 1: Japanese Patent Laying-Open No. 2009-126722
PTD 2: Japanese Patent Laying-Open No. 2008-010766
PTD 3: Japanese Patent Laying-Open No. 2010-182936

SUMMARY OF INVENTION

Technical Problem

The free-standing group III nitride substrate disclosed in Japanese Patent Laying-Open No. 2009-126722 (PTD 1) involves problems that the substrate is manufactured at high cost and therefore very expensive, and that the substrate is likely to crack, resulting in difficulty in increasing the diameter of the substrate and decreasing the thickness thereof. Further, it is necessary to reduce the thickness of the free-standing group III nitride substrate when a semiconductor device is to be formed, which is accompanied by a problem of an increase in manufacturing cost due to a process step such as grinding of the rear surface (a main surface opposite to a main surface on which a group III nitride layer is formed for implementing device functions, and this definition of the rear surface is applied hereinafter) of the free-standing group III nitride substrate.

Regarding the GaN-thin-film-bonded substrate having the GaN thin film of 0.1 μm in thickness as disclosed in Japanese Patent Laying-Open No. 2008-010766 (PTD 2), ion implantation is performed to form the GaN thin film, which, however, involves a problem that the ion implantation degrades the crystal quality of the GaN thin film. In particular, the GaN-thin-film-bonded substrate in which the GaN thin film has a small thickness of approximately 0.1 μm involves a problem that the variation (namely difference), within a main surface, of the thickness of the GaN thin film is large. Further, in order to enhance the characteristics of the semiconductor device to be formed, the thickness of the GaN thin film is preferably 10 μm or more. An increase in thickness of the GaN thin film, however, involves a problem that the variation in depth to which ions are implanted from the main surface increases, which accordingly increases the variation, within the main surface, of the thickness of the GaN thin film in the resultant GaN thin film composite substrate. Furthermore, the GaN thin film composite substrate with its diameter increased involves a problem that the variation, within the main surface, of the thickness of the GaN thin film further increases.

Regarding the GaN-thin-film-bonded substrate having the GaN thin film of 100 μm in thickness as disclosed in Japanese Patent Laying-Open No. 2008-010766 (PTD 2) as well as the composite substrate having the GaN layer of 5 μm to 220 μm in thickness as disclosed in Japanese Patent Laying-Open No. 2010-182936 (PTD 3), both these substrates have a diameter on the order of 50.8 mm. Increase of the diameter, however, involves a problem that the variation, within the main surface, of the thickness of the GaN thin film or the GaN layer increases.

Such a GaN-thin-film-bonded substrate or composite substrate in which the variation, within the main surface, of the thickness of the GaN thin film or GaN layer is large involves problems that it is difficult to grow a semiconductor layer of a high crystal quality on the main surface of the GaN thin film or GaN layer and it is difficult to increase the yield of semiconductor devices obtained accordingly.

An object of the present invention is to solve the above problems and provide a low-cost and large-diameter group III nitride composite substrate having a group III nitride film with a small thickness, a small thickness variation, and a high crystal quality and thereby reducing the cost of manufacture of semiconductor devices, a method for manufacturing the group III nitride composite substrate, a laminated group III nitride composite substrate, and a group III nitride semiconductor device and a method for manufacturing the same.

Solution to Problem

According to an aspect, the present invention is a group III nitride composite substrate with a diameter of 75 mm or more including a support substrate and a group III nitride film with a thickness of 50 nm or more and less than 10 μm that are bonded to each other, a ratio $s_t/m_t$ of a standard deviation $s_t$ of the thickness of the group III nitride film, to a mean value $m_t$ of the thickness thereof is 0.01 or more and 0.5 or less, and a ratio $s_o/m_o$ of a standard deviation $s_o$ of an absolute value of an off angle between a main surface of the group III nitride film and a plane of a predetermined plane orientation, to a mean value $m_o$ of the absolute value of the off angle is 0.005 or more and 0.6 or less.

Regarding the group III nitride composite substrate according to this aspect of the present invention, a mean value $m_{III-N}$ of a root mean square roughness of a group III-nitride-film-side main surface of the group III nitride composite substrate may be 0.4 nm or more and 10 nm or less, and a ratio $s_{III-N}/m_{III-N}$ of a standard deviation $s_{III-N}$ of the root mean square roughness of the group III-nitride-film-side main surface, to the mean value $m_{III-N}$ thereof may be 0.008 or more and 0.5 or less. Further, a ratio $W_{III-N}/D$ of a warp $W_{III-N}$ of a group III-nitride-film-side main surface of the group III nitride composite substrate to a diameter D of the group III nitride composite substrate may be $-7\times10^{-4}$ or more and $8\times10^{-4}$ or less. Further, a ratio $\alpha_{III-N}/\alpha_S$ of a thermal expansion coefficient $\alpha_{III-N}$ of the group III nitride film to a thermal expansion coefficient $\alpha_s$ of the support substrate may be 0.75 or more and 1.25 or less, and a ratio $t_{III-N}/t_S$ of a thickness $t_{III-N}$ of the group III nitride film to a thickness $t_s$ of the support substrate may be $1\times10^{-4}$ or more and $2\times10^{-2}$ or less. Further, impurity metal atoms of the main surface of the group III nitride film may be $1\times10^{13}$ atoms/cm$^2$ or less. Further, the support substrate may have a thermal conductivity $\lambda_S$ of 3 W·m$^{-1}$·K$^{-1}$ or more and 280 W·m$^{-1}$·K$^{-1}$ or less. Further, the support substrate may have a Young's modulus $E_S$ of 150 GPa or more and 500 GPa or less. Further, the group III nitride composite substrate may have a diameter of 100 mm or more.

According to another aspect, the present invention is a laminated group III nitride composite substrate including the group III nitride composite substrate according to the above aspect, and at least one group III nitride layer disposed on a group III-nitride-film-side main surface of the group III nitride composite substrate.

According to still another aspect, the present invention is a group III nitride semiconductor device including the group III nitride film in the group III nitride composite substrate according to the above aspect, and at least one group III nitride layer disposed on the group III nitride film.

According to a further aspect, the present invention is a method for manufacturing a group III nitride composite substrate according to the above aspect, including the steps of:

forming the group III nitride composite substrate by disposing the group III nitride film on a main surface side of the support substrate; and adjusting the thickness of the group III nitride film and the off angle between the main surface of the group III nitride film and a plane of a predetermined plane orientation by performing at least one of polishing and etching on a group III-nitride-film-side main surface of the group III nitride composite substrate, after the step of forming the group III nitride composite substrate.

According to a still further aspect, the present invention is a method for manufacturing a group III nitride semiconductor device, including the steps of preparing the group III nitride composite substrate according to the above aspect; and growing at least one group III nitride layer on a group III-nitride-film-side main surface of the group III nitride composite substrate.

The method for manufacturing a group III nitride semiconductor device according to the above aspect of the present invention may further include the step of removing the support substrate from the group III nitride composite substrate, after the step of growing the group III nitride layer. It may further include the step of bonding a device support substrate onto the group III nitride layer, after the step of growing the group III nitride layer and before the step of removing the support substrate.

Advantageous Effects of Invention

In accordance with the present invention, there can be provided a low-cost and large-diameter group III nitride composite substrate having a group III nitride film with a small thickness, a small thickness variation, and a high crystal quality and thereby reducing the cost of manufacture of semiconductor devices, a method for manufacturing the group III nitride composite substrate, a laminated group III nitride composite substrate, and a group III nitride semiconductor device and a method for manufacturing the same.

BRIEF DESCRIPTION OF DRAWINGS

FIG. 22 is a schematic cross-sectional view showing an example of the method for manufacturing a group III nitride semiconductor device according to Reference Invention II.

DESCRIPTION OF EMBODIMENTS

First Embodiment: Group III Nitride Composite Substrate

Figure 1:
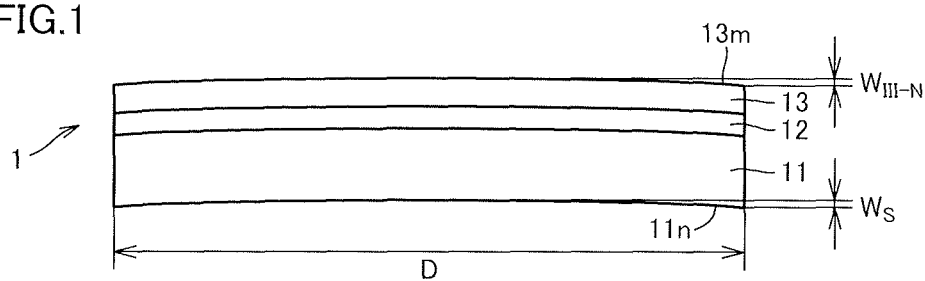
FIG. 1 is a schematic cross-sectional view showing an example of the group III nitride composite substrate according to the present invention and Reference invention 1.

Referring to FIG. 1, a group III nitride composite substrate 1 in an embodiment of the present invention is group III nitride composite substrate 1 with a diameter of 75 mm or more including a support substrate 11 and a group III nitride film 13 with a thickness of 50 nm or more and less than 10 μm that are bonded to each other, a ratio $s_t/m_t$ of a standard deviation $s_t$ of the thickness of group III nitride film 13, to a mean value $m_t$ of the thickness thereof is 0.01 or more and 0.5 or less, and a ratio $s_o/m_o$ of a standard deviation $s_o$ of an absolute value of an off angle between a main surface of group III nitride film 13 and a plane of a predetermined plane orientation, to a mean value $m_o$ of the absolute value of the off angle is 0.005 or more and 0.6 or less.

Group III nitride composite substrate 1 of the present embodiment has a diameter of 75 mm or more, group III nitride film 13 bonded onto support substrate 11 of the composite substrate has a thickness of 50 nm or more and less than 10 μm, a ratio $s_t/m_t$ of a standard deviation $s_t$ of the thickness of group III nitride film 13, to a mean value $m_t$ of the thickness thereof is 0.01 or more and 0.5 or less, and a ratio $s_o/m_o$ of a standard deviation $s_o$ of an absolute value of an off angle between a main surface of group III nitride film 13 and a plane of a predetermined plane orientation, to a mean value $m_o$ of the absolute value of the off angle is 0.005 or more and 0.6 or less. Accordingly, on group III nitride film 13, at least one group III nitride layer having a large diameter and a high crystal quality can be grown, and therefore, group III nitride semiconductor devices having excellent characteristics can be obtained with a high yield.

Regarding the group III nitride composite substrate, the TTV (Total Thickness Variation which is one of the measures used for evaluating the flatness of a wafer and is the difference between the maximum value and the minimum value, within the whole surface of the substrate, of the height measured in the thickness direction from the rear surface of the substrate used as a reference plane) and the warp representing the shape of the whole substrate have been understood as important physical properties. As to the present application, it has further been found that the variation of the thickness of the group III nitride film in the group III nitride composite substrate (specifically a ratio $s_t/m_t$ of a standard deviation $s_t$ of the thickness of the group III nitride film to a mean value $m_t$ of the thickness thereof) and the variation of the off angle between a main surface of the group III nitride film and a plane of a predetermined plane orientation (specifically a ratio $s_o/m_o$ of a standard deviation $s_o$ of an absolute value of an off angle between a main surface of the group III nitride film and a plane of a predetermined plane orientation to a mean value $m_o$, of the absolute value of the off angle) can further be set within the above-indicated ranges respectively to thereby grow, on group III nitride film 13, at least one group III nitride layer having a large diameter and a high crystal quality and thus obtain, with a high yield, group III nitride semiconductor devices having excellent characteristics.

Referring to FIG. 1, while the form in which support substrate 11 and group III nitride film 13 are bonded to each other in the group III nitride composite substrate 1 is not particularly limited, it is preferable to interpose a joint film 12 therebetween in order to increase the joint strength of the bonding.

<Diameter of Group III Nitride Composite Substrate>

In order to produce a greater number of semiconductor device chips from one composite substrate, the diameter of group III nitride composite substrate 1 is 75 mm or more, and is preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

<Thickness of Group III Nitride Film>

Figure 2:
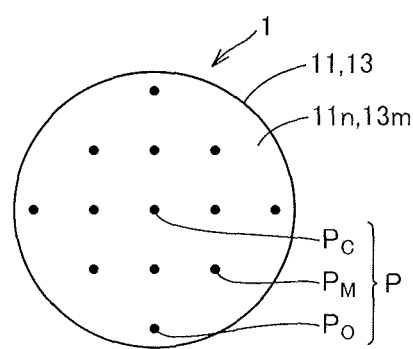
FIG. 2 is a schematic plan view showing measurement points at which measurements of physical properties are taken in the group III nitride composite substrate.

Referring to FIGS. 1 and 2, group III nitride film 13 of group III nitride composite substrate 1 in the present embodiment has a thickness of 50 nm or more and less than 10 μm. Here, the thickness of group III nitride film 13 refers to an average of thicknesses measured at 13 measurement points on a main surface 13m of group III nitride film 13 shown in FIG. 2. These 13 measurement points P on main surface 13m of group III nitride film 13 shown in FIG. 2 are made up of, regardless of the magnitude of the diameter of the group III nitride film: one central point $P_C$; four outer points $P_O$ located respectively in the four directions with respect to central point $P_C$ that are orthogonal to each other, the outer points each being located at 5 mm inward from the outer edge; and eight middle points $P_M$ including four middle points each between the one central point $P_C$ and one of the four outer points $P_O$ and four middle points each between two of the four outer points $P_O$. The thickness of group III nitride film 13 can be measured by reflectance spectroscopy.

In order to grow a group III nitride layer having a high crystal quality, the thickness of group III nitride film 13 is required to be 50 nm or more, preferably 80 nm or more, more preferably 100 nm or more, still more preferably 120 nm or more, and particularly preferably 150 nm or more. In order to significantly reduce the material cost of group III nitride composite substrate 1, the thickness of group III nitride film 13 is required to be less than 10 µm, preferably 5 µm or less, more preferably 1 µm or less, still more preferably 500 nm or less, and particularly preferably 250 nm or less.

<Ratio of Standard Deviation of Thickness of Group III Nitride Film to Mean Value of Thickness Thereof>

Referring to FIGS. 1 and 2, as to group III nitride composite substrate 1 of the present embodiment, a ratio $s_t/m_t$ of a standard deviation $s_t$ of the thickness of group III nitride film 13, to a mean value $m_t$ of the thickness thereof is 0.01 or more and 0.5 or less. In order to grow a group III nitride layer having a high crystal quality on main surface 13m of group III nitride film 13, the ratio $s_t/m_t$ is required to be 0.5 or less, preferably 0.4 or less, more preferably 0.3 or less, and still more preferably 0.2 or less. In order to reduce the cost of surface treatment of main surface 13m of group III nitride film 13, the ratio $s_t/m_t$ is also required to be 0.01 or more, preferably 0.02 or more, more preferably 0.03 or more, and still more preferably 0.05 or more.

Here, mean value $m_t$ and standard deviation $s_t$ of the thickness of group III nitride film 13 are respectively a mean value and a standard deviation each calculated from the thicknesses measured at 13 measurement points on main surface 13m of group III nitride film 13 shown in FIG. 2. As described above, 13 measurement points P on main surface 13m of group III nitride film 13 shown in FIG. 2 are made up of one central point $P_C$, four outer points $P_O$, and eight middle points $P_M$. The standard deviation herein refers to the positive square root of unbiased variance.

For group III nitride composite substrate 1 including the group III nitride film with a thickness of 50 nm or more and less than 10 µm, in order to have a ratio $s_t/m_t$ of 0.01 or more and 0.5 or less, it is suitable to perform at least one of polishing and etching under special procedures and conditions on main surface 13m of group III nitride film 13, as described later herein.

<Ratio of Standard Deviation of Absolute Value of Off Angle Between Main Surface of Group III Nitride Film and Plane of Predetermined Plane Orientation to Mean Value of Absolute Value of Off Angle>

Referring to FIG. 1, as to group III nitride composite substrate 1 of the present embodiment, a ratio $s_o/m_o$ of a standard deviation $s_o$ of an absolute value of an off angle (an angle of deviation) between main surface 13m of group III nitride film 13 and a plane of a predetermined plane orientation, to a mean value $m_o$ of the absolute value of the off angle is 0.005 or more and 0.6 or less. In order to grow a group III nitride layer having a high crystal quality on main surface 13m of group III nitride film 13, the ratio $s_o/m$ is required to be 0.6 or less, preferably 0.5 or less, more preferably 0.4 or less, and still more preferably 0.2 or less. In order to reduce the cost of surface treatment of main surface 13m of group III nitride film 13, the ratio $s_o/m_o$ is required to be 0.005 or more, preferably 0.008 or more, and more preferably 0.02 or more.

Here, mean value $m_o$ and standard deviation $s_o$ of the off angle of main surface 13m of group III nitride film 13 are respectively a mean value and a standard deviation each calculated from off angles measured at 13 measurement points on main surface 13m of group III nitride film 13 shown in FIG. 2. As described above, 13 measurement points P on main surface 13m of group III nitride film 13 shown in FIG. 2 are made up of one central point $P_C$, four outer points $P_O$, and eight middle points $P_M$. The standard deviation herein refers to the positive square root of unbiased variance, as described above.

For group III nitride composite substrate 1 including the group III nitride film with a thickness of 50 nm or more and less than 10 µm, in order to have a ratio $s_o/m_o$ of 0.005 or more and 0.6 or less, it is suitable perform at least one of polishing and etching under special procedures and conditions on main surface 13m of group III nitride film 13, as described later herein.

<Mean Value of Root Mean Square Roughness of Group III-Nitride-Film-Side Main Surface and Ratio of Standard Deviation to Mean Value>

Referring to FIGS. 1 and 2, as to group III nitride composite substrate 1 of the present embodiment, a mean value $m_{III-N}$ of a root mean square roughness of group III-nitride-film 13-side main surface 13m is preferably 0.4 nm or more and 10 nm or less, and a ratio $s_{III-N}/m_{III-N}$ of a standard deviation $s_{III-N}$ of the root mean square roughness of group III-nitride-film 13-side main surface 13m, to mean value $m_{III-N}$ thereof is preferably 0.008 or more and 0.5 or less.

As to group III-nitride-film 13-side main surface 13m, which is the front side of group III nitride composite substrate 1, in order to grow a uniform group III nitride layer having a high crystal quality on this main surface, mean value $m_{III-N}$ of the root mean square roughness is preferably 10 nm or less, more preferably 5 nm or less, and still more preferably 3 nm or less, and the ratio $s_{III-N}/m_{III-N}$ of standard deviation $s_{III-N}$ of the root mean square roughness to mean value $m_{III-N}$ of the root mean square roughness is preferably 0.5 or less, more preferably 0.4 or less, and still more preferably 0.2 or less.

Further, as to group III-nitride-film 13-side main surface 13m, which is the front side of group III nitride composite substrate 1, in order to reduce the cost of surface treatment of this main surface 13m, mean value $m_{III-N}$ of the root mean square roughness is preferably 0.4 nm or more, more preferably 1 nm or more, and still more preferably 1.5 nm or more, and the ratio $s_{III-N}/m_{III-N}$ of standard deviation $s_{III-N}$ of the root mean square roughness to mean value $m_{III-N}$ of the root mean square roughness is preferably 0.008 or more, more preferably 0.02 or more, and still more preferably 0.05 or more.

Here, referring to FIG. 2, mean value $m_{III-N}$ and standard deviation $s_{III-N}$ of the root mean square roughness of group III-nitride-film 13-side main surface 13m of group III nitride composite substrate 1 are respectively a mean value and a standard deviation each calculated from the root mean square roughnesses measured at 13 measurement points P on main surface 13m of group III nitride film 13. As described above, 13 measurement points P on main surface 13m of group III nitride film 13 shown in FIG. 2 are made up of one central point $P_C$, four outer points $P_O$, and eight middle points $P_M$. The standard deviation herein refers to the positive square root of unbiased variance, as described above.

Further, the root mean square roughnesses measured at 13 measurement points P on main surface $13m$ of group III nitride film 13 shown in FIG. 2 refer to the positive square root of the mean of respective squares of the distances to the points from a reference plane which is calculated from each point in a measurement region having a size of 85 μm×85 μm in which measurement point P is located at the center, and is measured by means of an AFM (Atomic Force Microscope), an optical interferometric roughness meter, a laser microscope, a stylus-based roughness meter, or the like.

It should be noted that mean value $m_{III-N}$ and standard deviation $s_{III-N}$ of the root mean square roughness of group III-nitride-film 13-side main surface $13m$ of group III nitride composite substrate 1 can be adjusted by means of polishing conditions and/or etching conditions when at least one of polishing and etching is performed on main surface $13m$ of group III nitride film 13, as described later herein.

<Ratio of Warp of Group III Nitride Film Side to Diameter>

Referring to FIG. 1, regarding group III nitride composite substrate 1 of the present embodiment, a ratio $W_{III-N}/D$ of a warp $W_{III-N}$ of group III-nitride-film 13-side main surface $13m$ to a diameter D is preferably $-7 \times 10^{-4}$ or more and $8 \times 10^{-4}$ or less, more preferably $-4 \times 10^{-4}$ or more and $5 \times 10^{-4}$ or less, still more preferably $-2.5 \times 10^{-4}$ or more and $3 \times 10^{-4}$ or less, and particularly preferably $-1 \times 10^{-4}$ or more and $1.5 \times 10^{-4}$ or less. As to the signs for warp $W_{III-N}$ and the ratio $W_{III-N}/D$, a convex warp of group III-nitride-film 13-side main surface $13m$ is herein indicated with the + (positive) sign, and a concave warp of the group III-nitride-film 13-side main surface is herein indicated with the − (negative) sign. If the ratio $W_{III-N}/D$ of warp $W_{III-N}$ of group III-nitride-film 13-side main surface $13m$ to diameter D of group III nitride composite substrate 1 is a small value of preferably $-7 \times 10^{-4}$ or more and $8 \times 10^{-4}$ or less, more preferably $-4 \times 10^{-4}$ or more and $5 \times 10^{-4}$ or less, still more preferably $-2.5 \times 10^{-4}$ or more and $3 \times 10^{-4}$ or less, and particularly preferably $-1 \times 10$ or more and $1.5 \times 10^{-4}$ or less, a group III nitride layer having a high crystal quality can be grown on main surface $13m$ of group III nitride film 13, and therefore, group III nitride semiconductor devices having excellent characteristics can be obtained with a high yield.

<Ratio of Thermal Expansion Coefficient of Group III Nitride Film to Thermal Expansion Coefficient of Support Substrate>

Referring to FIG. 1, regarding group III nitride composite substrate 1 of the present embodiment, in order to suppress warp and cracks of group III nitride composite substrate 1 and of a group III nitride layer grown on main surface $13m$ of group III nitride film 13 and thereby increase the yield of group III nitride semiconductor devices, a ratio $\alpha_{III-N}/\alpha_S$ of a thermal expansion coefficient $\alpha_{III-N}$ of group III nitride film 13 to a thermal expansion coefficient $\alpha_S$ of support substrate 11 is preferably 0.75 or more and 1.25 or less, more preferably 0.85 or more and 1.15 or less, and still more preferably 0.95 or more and 1.05 or less. Here, thermal expansion coefficient $\alpha_S$ of support substrate 11 and thermal expansion coefficient $\alpha_{III-N}$ of group III nitride film 13 can be measured with a thermomechanical analysis apparatus.

<Ratio of Thickness of Group III Nitride Film to Thickness of Support Substrate>

Referring to FIG. 1, regarding group III nitride composite substrate 1 of the present embodiment, in order to suppress warp and cracks of group III nitride composite substrate 1 and of a group III nitride layer grown on main surface $13m$ of group III nitride film 13 and thereby increase the yield of group III nitride semiconductor devices, a ratio $t_{III-N}/t_S$ of a thickness $t_{III-N}$ of group III nitride film 13 to a thickness $t_S$ of support substrate 11 is preferably $1 \times 10^{-1}$ or more and $2 \times 10^{-2}$ or less, more preferably $2 \times 10^{-4}$ or more and $2 \times 10^{-3}$ or less, and still more preferably $5 \times 10^{-4}$ or more and $1 \times 10^{-3}$ or less. Here, thickness $t_S$ of support substrate 11 and thickness $t_{III-N}$ of group III nitride film 13 can be measured through observation of a cross section of the film with an optical microscope and/or an SEM, reflectance spectrometry, a digital indicator, or the like.

Thus, in order to suppress warp and cracks of group III nitride composite substrate 1 and of a group III nitride layer grown on group III nitride film 13 of the composite substrate and thereby increase the yield of group III nitride semiconductor devices, preferably the ratio $\alpha_{III-N}/\alpha_S$ of thermal expansion coefficient $\alpha_{III-N}$ of group III nitride film 13 to thermal expansion coefficient $\alpha_S$ of support substrate 11 is 0.75 or more and 1.25 or less and the ratio $t_{III-N}/t_S$ of thickness $t_{III-N}$ of the group III nitride film to thickness $t_S$ of support substrate 11 is $1 \times 10^{-4}$ or more and $2 \times 10^{-2}$ or less, more preferably the ratio $\alpha_{III-N}/\alpha_S$ is 0.85 or more and 1.15 or less and the ratio $t_{III-N}/t_S$ is $2 \times 10^{-4}$ or more and $2 \times 10^{-3}$ or less, and still more preferably the ratio $\alpha_{III-N}/\alpha_S$ is 0.95 or more and 1.05 or less and the ratio $t_{III-N}/t_S$ is $5 \times 10^{-4}$ or more and $1 \times 10^{-3}$ or less.

<Impurity Metal Atoms of Main Surface of Group III Nitride Film>

Referring to FIGS. 1 and 2, in order to enhance the crystal quality of a group III nitride layer grown on main surface $13m$ of group III nitride film 13 and enhance the characteristics of semiconductor devices to be formed, impurity metal atoms of main surface $13m$ of group III nitride film 13 are preferably $1 \times 10^{13}$ atoms/cm² or less, more preferably $3 \times 10^{12}$ atoms/cm² or less, still more preferably $1 \times 10^{12}$ atoms/cm² or less, and particularly preferably $1 \times 10^{11}$ atoms/cm² or less. Here, the concentration of impurity metal atoms of main surface $13m$ of group III nitride film 13 can be measured by the TXRF (Total Reflection X-ray Fluorescence) method.

Here, the method of cleaning for the sake of reducing the concentration of impurity metal atoms of main surface $13m$ of group III nitride film 13 in group III nitride composite substrate 1 is not particularly limited. In the case where the group III nitride composite substrate includes, as support substrate 11, a substrate of mullite $(3Al_2O_3 \cdot 2SiO_2$-$2Al_2O_3 \cdot SiO_2)$, mullite-YSZ (Yttria Stabilized Zirconia), spinel $(MgAl_2O_4)$, a sintered body of an $Al_2O_3$—$SiO_2$-based composite oxide, or the like, cleaning that suppresses elution of metal atoms from support substrate 11, such as scrub cleaning with a surfactant and pure water, two-fluid cleaning, or megasonic cleaning (cleaning with ultrasonic waves in a megasonic frequency range of 500 kHz to 5 MHz), as well as cleaning of a single side (the single side is main surface $13m$ of group III nitride film 13) such as sheet-fed cleaning with low-concentration acid and/or alkali, for example, are preferred.

Impurities other than the impurity metal atoms of main surface $13m$ of group 11 nitride film 13 may be Cl atoms of preferably $2 \times 10^{14}$ atoms/cm² or less, and Si atoms of preferably $9 \times 10^{13}$ atoms/cm² or less, in order to enhance the crystal quality of a group III nitride layer to be grown on group III nitride film 13 and enhance the characteristics of semiconductor devices to be formed. Here, the concentration of impurities other than the impurity metal atoms of main surface 13m of group III nitride film 13 can be measured by the TXRF method.

<Thermal Conductivity of Support Substrate>

Referring to FIG. 1, regarding group III nitride composite substrate 1 of the present embodiment, thermal conductivity $\lambda_S$ of support substrate 11 is preferably 3 W·m$^{-1}$·K$^{-1}$ or more and 280 W·m$^{-1}$·K$^1$ or less, more preferably 5 W·m$^{-1}$·K$^{-1}$ or more and 210 W·m$^{-1}$·K$^{-1}$ or less, and still more preferably 10 W·m$^{-1}$·K$^{-1}$ or more and 120 W·m$^{-1}$·K$^{-1}$ or less. Here, thermal conductivity $\lambda_S$ of support substrate 11 can be measured by a laser flash method. Group III nitride composite substrate 1 having support substrate 11 with a thermal conductivity $\lambda_S$ of preferably 3 W·m$^{-1}$·K$^{-1}$ or more, more preferably 5 W·m$^{-1}$·K$^{-1}$ or more, and still more preferably 10 W·m$^{-1}$·K$^{-1}$ or more, can efficiently transmit heat from the main surface of a susceptor which supports group III nitride composite substrate 1 to main surface 13m of group III nitride film 13 of group III nitride composite substrate 1, when a group III nitride layer is grown. Group III nitride composite substrate 1 having support substrate 11 with a thermal conductivity $\lambda_S$ of preferably 280 W·m$^{-1}$·K$^{-1}$ or less, more preferably 210 W·m$^{-1}$·K$^{-1}$ or less, still more preferably 120 W·m$^{-1}$·K$^{-1}$ or less, and particularly preferably 50 W·m$^{-1}$·K$^{-1}$ or less, can uniformly transmit heat from the main surface of the susceptor to the whole main surface of group III nitride film 13 of group III nitride composite substrate 1, when a group III nitride layer is grown. Support substrate 11 having a thermal conductivity $\lambda_S$ of 280 W·m$^{-1}$·K$^{-1}$ or less can more uniformly transmit the heat from the main surface of the susceptor to the whole main surface of group III nitride film 13 of group III nitride composite substrate 1 when a group III nitride layer is grown, as compared with the case where an SiC substrate having a thermal conductivity $\lambda_S$ of about 300 W·m$^{-1}$·K$^{-1}$ is used as the support substrate.

<Young's Modulus of Support Substrate>

Regarding group III nitride composite substrate 1 of the present embodiment, support substrate 11 has a Young's modulus $E_S$ of preferably 150 GPa or more and 500 GPa or less, and more preferably 200 GPa or more and 350 GPa or less. Here, Young's modulus $E_S$ of support substrate 11 can be measured by a resonance method. Group III nitride composite substrate 1 having support substrate 11 with a Young's modulus $E_S$ of preferably 150 GPa or more and more preferably 200 GPa or more can suppress occurrence of warp to group III nitride composite substrate 1 and/or a group III nitride layer, when a group III nitride semiconductor device is formed by growing the group III nitride layer on the composite substrate. Group III nitride composite substrate 1 having support substrate 11 with a Young's modulus $E_S$ of preferably 500 GPa or less and more preferably 350 GPa or less can suppress occurrence of warp and/or cracks to group III nitride composite substrate 1 and/or a group III nitride layer, when a group III nitride semiconductor device is formed by growing the group III nitride layer on the composite substrate.

<Support Substrate>

Support substrate 11 included in group III nitride composite substrate 1 of the present embodiment is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride.

Regarding group III nitride composite substrate 1 of the present embodiment, preferably the ratio $\alpha_{III-N}/\alpha_S$ of thermal expansion coefficient $\alpha_{III-N}$ of group III nitride film 13 to thermal expansion coefficient $\alpha_S$ of support substrate 11 is 0.75 or more and 1.25 or less, as described above. Further, support substrate 11 preferably has a thermal conductivity $\lambda_S$ of 3 W·m$^{-1}$·K$^{-1}$ or more and 280 W·m$^{-1}$·K$^{-1}$ or less, and support substrate 11 preferably has a Young's modulus $E_S$ of 150 GPa or more and 500 GPa or less.

While support substrate 11 is not particularly limited, support substrate 11 satisfying at least any of the above-described properties is preferred. For example, support substrate 11 is preferably a substrate formed of mullite ($3Al_2O_3 \cdot 2SiO_2$-$2Al_2O_3 \cdot SiO_2$), a substrate formed of mullite-YSZ (Yttria Stabilized Zirconia), a substrate formed of spinel ($MgAl_2O_4$), a substrate formed of a sintered body of an $Al_2O_3$—$SiO_2$-based composite oxide, and substrates formed respectively of sintered bodies of them to which oxide, carbonate or the like is added, a molybdenum (Mo) substrate, a tungsten (W) substrate, or the like. Here, preferred elements to be contained in the oxide and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

Support substrate 11 may include any of single crystal, polycrystal, and amorphous material. It preferably includes polycrystal, since removal of support substrate 11 by grinding and/or etching when a semiconductor device is to be formed is easy and the strength by which warp and/or cracks can be suppressed can be maintained.

<Joint Film>

Referring to FIG. 1, joint film 12 which may be included in group III nitride composite substrate 1 of the present embodiment is not particularly limited as long as the joint film can join support substrate 11 and group III nitride film 13 to each other. Joint film 12, however, is preferably $SiO_2$ film, $Si_3N_4$ film, $TiO_2$ film, $Ga_2O_3$ film, or the like because these films have a high joining ability for joining support substrate 11 and group III nitride film 13 to each other.

<Group III Nitride Film>

Referring to FIG. 1, group III nitride film 13 of the present embodiment is a film formed of a group III nitride, specifically an $In_xAl_yGa_{1-x-y}N$ film ($0 \leq x$, $0 \leq y$, $x+y \leq 1$) such as GaN film, AlN film, or the like.

The thickness of group III nitride film 13 is required to be 50 nm or more, preferably 80 nm or more, more preferably 100 nm or more, still more preferably 120 nm or more, and particularly preferably 150 nm or more, as described above. Meanwhile, in order to significantly reduce the amount of use of the expensive group III nitride, the thickness of group III nitride film 13 is required to be less than 10 μm, preferably 5 μm or less, more preferably 1 μm or less, still more preferably 500 nm or less, and particularly preferably 250 nm or less, as described above.

The crystal structure of group III nitride film 13 is preferably the wurtzite structure, since it enables semiconductor devices having excellent characteristics to be produced. The predetermined plane orientation to which main surface 13m of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are 15° or less off (displaced by an angle of 15 or less) from these plane orientations, respectively. It may also be any of the plane orientations opposite to the above-listed plane orientations, as well as plane orientations that are 15° or less off from these plane orientations, respectively. Namely, main surface 13m of group III nitride film 13 may be any of polar plane, nonpolar plane, and semipolar plane. Main surface 13m of group III nitride film 13 is preferably the {0001} plane and the opposite plane thereof, since such planes make it easy to increase the diameter, or any of {10-10} plane, {20-21} plane, and the opposite planes thereof, since such planes suppress blue shift of a light-emitting device to be produced.

Further, group III nitride film 13 preferably has a carrier concentration of $1 \times 10^{17}$ cm$^{-3}$ or more in order to reduce the resistance of the semiconductor device, and preferably has a dislocation density of $1 \times 10^{11}$ cm$^{-2}$ or less in order to reduce leakage current of the semiconductor device, and a half width of the diffraction peak of an x-ray diffraction rocking curve is preferably 20 arcsec or more and 150 arcsec or less in order to enhance the crystal quality of the group III nitride film.

Second Embodiment: Laminated Group III Nitride Composite Substrate

Figure 3:
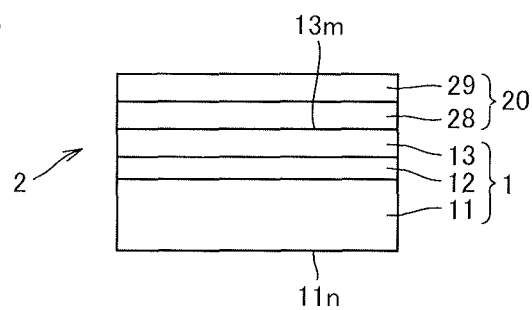
FIG. 3 is a schematic cross-sectional view showing an example of the laminated group III nitride composite substrate according to the present invention and Reference Invention I.

Referring to FIG. 3, a laminated group III nitride composite substrate 2 which is another embodiment of the present invention includes group III nitride composite substrate 1 of the first embodiment, and at least one group III nitride layer 20 disposed on group III-nitride-film 13-side main surface 13m of group III nitride composite substrate 1.

Laminated Group III nitride composite substrate 2 of the present embodiment includes: group III nitride composite substrate 1 in which the variation of the thickness of the group III nitride film is small (specifically the ratio $s_t/m_t$ of standard deviation $s_t$ of the thickness of the group III nitride film, to mean value $m_t$ of the thickness thereof is 0.01 or more and 0.5 or less) and the variation of the off angle between the main surface of the group III nitride film and a plane of a predetermined plane orientation is small (specifically the ratio $s_o/m_o$ of standard deviation $s_o$ of an absolute value of an off angle between the main surface of the group III nitride film and a plane of a predetermined plane orientation, to mean value $m_o$ of the absolute value of the off angle is 0.005 or more and 0.6 or less); and group III nitride layer 20 having a high crystal quality disposed by being grown on group III nitride composite substrate 1, and therefore, semiconductor devices having excellent characteristics can be fabricated with a high yield.

Figure 4:
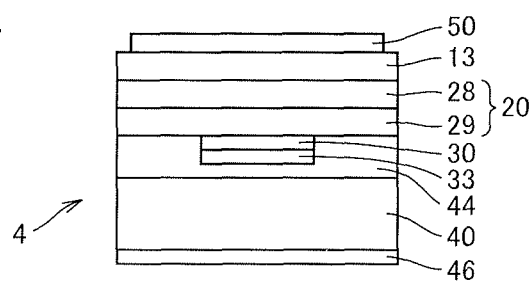
FIG. 4 is a schematic cross-sectional view showing an example of the group III nitride semiconductor device according to the present invention and Reference Invention I.
Figure 5:
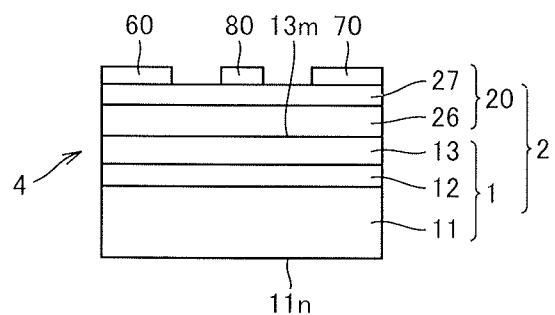
FIG. 5 is a schematic cross-sectional view showing another example of the group III nitride semiconductor device according to the present invention and Reference Invention I.
Figure 6:
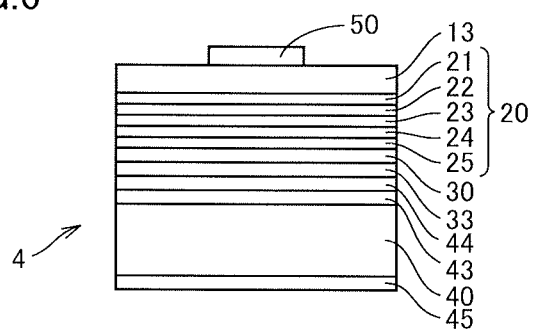
FIG. 6 is a schematic cross-sectional view showing still another example of the group III nitride semiconductor device according to the present invention and Reference Invention I.

In laminated group III nitride composite substrate 2 of the present embodiment, group III nitride layer 20 disposed on group III-nitride-film 13-side main surface 13m varies depending on the type of the group III nitride semiconductor device to be produced. Referring to FIG. 4, in the case where the semiconductor device to be produced is an SBD (Schottky Barrier Diode) which is an example of electronic devices, group III nitride layer 20 may include, for example, an n$^+$-GaN layer 28 (having a carrier concentration for example of $2 \times 10^{18}$ cm$^{-3}$) and an n$^-$-GaN layer 29 (having a carrier concentration for example of $5 \times 10^{15}$ cm$^{-3}$). Referring to FIG. 5, in the case where the semiconductor device to be produced is an HEMT (High Electron Mobility Transistor) which is another example of electronic devices, group III nitride layer 20 may include, for example, a GaN layer 26 and an Al$_{0.2}$Ga$_{0.8}$N layer 27. Referring to FIG. 6, in the case where the semiconductor device to be produced is a light-emitting device, group III nitride layer 20 may include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25.

Third Embodiment: Group III Nitride Semiconductor Device

Referring to FIGS. 4 to 6, a group III nitride semiconductor device 4 which is still another embodiment of the present invention includes group III nitride film 13 in the group III nitride composite substrate of the first embodiment, and at least one group III nitride layer 20 disposed on group III nitride film 13.

Group III nitride semiconductor device 4 of the present embodiment includes: group III nitride composite substrate 1 in which the variation of the thickness of the group III nitride film is small (specifically the ratio $s_t/m_t$ of standard deviation $s_t$ of the thickness of the group III nitride film, to mean value $m_t$ of the thickness thereof is 0.01 or more and 0.5 or less) and the variation of the off angle between the main surface of the group III nitride film and a plane of a predetermined plane orientation is small (specifically the ratio $s_o/m_o$ of standard deviation $s_o$ of an absolute value of an off angle between the main surface of the group III nitride film and a plane of a predetermined plane orientation, to mean value $m_o$ of the absolute value of the off angle is 0.005 or more and 0.6 or less); and group III nitride layer 20 having a high crystal quality disposed by being grown on group III nitride composite substrate 1, and therefore the semiconductor device has excellent characteristics.

Group III nitride layer 20 of group III nitride semiconductor device 4 varies depending on the type of group III nitride semiconductor device 4. Referring to FIG. 4, in the case where group III nitride semiconductor device 4 is an SBD which is an example of electronic devices, group III nitride layer 20 may include, for example, an n$^+$-GaN layer 28 (having a carrier concentration for example of $2 \times 10^{18}$ cm$^{-3}$) and an n$^-$-GaN layer 29 (having a carrier concentration for example of $5 \times 10^{15}$ cm$^{-3}$). Referring to FIG. 5, in the case where group III nitride semiconductor device 4 is an HEMT which is another example of electronic devices, group III nitride layer 20 may include, for example, a GaN layer 26 and an Al$_{0.2}$Ga$_{0.8}$N layer 27. Referring to FIG. 6, in the case where group III nitride semiconductor device 4 is a light-emitting device, group III nitride layer 20 may include, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25. Other examples of electronic devices may be PND (PN diode), transistor, and the like. It should be noted that group III nitride semiconductor device 4 may either be of the vertical type or of the lateral type.

Referring to FIGS. 4 to 6, preferably group III nitride semiconductor device 4 further includes at least one of a support substrate 11 and a device support substrate 40 for supporting group III nitride layer 20. Here, the shape of device support substrate 40 is not limited to the shape of a flat plate, but may be any shape as long as it supports group III nitride film 13 and group III nitride layer 20 so that group III nitride semiconductor device 4 can be formed.

It should be noted that the group III nitride semiconductor device may have a structure corresponding to group III nitride semiconductor device 4 shown in FIG. 4 or FIG. 6 from which group III nitride film 13 has been removed. The group III nitride semiconductor device having its structure with group III nitride film 13 removed therefrom can have further improved device characteristics.

Fourth Embodiment: Method for Manufacturing Group III Nitride Composite Substrate Referring to FIGS. 7 to 11, a method for manufacturing a group III nitride composite substrate which is a further embodiment of the present invention is a method for manufacturing a group III nitride composite substrate of the first embodiment, including the steps of: forming group III nitride composite substrate 1 by disposing group III nitride film 13 on a main surface 11m side of support substrate 11; and adjusting the thickness of group III nitride film 13 and the off angle between main surface 13m of group III nitride film 13 and a plane of a predetermined plane orientation by performing at least one of polishing and etching on group III-nitride-film 13-side main surface 13m of group III nitride composite substrate 1, after the step of forming group III nitride composite substrate 1.

The method for manufacturing group III nitride composite substrate 1 of the present embodiment enables efficient manufacture of low-cost and large-diameter group III nitride composite substrate 1 in which the group III nitride film is thin and the variation of the thickness of group III nitride film 13 and the variation of an off angle between main surface 13m of group III nitride film 13 and a plane of a predetermined plane orientation are small, with which group III nitride semiconductor devices can be manufactured with a high yield.

{Step of Forming Group III Nitride Composite Substrate}

The method for manufacturing group III nitride composite substrate 1 of the present embodiment includes the step of forming group III nitride composite substrate 1 by disposing group III nitride film 13 on main surface 11m side of support substrate 11. In this step, the method for disposing group III nitride film 13 on main surface 11m side of support substrate 11 is not particularly limited and may include first to third methods in the following.

Figure 7:
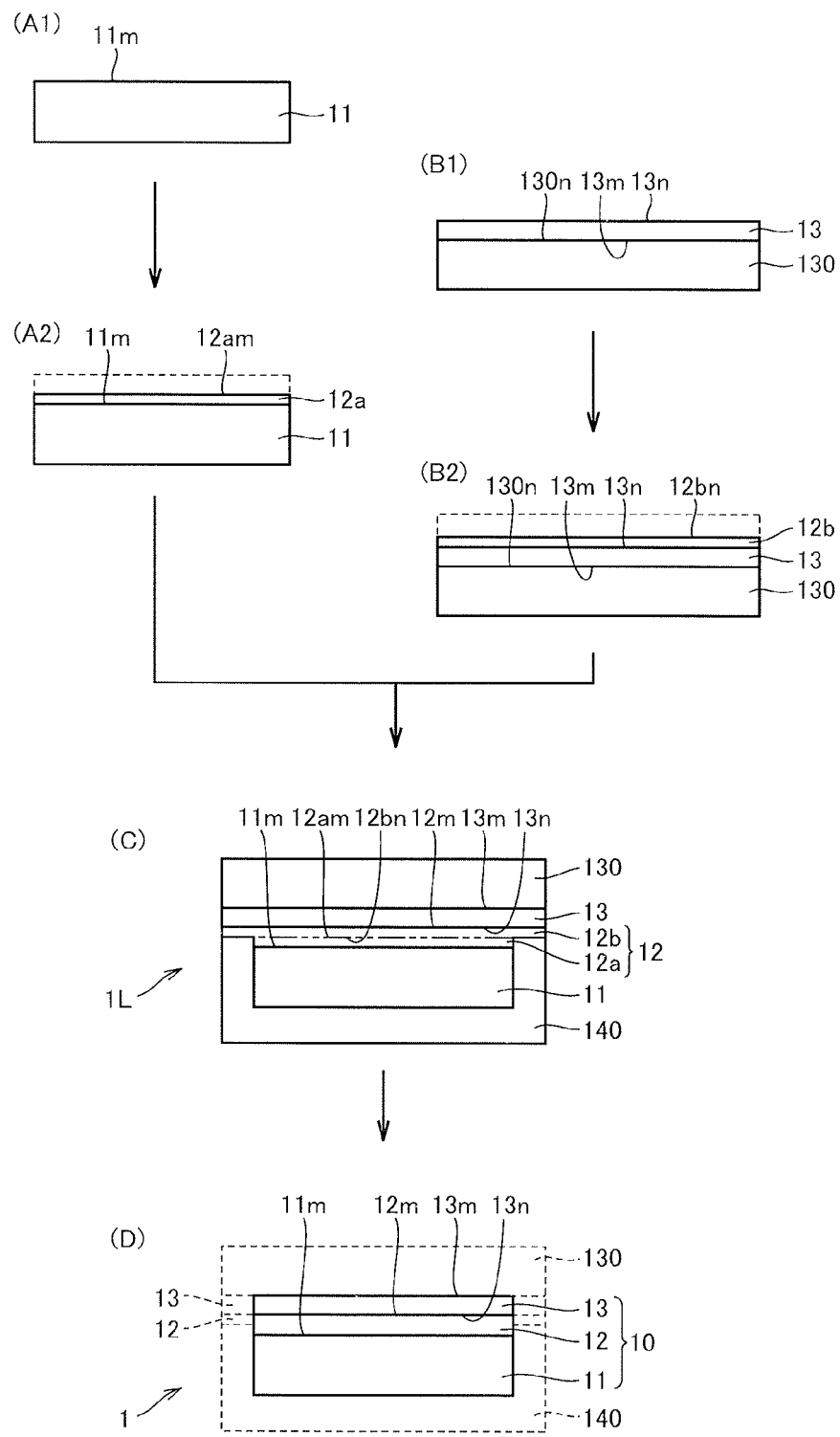
FIG. 7 is a schematic cross-sectional view showing an example of the method for manufacturing a group III nitride composite substrate according to the present invention and Reference Invention I.
Figure 8:
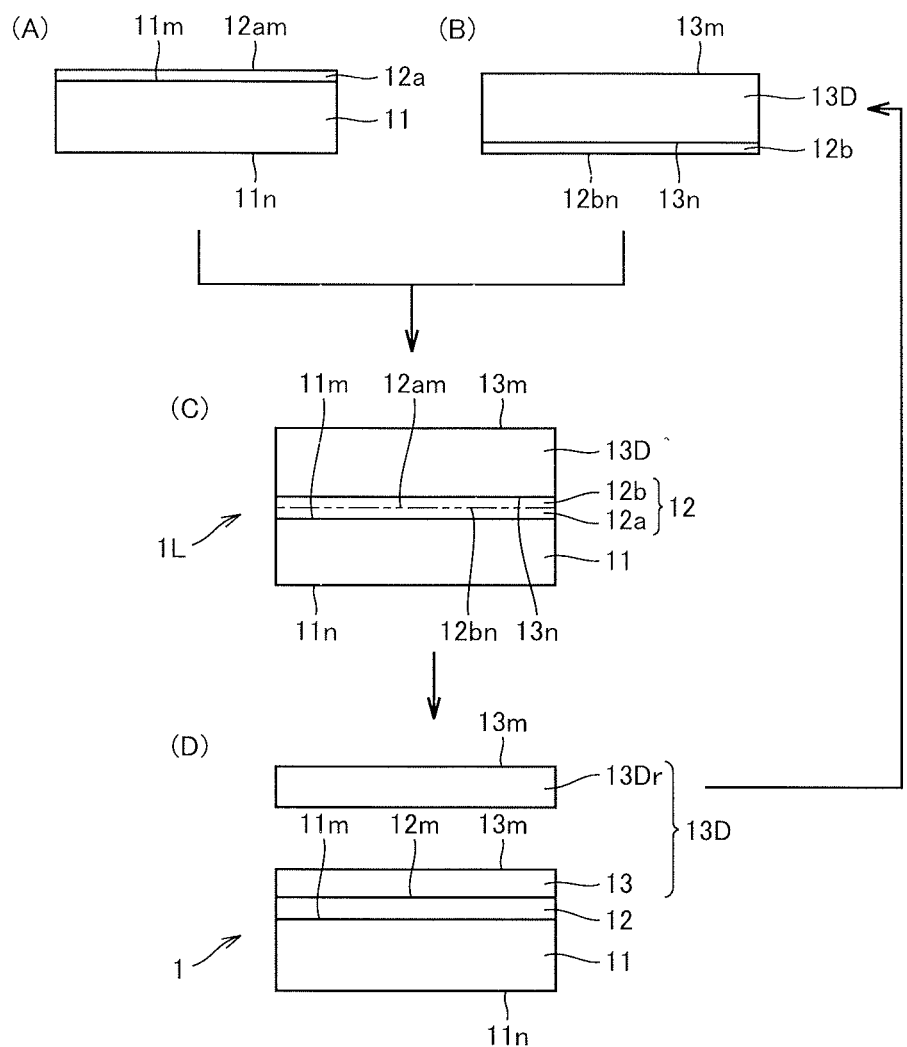
FIG. 8 is a schematic cross-sectional view showing another example of the method for manufacturing a group III nitride composite substrate according to the present invention and Reference Invention I.
Figure 9:
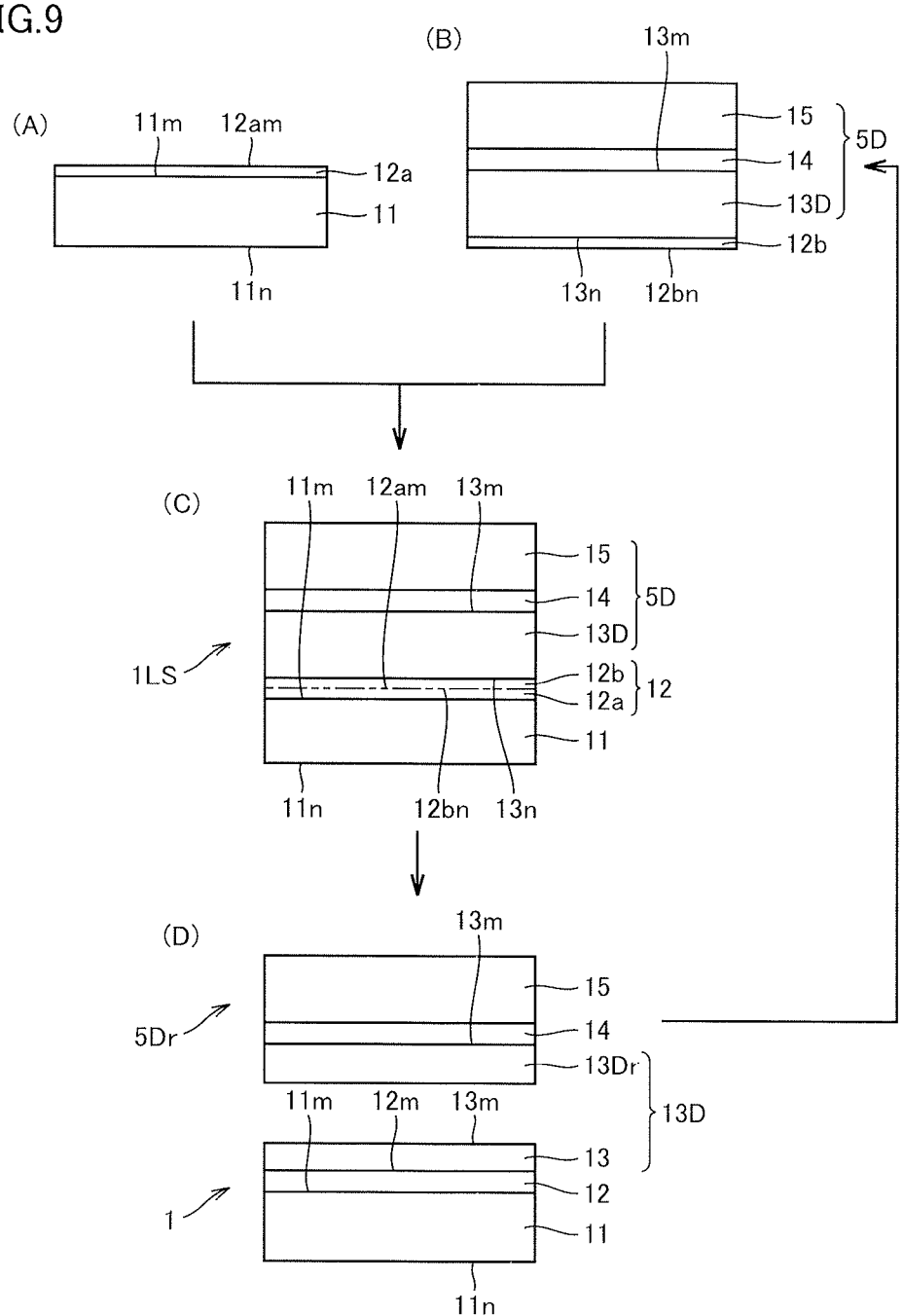
FIG. 9 is a schematic cross-sectional view showing still another example of the method for manufacturing a group III nitride composite substrate according to the present invention and Reference Invention I.
Figure 10:
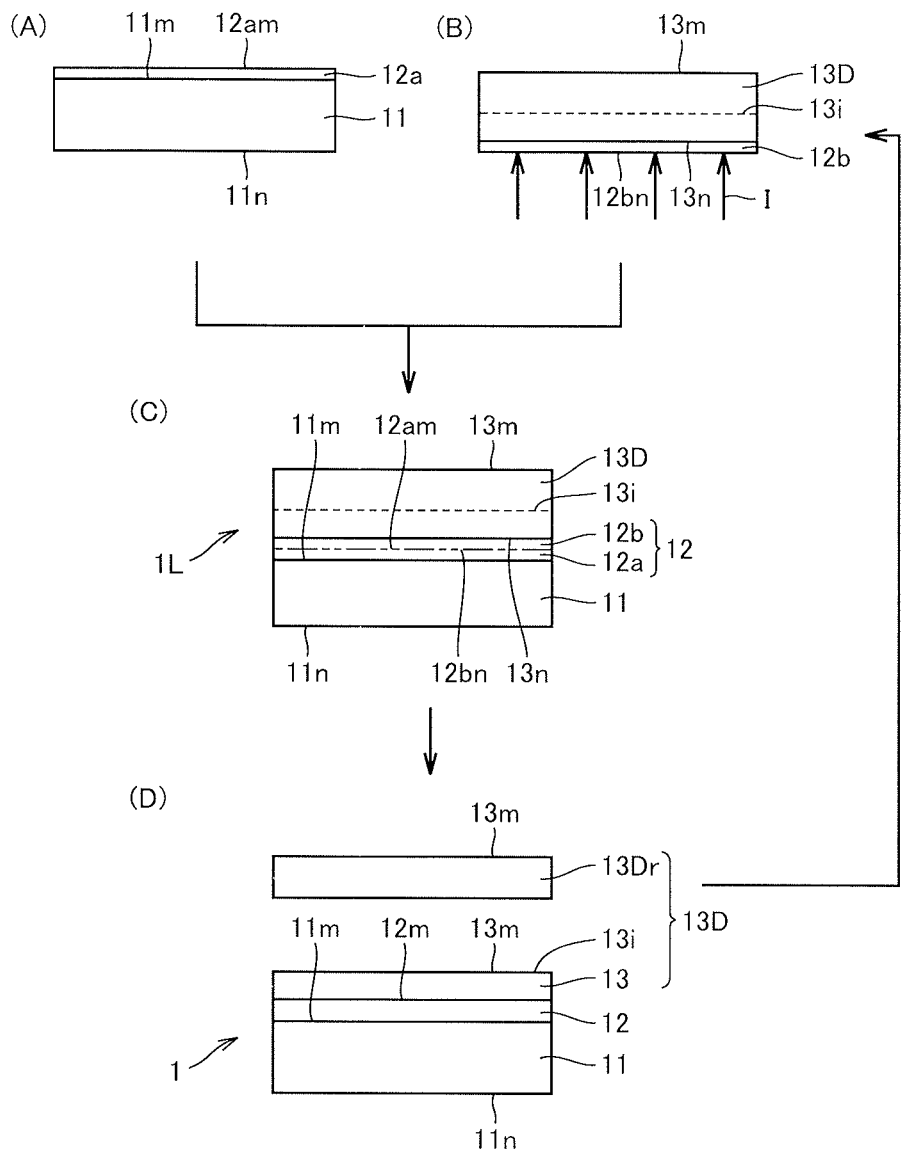
FIG. 10 is a schematic cross-sectional view showing a further example of the method for manufacturing a group III nitride composite substrate according to the present invention and Reference Invention I.
Figure 11:
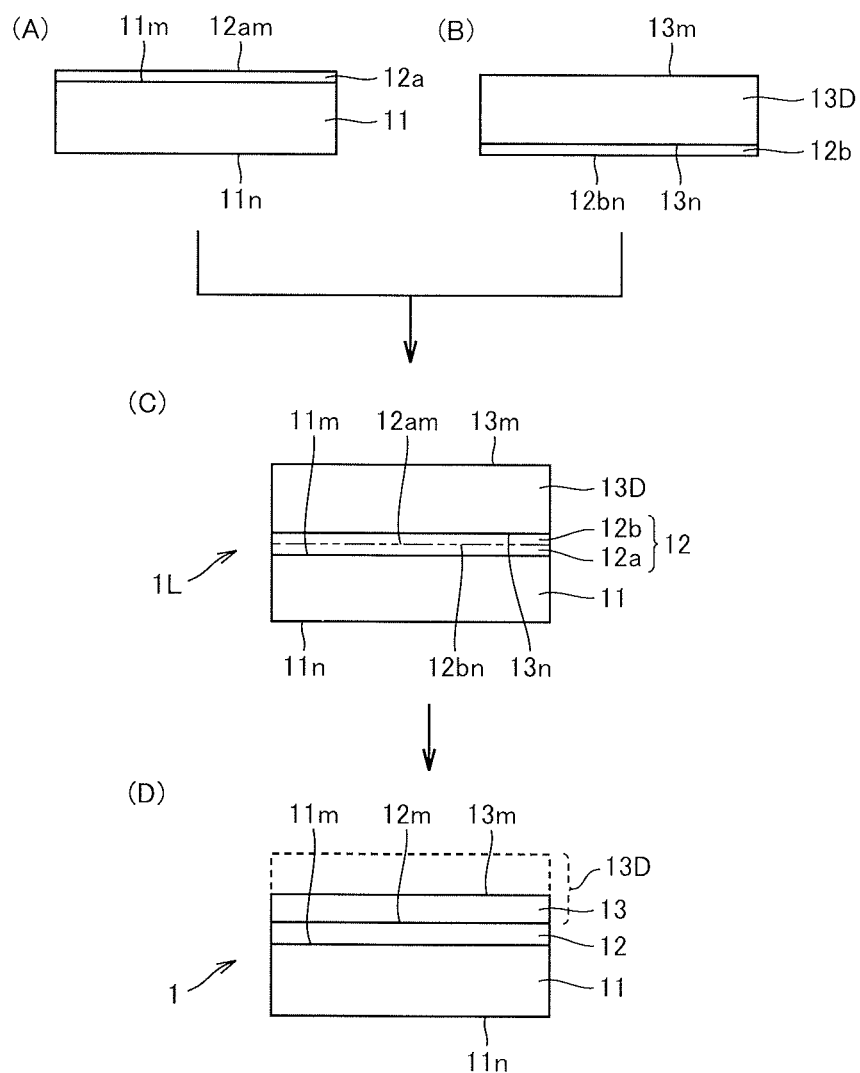
FIG. 11 is a schematic cross-sectional view showing a still further example of the method for manufacturing a group III nitride composite substrate according to the present invention and Reference Invention I.

The first method is a method as shown in FIG. 7 according to which a group III nitride film 13 deposited on a main surface 130n of a base substrate 130 is bonded to a main surface 11m of a support substrate 11, and thereafter base substrate 130 is removed. The second method is a method as shown in FIGS. 8 to 10 according to which a group III nitride film donor substrate 13D is bonded to a main surface 11m of a support substrate 11, and thereafter this group III nitride film donor substrate 13D is separated along a plane located at a predetermined depth from a bonded surface, to thereby form a group III nitride film 13 on main surface 11m of support substrate 11. The third method is a method as shown in FIG. 11 according to which a group III nitride film donor substrate 13D is bonded to a main surface 11m of a support substrate 11, and thereafter the thickness of this group III nitride film donor substrate 13D is adjusted by being reduced through at least one of grinding, polishing, and etching of a main surface 13m of group III nitride film donor substrate 13D which is opposite to a bonded surface thereof, to thereby form a group III nitride film 13 on main surface 11m of support substrate 11.

Regarding the first method, the method for bonding group III nitride film 13 to support substrate 11 may for example be a method (see FIG. 7) according to which a main surface 13n of group III nitride film 13 is bonded to main surface 11m of support substrate 11 with a joint film 12 interposed therebetween. Regarding the second and third methods, the method for bonding group III nitride film donor substrate 13D to support substrate 11 may for example be a method (see FIGS. 8 to 11) according to which a main surface 13n of group III nitride film donor substrate 13D is bonded to main surface 11m of support substrate 11 with a joint film 12 interposed therebetween, for example.

FIGS. 7 to 11 each illustrate the method according to which a joint film 12a is formed on support substrate 11 while a joint film 12b is also formed on group III nitride film 13 or group III nitride film donor substrate 13D, and these joint films are bonded to each other. Alternatively, joint film 12 may be formed on only support substrate 11 and bonded to group III nitride film 13 or group III nitride film donor substrate 13D, or joint film 12 may be formed on only group III nitride film 13 or group III nitride film donor substrate 13D and bonded to support substrate 11, for example.

<First Method>

Referring to FIG. 7, the step of forming group III nitride composite substrate 1 by the first method is not particularly limited. In order to efficiently manufacture the composite substrate, however, the step preferably includes: the sub step of preparing support substrate 11 (FIG. 7 (A1)); the sub step of forming joint film 12a on main surface 11m of support substrate 11 (FIG. 7 (A2)); the step of forming group III nitride film 13 on main surface 130n of base substrate 130 (FIG. 7 (B1)); the sub step of forming joint film 12b on main surface 13n of group III nitride film 13 formed on base substrate 130 (FIG. 7 (B2)); the step of bonding a main surface 12am of joint film 12a formed on support substrate 11 and a main surface 12bn of joint film 12b formed on group III nitride film 13 formed on base substrate 130 to thereby form a joined substrate 1L (FIG. 7 (C)); and the step or removing base substrate 130 from joined substrate 1L (FIG. 7 (D)).

The sub step shown in FIG. 7 (A1) of preparing support substrate 11 is not particularly limited, and may be performed for example by mixing, at a predetermined molar ratio, $MO_x$ (x is an arbitrary positive real number) which is an oxide containing a metal element M, $Al_2O_3$ which is an oxide containing Al, and $SiO_2$ which is an oxide containing Si, sintering the resultant mixture, cutting a substrate of a predetermined size from the resultant sintered body, and then polishing a main surface of this substrate.

The sub step shown in FIG. 7 (A2) of forming joint film 12a on main surface 11m of support substrate 11 is not particularly limited. In order to reduce the cost of forming the film, however, it is suitable to perform sputtering, vapor deposition, CVD (Chemical Vapor deposition), or the like.

The sub step shown in FIG. 7 (B1) of forming group III nitride film 13 on main surface 130n of base substrate 130 is not particularly limited. In order to form group III nitride film 13 having a high crystal quality, however, it may be suitable to form group III nitride film 13 by MOCVD (Metal Organic Chemical Vapor Deposition), sputtering, MBE (Molecular Beam Epitaxy), PLD (Pulsed Laser Deposition), HVPE (Hydride Vapor Phase Epitaxy), sublimation method, flux method, high nitrogen pressure solution method, or the like.

The sub step shown in FIG. 7 (B2) of forming joint film 12b on main surface 13n of group III nitride film 13 formed on base substrate 130 is performed similarly to the sub step of forming joint film 12a on main surface 11m of support substrate 11.

Regarding the sub step shown in FIG. 7 (C) of bonding a main surface 12am of joint film 12a formed on support substrate 11 and a main surface 12bn of joint film 12b formed on group III nitride film 13 formed on base substrate 130 to thereby form a joined substrate 1L, the method for bonding joint film 12a and joint film 12b to each other is not particularly limited, and suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. As to any of these methods of joining, the films having been joined to each other can be heated to approximately 600° C. to 1200° C. so that the joint strength is further increased. In particular, the surface activated bonding method, the high pressure bonding method, and the high vacuum bonding method exhibit a higher effect of increasing the joint strength through the heating to approximately 600° C. to 1200° C. after the joint films are joined together.

The step shown in FIG. 7 (D) of removing base substrate 130 from joined substrate 1L is not particularly limited. In order to efficiently remove base substrate 130, however, it is suitable to perform a method according to which base substrate 130 is dissolved in an etchant such as hydrofluoric acid and thereby removed, a method according to which the exposed main surface side of base substrate 130 is ground or polished and thereby the base substrate is removed. Here, in the case where base substrate 130 is removed by being dissolved in an etchant such as hydrofluoric acid, a protective member 140 for protecting support substrate 11 is preferably formed around support substrate 11.

In this way, group III nitride composite substrate 1 which includes support substrate 11, joint film 12 disposed on main surface 11m of support substrate 11, and group III nitride film 13 disposed on main surface 12m of joint film 12 is obtained.

<Second Method>

Referring to FIGS. 8 to 10, the step of forming group III nitride composite substrate 1 by the second method is not particularly limited. In order to efficiently manufacture the composite substrate, however, it is suitable to use a cutting method shown in FIGS. 8 and 9 or an ion implantation method shown in FIG. 10. In the following, the cutting method and the ion implantation method will be described.

<Cutting Method>

Referring to FIGS. 8 and 9, the step of forming group III nitride composite substrate 1 by the cutting method is not particularly limited. In order to efficiently manufacture the composite substrate, however, the step preferably includes: the sub step of forming joint film 12a on main surface 11m of support substrate 11 (FIG. 8 (A) and FIG. 9 (A)); the sub step of forming joint film 12b on main surface 13n of group III nitride film donor substrate 13D (FIG. 8 (B) and FIG. 9 (B)); the sub step of bonding main surface 12am of joint film 12a formed on support substrate 11 and main surface 12bn of joint film 12b formed on group III nitride film donor substrate 13D to each other to form joined substrate 1L, 1LS (FIG. 8 (C) and FIG. 9 (C)); and the sub step of cutting group III nitride film donor substrate 13D of joined substrate 1L, 1LS along a plane located inwardly at a predetermined depth from main surface 13n which is a bonded surface of group III nitride film donor substrate 13D (FIG. 8 (D) and FIG. 9 (D)).

Here, group III nitride film donor substrate 13D is a donor substrate separated in a later step to thereby provide group III nitride film 13. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Further, the cutting method used in the sub step of cutting group III nitride film donor substrate 13D is not particularly limited, and it is suitable to use wire saw, blade, laser, electrical discharge processing, water jet, or the like. In order to flatly cut the substrate of a large diameter with a wire saw, a fixed-abrasive wire is preferred. In order to reduce a cutting allowance, which is a portion to be removed away through cutting, loose-abrasive processing using a thin wire is preferred. In the case of a slicing machine, it is preferable to swing a wire and move an ingot up and down in synchronization with it. The cut resistance can be reduced to achieve cutting with high precision. In order to reduce the cut resistance and thereby enhance the thickness precision and the flatness, it is preferable that a resistance coefficient R (unit: N) is within an appropriate range. The resistance coefficient R (N) is represented by a formula: $R=\eta \times Q \times V/(L \times P \times n)$, where $\eta$ (unit: Pa·s) is the viscosity of a machining fluid for slicing, Q (unit: $m^3$/s) is the flow rate of the machining fluid, V (unit: m/s) is the wire linear speed, L (unit: m) is the maximum cut length, P (unit: m/s) is the cut speed, and n is the number of workpieces that are cut simultaneously. R is preferably 4000 N or more and 5000 N or less.

In this way, joined substrate 1L, 1LS is separated along a plane located inwardly at a predetermined depth from main surface 13n, which is a bonded surface of group III nitride film donor substrate 13D, and accordingly group III nitride composite substrate 1 including support substrate 11, joint film 12 disposed on main surface 11m of support substrate 11, and group III nitride film 13 disposed on main surface 12m of joint film 12 is obtained.

<Use of Support-Incorporated Group III Nitride Film Donor Substrate>

Referring to FIG. 9 (B) to (D), a support-incorporated group III nitride film donor substrate 5D in which a group III nitride film donor substrate support 15 is bonded to group III nitride film donor substrate 13D can be used to manufacture a group III nitride composite substrate 1 in a similar manner to the above. Support-incorporated group III nitride film donor substrate 5D has group III nitride film donor substrate support 15 which supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 5D, the form in which group III nitride film donor substrate support 15 and group III nitride film donor substrate 13D are bonded to each other is not particularly limited. In order to increase the joint strength of the bonding, however, it is preferable to dispose a joint film 14 therebetween. Group III nitride film donor substrate support 15 is also not particularly limited. In order to increase the support strength and prevent occurrence of crack and warp, however, it is preferable that support 15 is formed of a material having similar physical properties to support substrate 11. While joint film 14 is not particularly limited, it may preferably be any of $SiO_2$ film, $Si_3N_4$ film, $TiO_2$ film, $Ga_2O_3$ film, and the like, since these films provide a good joint to group III nitride film donor substrate support 15 and group III nitride film donor substrate 13D.

<Ion Implantation Method>

Referring to FIG. 10, the step of forming group III nitride composite substrate 1 by the ion implantation method is not particularly limited. In order to efficiently manufacture the composite substrate, however, this step preferably includes: the sub step of forming joint film 12a on main surface 11m of support substrate 11 (FIG. 10 (A)); the sub step of forming an ion implantation region 13i to a plane located inwardly at a predetermined depth from main surface 13n by implanting ions I from main surface 13n side of group III nitride film donor substrate 13D and forming joint film 12b on main surface 13n (FIG. 10 (B)); the sub step of forming joined substrate 1L by bonding main surface 12am of joint film 12a formed on support substrate 11 and main surface 12bn of joint film 12b formed on group III nitride film donor substrate 13D (FIG. 10 (C)); and the sub step of separating group III nitride film donor substrate 13D of joined substrate 1L along ion implantation region 13i (FIG. 10 (D)).

Here, the method for forming group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Ions I implanted in group III nitride film donor substrate 13D are not particularly limited. In order to suppress deterioration of the quality of the film and make the gasification temperature of ions I implanted in ion implantation region 13i lower than the decomposition temperature of group III nitride film 13, ions of low-mass atoms such as hydrogen ions, helium ions, and the like are preferred. The method for separating group III nitride film donor substrate 13D along its ion implantation region 13i is not particularly limited as long as it is a method that gasifies ions I implanted in ion implantation region 13i. For example, the method is carried out by applying heat or ultrasonic waves for example to gasify ions I implanted in ion implantation region 13i formed at the position of a predetermined depth from the main surface which is the bonded surface of group III nitride film donor substrate 13D of joined substrate IL, to thereby cause sudden volume expansion.

In this way, joined substrate 1L is separated along a plane located inwardly at a predetermined depth from main surface 13n which is the bonded surface of group III nitride film donor substrate 13D, and accordingly group III nitride composite substrate 1 is obtained including support substrate 11, joint film 12 disposed on main surface 11m of support substrate 11, and group III nitride film 13 disposed on main surface 12m of joint film 12. It should be noted that support-incorporated group III nitride film donor substrate 5D as shown in FIG. 9 can also be used for this ion implantation method.

<Third Method>

Referring to FIG. 11, the step of forming group III nitride composite substrate 1 by the third method is not particularly limited. In order to efficiently manufacture the composite substrate, however, this step preferably includes: the sub step of forming joint film 12a on main surface 11m of support substrate 11 (FIG. 11 (A)); the sub step of forming joint film 12b on main surface 13n of group III nitride film donor substrate 13D (FIG. 11 (B)); the sub step of bonding main surface 12am of joint film 12a formed on support substrate 11 and main surface 12bn of joint film 12b formed on group III nitride film donor substrate 13D to each other to thereby form joined substrate 1L (FIG. 1 (C)); and the sub step of performing at least any of grinding, polishing, and etching from main surface 13m opposite to main surface 13n which is the bonded surface of group III nitride film donor substrate 13D of joined substrate 1L (FIG. 11 (D)).

Here, group III nitride film donor substrate 13D is a donor substrate providing group III nitride film 13 in a later step through at least any of grinding, polishing, and etching, other than through separation by the second method. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Further, the method for grinding group III nitride film donor substrate 13D is not particularly limited, and may be grinding with a grinding wheel (surface grinding), shot blast, or the like. The method for polishing group III nitride film donor substrate 13D is not particularly limited, and may be mechanical polishing, CMP (chemical mechanical polishing), or the like. The method for etching group III nitride film donor substrate 13D is not particularly limited, and may be wet etching with a chemical solution, dry etching such as RIE (Reaction Ion Etching), or the like.

In this way, group III nitride composite substrate 1 including support substrate 11, joint film 12 disposed on main surface 11m of support substrate 11, and group III nitride film 13 disposed on main surface 12m of joint film 12 is obtained.

{Step of Adjusting Thickness of Group III Nitride Film of Group III Nitride Composite Substrate and Off Angle Between Main Surface of Group III Nitride Film and Plane of Predetermined Plane Orientation}

The method for manufacturing group III nitride composite substrate 1 of the present embodiment includes, after the step of forming group III nitride composite substrate 1, the step of adjusting the thickness of group III nitride film 13 and the off angle between main surface 13m of group III nitride film 13 and a plane of a predetermined plane orientation by performing at least one of polishing and etching on the group III-nitride-film 13-side main surface 13m of group III nitride composite substrate 1. This step enables the ratio $s_t/m_t$ of standard deviation $s_t$ of the thickness of group III nitride film 13 of group III nitride composite substrate 1, to mean value $m_t$ of the thickness thereof to be 0.01 or more and 0.5 or less, and enables the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle to be 0.005 or more and 0.6 or less.

Here, in order to adjust, within respective predetermined ranges as described above, the variation of the thickness of group III nitride film 13 (specifically the ratio $s_t/m_t$ of standard deviation $s_t$ of the thickness of group III nitride film 13 to mean value $m_t$ of the thickness thereof) and the variation of the off angle between main surface 13m of group III nitride film 13 and a plane of a predetermined plane orientation (specifically the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle), it is preferable to perform at least one of polishing and etching in multiple stages on group III-nitride-film 13-side main surface 13m. Conditions of finish polishing and finish etching in the last stage as well as pre-finish polishing and pre-finish etching in the penultimate stage, among polishing and etching in multiple stages, are particularly important.

The etching is preferably dry etching, particularly RIE (Reactive Ion Etching), since control of the thickness of group III nitride film 13 is easy. Particularly in the case where group III nitride film 13 has a small thickness of 5 μm or less, dry etching, particularly RIE is preferred.

For the pre-finish polishing, an oil-based polishing agent is more preferable than an aqueous polishing agent, a polishing agent having a higher viscosity is more preferable, a smaller abrasive grain size is more preferable, and a hard surface plate and a hard polishing pad are more preferable. As polishing conditions, a low pressure and a low circumferential velocity are preferred. It is also preferable that an action coefficient FE (unit: $m^2/s$) defined by a formula: FE=η×Q×V/S×P, where r (unit: mPa·S) is the viscosity of a polishing solution, Q (unit: $m^3/s$) is the flow rate of the polishing solution, S (unit: $m^2$) is the area of a surface plate, P (unit: kPa) is the polishing pressure of the surface plate, and V (unit: m/s) is the circumferential velocity of the surface plate, falls within a predetermined range, specifically $4 \times 10^{-17}$ $m^2/s$ or more and $1 \times 10^{-16}$ $m^2/s$ or less.

For the finish polishing, a polishing agent having a higher viscosity is more preferable, a smaller abrasive grain size is more preferable, and a hard surface plate and a hard polishing pad are more preferable. As polishing conditions, a low pressure and a low circumferential velocity are preferred. It is also preferable that action coefficient FE (unit: $m^2/s$) defined in the above-described way falls in a predetermined range, specifically $4 \times 10^{-14}$ $m^2/s$ or more and $1 \times 10^{-13}$ $m^2/s$ or less.

For the pre-finish etching, in order to increase the etching rate, reduce in-plane etching variation, and stabilize etching, it is preferable to use chlorine-based gas such as $Cl_2$, $BCl_3$, inert gas such as Ar, $N_2$, or the like. $H_2$ may be added to these gases. As etching conditions, a high flow rate, a high pressure, and high electric power are preferred. In order to reduce in-plane etching variation, it is preferable that pressure P (unit: Pa) in a chamber, flow rate Q (unit: sccm) of a gas mixture, chamber volume V (unit: 1 (liter)), and etching area S (unit: $m^2$) satisfy a relation $350 \leq PV/SQ \leq 500$.

For the finish etching, in order to increase the etching rate, reduce in-plane etching variation, stabilize etching, reduce the surface roughness, and suppress damage, it is preferable to use chlorine-based gas such as $Cl_2$, $BCl_3$. $H_2$ may be added to these gasses. As conditions, a low flow rate, a low pressure, and low electric power are preferred. In order to reduce in-plane etching variation, it is preferable that pressure P (unit: Pa) in a chamber, flow rate Q (unit: sccm) of a gas mixture, chamber volume V (unit: 1 (liter)), and etching area S (unit: $m^2$) satisfy a relation $310 \leq PV/SQ \leq 380$.

Here, selection of polishing and etching is not particularly limited and any selection may be made. Therefore, as to selection of process methods in the pre-finish stage and the finish stage, any of a selection of the pre-finish polishing and the finish polishing, a selection of the pre-finish polishing and the finish etching, a selection of the pre-finish etching and the finish polishing, and a selection of the pre-finish etching and the finish etching can be made.

Regarding the method for manufacturing group III nitride composite substrate 1 of the present embodiment, mean value $m_{III-N}$ of the root mean square roughness of group III-nitride-film 13-side main surface 13m of group III nitride composite substrate 1 and variation thereof (specifically the ratio $s_{III-N}/m_{III-N}$ of standard deviation $s_{III-N}$ of the root mean square roughness to mean value $m_{III-N}$ thereof) can be controlled by means of the conditions of the finish polishing or the finish etching.

In order to reduce mean value $m_{III-N}$ of the root mean square roughness of group III-nitride-film 13-side main surface 13m of group III nitride composite substrate 1, it is preferable, in the case of the finish polishing, to have a polishing agent of a higher viscosity, a smaller abrasive grain size, and a soft surface plate and a soft polishing pad. As for the surface shape of the surface plate and the polishing pad, a shape in which grooves are formed for removing sludge is preferred. Here, the grooves for removing sludge refer to grooves of a relatively large width and a wide pitch formed for the purpose of eliminating and removing sludge and/or aggregated abrasive grains on a polishing interface. As polishing conditions, a low pressure and a low circumferential velocity are preferred. In the case of the finish etching, it is preferable to use chlorine-based gas such as $Cl_2$, $BCl_3$, and $H_2$, and a low flow rate, a low pressure, and a low electric power are preferred conditions.

For the ratio $s_{III-N}/m_{III-N}$ of standard deviation $s_{III-N}$ of the root mean square roughness of group III-nitride-film 13-side main surface 13m of group III nitride composite substrate 1, to mean value $m_{III-N}$ of the root mean square roughness thereof, it is preferable that action coefficient FE (unit: $m^2/s$) defined by a formula: FE=η×Q×V/S×P, where η (unit: mPa·S) is the viscosity of a polishing solution, Q (unit: $m^3/s$) is the flow rate of the polishing solution, S (unit: $m^2$) is the area of a surface plate, P (unit: kPa) is the polishing pressure of the surface plate, and V (unit: m/s) is the circumferential velocity of the surface plate, falls within a predetermined range, specifically $4 \times 10^{-14}$ $m^2/s$ or more and $1 \times 10^{-13}$ $m^2/s$ or less. As for the surface shape of the surface plate and the polishing pad, a shape in which grooves are formed for making the polishing agent uniform is preferred. Here, the grooves for making the polishing agent uniform refer to grooves of a relatively small width and a narrow pitch formed for the purpose of uniformly holding the polishing agent in a central portion of the substrate. In the case of the finish etching, it is preferable that pressure P (unit: Pa) in a chamber, flow rate Q (unit: sccm) of a gas mixture, chamber volume V (unit: 1 (liter)), and etching area S (unit: $m^2$) satisfy a relation $310 \leq PV/SQ \leq 380$.

Fifth Embodiment: Method for Manufacturing Group III Nitride Semiconductor Device Referring to FIG. 12, a method for manufacturing a group III nitride semiconductor device which is a still further embodiment of the present invention includes the steps of: preparing group III nitride composite substrate 1 of the first embodiment (FIG. 12 (A)); and growing at least one group III nitride layer 20 on group III-nitride-film 13-side main surface 13*m* of group III nitride composite substrate 1 (FIG. 12(A)). In growing group III nitride layer 20, the method for manufacturing a group III nitride semiconductor device of the present embodiment grows the group III nitride layer on main surface 13*m* of group III nitride composite substrate 1 having a small thickness variation and a small off-angle variation within main surface 13*m* of group III nitride film 13. Therefore, group III nitride semiconductor devices having excellent characteristics can be manufactured with a high yield.

Figure 12:
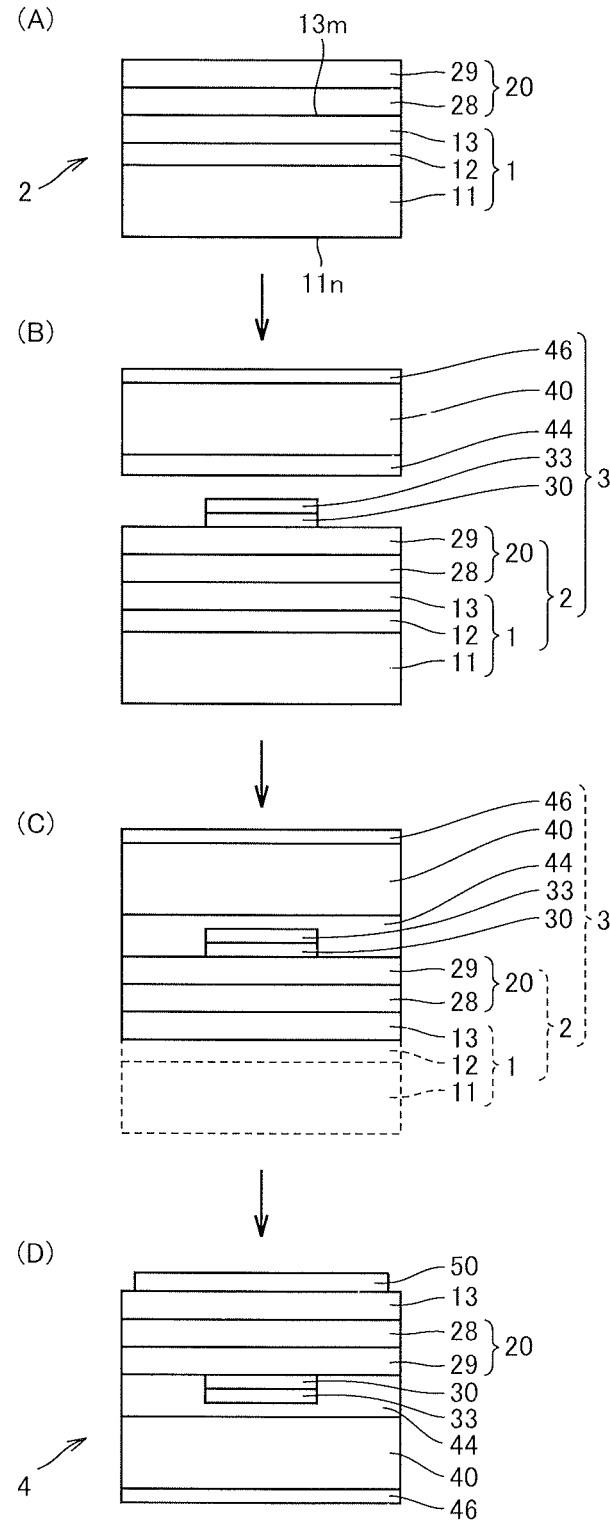
FIG. 12 is a schematic cross-sectional view showing an example of the method for manufacturing a group III nitride semiconductor device according to the present invention and Reference Invention I.

Regarding the method for manufacturing a group III nitride semiconductor device of the present embodiment, the method may further include the step of removing support substrate 11 from group III nitride composite substrate 1 (FIG. 12 (C)), after the step of growing group III nitride layer 20 (FIG. 12 (A)). Through this step, group III nitride semiconductor devices in a variety of forms can be manufactured.

Further, regarding the method for manufacturing a group III nitride semiconductor device of the present embodiment, the method may further include the step of further bonding a device support substrate 40 onto group III nitride layer 20 (FIG. 12 (B)), after the step of growing the group III nitride layer (FIG. 12 (A)) and before the step of removing the support substrate (FIG. 12 (C)). Through this step, group III nitride semiconductor devices supported by device support substrate 40 and having a high mechanical strength and excellent characteristics can be manufactured with a high yield.

The method for manufacturing a group III nitride semiconductor device of the present embodiment can specifically be performed through the following steps.

<Step of Preparing Group III Nitride Composite Substrate>

Referring to FIG. 12 (A), the step of preparing group III nitride composite substrate 1 is similar to that in the method for manufacturing a group III nitride composite substrate 1 as described above.

<Step of Growing Group III Nitride Layer>

Referring to FIG. 12 (A), in the step of growing at least one group III nitride layer 20 on group III-nitride-film 13-side main surface 13*m* of group III nitride composite substrate 1, suitable methods for growing group III nitride layer 20 are gas phase methods such as MOCVD, MBE, HVPE, and sublimation method, as well as liquid phase methods such as flux method, in order to epitaxially grow group III nitride layer 20 having a high crystal quality, and a particularly suitable method is MOCVD.

The structure of group III nitride layer 20 varies depending on the type of group III nitride semiconductor device 4. In the case where group III nitride semiconductor device 4 is an SBD (Schottky Barrier Diode), group III nitride layer 20 may be configured by successively growing, for example, an n$^+$-GaN layer 28 (having a carrier concentration for example of $2\times10^{18}$ cm$^{-3}$) and an n$^-$-GaN layer 29 (having a carrier concentration for example of $5\times10^{15}$ cm$^{-3}$) on main surface 13*m* of group III nitride film 13 of group III nitride composite substrate 1.

In this way, at least one group III nitride layer 20 is grown on group III-nitride-film 13-side main surface 13*m*, and accordingly laminated group III nitride composite substrate 2 is obtained.

<Step of Bonding Device Support Substrate>

Referring to FIG. 12 (B), the step of further bonding device support substrate 40 onto group III nitride layer 20 is performed by forming a first electrode 30 which is to serve as a Schottky electrode and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, a laminated substrate 3 is obtained. As device support substrate 40, Si substrate, Mo substrate, CuW substrate, or the like is used.

<Step of Removing Support Substrate>

Referring to FIG. 12 (C), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed. The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (such as GaN), or the like, since the support substrate 11 of the polycrystalline material is easier to remove.

It should be noted that, regarding manufacturing of a group III nitride semiconductor device using a free-standing group III nitride substrate, a rear surface of the free-standing group I nitride substrate (the rear surface refers to a main surface opposite to a main surface on which a group III nitride layer is formed, and this definition is applied as well hereinafter) is subjected to grinding or the like for the purpose of reducing the thickness of the device. In contrast, regarding manufacturing of a group III nitride semiconductor device using a group III nitride composite substrate, it is easy to remove the support substrate by etching, grinding, or the like for the purpose of reducing the thickness of the device, and therefore, the cost of manufacturing the group III nitride semiconductor device can be reduced.

When support substrate 11 is removed and joint film 12 is further removed, group III nitride film 13 can be removed. Improvement of the crystallinity, reduction of the dislocation density, and adjustment of the carrier concentration of group III nitride layer 20 are easier as compared with those of group III nitride film 13. Group III nitride film 13 can be removed to further improve the device characteristics. For removal of group III nitride film 13, polishing or etching can be used. It is preferable to use dry etching since control of the thickness to be removed is easy.

<Step of Forming Electrode>

Referring to FIG. 12 (D), on group III nitride film 13 which has been exposed after removal of support substrate 11 and joint film 12 from laminated substrate 3, a second electrode 50 is formed and, on device support substrate 40, a device support substrate electrode 46 is formed.

In this way, group III nitride semiconductor devices having excellent characteristics can be manufactured with a high yield.

Some reference inventions for the sake of reference for the prevent invention, namely Reference Invention I and Reference Invention II will be described in the following.

<Reference Invention I>

Reference Invention I relates to a group III nitride composite substrate and a method for manufacturing the same, a laminated group III nitride composite substrate, and a group III nitride semiconductor device and a method for manufacturing the same.

[Background Art Regarding Reference Invention I]

Group III nitrides such as GaN have superior semiconductor properties and are therefore used as materials suitable for semiconductor devices. In addition, group III nitrides such as GaN have excellent material properties different from those of Si, GaAs, SiC, or the like for different types of semiconductor devices such as light-emitting device and electronic device for example, and can therefore be used for a variety of devices.

For example, Japanese Patent Laying-Open No. 2009-126722 discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof, a free-standing GaN substrate having a diameter of 100 mm and a thickness of 400 μm.

Japanese Patent Laying-Open No. 2008-010766 discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 μm or more and 100 μm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 μm or 100 μm and bonded to the sapphire substrate.

Japanese Patent Laying-Open No. 2010-182936 discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof a composite substrate having a diameter of 50.8 mm and including a sapphire substrate, a GaN layer, and a joint layer formed by press fitting between the substrate and the GaN layer, in which the GaN layer has a thickness of 5 μm to 220 μm.

Problems to be Solved by Reference Invention I

The free-standing group III nitride substrate disclosed in Japanese Patent Laying-Open No. 2009-126722 involves problems that the substrate is manufactured at high cost and therefore very expensive, and that the substrate is likely to crack, resulting in difficulty in increasing the diameter of the substrate and decreasing the thickness thereof. Further, it is necessary to reduce the thickness of the free-standing group III nitride substrate when a semiconductor device is to be formed, which is accompanied by a problem of an increase in manufacturing cost due to a process step such as grinding of the rear surface (a main surface opposite to a main surface on which a group III nitride layer is formed for implementing device functions, and this definition of the rear surface is applied hereinafter) of the free-standing group III nitride substrate.

Moreover, the GaN-thin-film composite substrate disclosed in Japanese Patent Laying-Open No. 2008-010766 and the composite substrate disclosed in Japanese Patent Laying-Open No. 2010-182936 are each a composite substrate in which a film or layer of group III nitride is joined onto a support substrate, and are therefore likely to have a large temperature variation on the main surface of the substrate when the group III nitride layer is grown on the substrate for manufacturing a group III nitride semiconductor device, as compared with the free-standing group III nitride substrate disclosed in Japanese Patent Laying-Open No. 2009-126722. Accordingly, the above-referenced composite substrates suffer from a problem of difficulty in increasing the yield of semiconductor devices to be manufactured, if the diameter of the substrate is increased.

An object of Reference Invention I is to solve the above problems and thereby provide a low-cost and large-diameter group III nitride composite substrate which includes a thin group III nitride film and has a small temperature variation (namely unevenness, and this definition of the variation is applied hereinafter) on a main surface when a group III nitride layer is grown, to enable reduction of the cost of manufacturing a semiconductor device and enable group III nitride semiconductor devices to be manufactured with a high yield, and provide a method for manufacturing the group III nitride composite substrate, a laminated group III nitride composite substrate, as well as a group III nitride semiconductor device and a method for manufacturing the same.

[Solution to the Problems]

According to an aspect, Reference Invention I is a group III nitride composite substrate with a diameter of 75 mm or more including a support substrate and a group III nitride film having a thickness of 50 nm or more and less than 10 μm that are bonded to each other, a mean value $m_S$ of a root mean square roughness of a support-substrate-side main surface being 0.3 nm or more and 20 nm or less, and a ratio $s_S/m_S$ of a standard deviation $s_S$ of the root mean square roughness, to the mean value $m_S$ of the root mean square roughness of the support-substrate-side main surface, being 0.005 or more and 0.4 or less.

Regarding the group III nitride composite substrate according to the above aspect of Reference Invention I, a mean value $m_{III-N}$ of a root mean square roughness of a group III-nitride-film-side main surface may be 0.4 nm or more and 10 nm or less, and a ratio $s_{III-N}/m_{III-N}$ of a standard deviation $s_{III-N}$ of the root mean square roughness, to the mean value $m_{III-N}$ of the root mean square roughness of the group III-nitride-film-side main surface, may be 0.008 or more and 0.5 or less. A ratio $W_S/D$ of a warp $W_S$ of the support-substrate-side main surface to the diameter D may be $-7 \times 10^{-4}$ or more and $8 \times 10^{-4}$ or less. A ratio $\alpha_{III-N}/\alpha_S$ of a thermal expansion coefficient $\alpha_{III-N}$ of the group III nitride film to a thermal expansion coefficient $\alpha_S$ of the support substrate may be 0.75 or more and 1.25 or less, and a ratio $t_{III-N}/t_S$ of a thickness $t_{III-N}$ of the group III nitride film to a thickness $t_S$ of the support substrate may be $1 \times 10^{-4}$ or more and $2 \times 10^{-2}$ or less. The support substrate may have a thermal conductivity $\lambda_S$ of 3 W·m$^{-1}$·K$^{-1}$ or more and 280 W·m$^{-1}$·K$^{-1}$ or less. The support substrate may have a Young's modulus $E_S$ of 150 GPa or more and 500 GPa or less. The support substrate may include polycrystal. Impurity metal atoms of the main surface of the group III nitride film may be 1×10$^{13}$ atoms/cm$^2$ or less. The diameter may be 100 mm or more. Further, the diameter may be 125 mm or more and 300 mm or less.

According to another aspect, Reference Invention I is a laminated group III nitride composite substrate including the group III nitride composite substrate according to the above aspect, and at least one group III nitride layer disposed on the group III-nitride-film-side main surface of the group III nitride composite substrate.

According to still another aspect, Reference Invention I is a group III nitride semiconductor device including the group III nitride film in the group III nitride composite substrate according to the above aspect, and at least one group III nitride layer disposed on the group III nitride film.

According to a further aspect, Reference Invention I is a method for manufacturing a group III nitride composite substrate according to the above aspect, including the steps of: forming the group III nitride composite substrate by disposing a group III nitride film on one main surface side of a support substrate; and adjusting the root mean square roughness of a support-substrate-side main surface by polishing the support-substrate-side main surface of the group III nitride composite substrate before, in, or after the step of forming the group III nitride composite substrate.

According to a still further aspect, Reference Invention I is a method for manufacturing a group III nitride semiconductor device, including the steps of: preparing a group III nitride composite substrate according to the above aspect; and growing at least one group III nitride layer on a group III-nitride-film-side main surface of the group III nitride composite substrate.

The method for manufacturing a group III nitride semiconductor device according to this aspect of Reference Invention I may further include the step of removing the support substrate from the group III nitride composite substrate, after the step of growing the group III nitride layer. It may further include the step of bonding a device support substrate onto the group III nitride layer, after the step of growing the group III nitride layer and before the step of removing the support substrate.

[Effects of Reference Invention I]

Reference Invention I can provide a low-cost and large-diameter group III nitride composite substrate which includes a thin group III nitride film and has a small temperature variation on a main surface when a group III nitride layer is grown, to enable reduction of the cost of manufacturing a semiconductor device and enable group III nitride semiconductor devices to be manufactured with a high yield, and provide a method for manufacturing the group III nitride composite substrate, a laminated group III nitride composite substrate, as well as a group III nitride semiconductor device and a method for manufacturing the same.

Reference Embodiment I-1: Group III Nitride Composite Substrate

Referring to FIG. 1, a group III nitride composite substrate 1 which is a reference embodiment of Reference Invention I is a group III nitride composite substrate 1 with a diameter of 75 mm or more including a support substrate 11 and a group III nitride film 13 having a thickness of 50 nm or more and less than 10 μm that are bonded to each other, a mean value m$_S$ of a root mean square roughness of a support-substrate 11-side main surface 11n is 0.3 nm or more and 20 nm or less, and a ratio s$_S$/m$_S$ of a standard deviation s$_S$ of the root mean square roughness, to the mean value m$_S$ of the root mean square roughness of support-substrate 11-side main surface 11n, is 0.005 or more and 0.4 or less.

Regarding group III nitride composite substrate 1 of the present reference embodiment, the temperature variation (namely unevenness) on the main surface is small when a group III nitride layer is grown for manufacturing a group III nitride semiconductor device, and therefore, the group III nitride layer having a high crystal quality can be grown. Thus, high-quality group III nitride semiconductor devices can be manufactured with a high yield. This will be described in more detail in the following.

Referring to FIGS. 1 and 3, group III nitride composite substrate 1 of the present reference embodiment has a structure in which group III nitride film 13 is bonded onto support substrate 11. When a group III nitride semiconductor device is manufactured, a susceptor (not shown) including a temperature raising apparatus is arranged so that support-substrate 11-side main surface 11n, which corresponds to the rear side of group III nitride composite substrate 1, is opposite to a main surface of the susceptor, and at least one group III nitride layer 20 is grown on a group III-nitride-film 13-side main surface 13m, which corresponds to the front side of group III nitride composite substrate 1.

Group III nitride composite substrate 1 of the present reference embodiment has a diameter of 75 mm or more, group III nitride film 13 bonded onto support substrate 11 of the composite substrate has a thickness of 50 nm or more and less than 10 μm, mean value m$_S$ of the root mean square roughness of support-substrate 11-side main surface 11n is 0.3 nm or more and 20 nm or less, and a ratio s$_S$/m$_S$ of standard deviation s$_S$ of the root mean square roughness, to mean value m$_S$ of the root mean square roughness of support-substrate 11-side main surface 11n is 0.005 or more and 0.4 or less. Thus, heat is uniformly transmitted from the main surface of the susceptor whose temperature has been raised, to the whole of support-substrate 11-side main surface 11n which is the rear side of large-diameter group III nitride composite substrate 1 and has a small average and variation of the root mean square roughness. Therefore, group III nitride composite substrate 1 with a large diameter is entirely heated uniformly. Accordingly, a small and uniform temperature variation on the group III-nitride-film 13-side main surface 13m, which is the front side of group III nitride composite substrate 1 of a large diameter, is obtained. Thus, on group III-nitride-film 13-side main surface 13m of large-diameter group III nitride composite substrate 1, uniform and large-diameter group III nitride layer 20 having a high crystal quality can be grown, and therefore, group III nitride semiconductor devices having excellent characteristics can be manufactured with a high yield.

Referring to FIG. 1, the manner in which support substrate 11 and group III nitride film 13 are bonded to each other in group III nitride composite substrate 1 is not particularly limited. In order to increase the joint strength of the bonding, however, it is preferable to provide a joint film 12 between the support substrate and the group III nitride film.

<Thickness of Group III Nitride Film>

Referring to FIG. 1, the thickness of group III nitride film 13 of group III nitride composite substrate 1 in the present reference embodiment is 50 nm or more and less than 10 μm. Here, the thickness of group III nitride film 13 refers to the mean value calculated from the thicknesses measured at 13 measurement points on main surface 13m of group III nitride film 13 shown in FIG. 2. The 13 measurement points P on the main surface of group III nitride film 13 shown in FIG. 2 are constituted, regardless of the magnitude of the diameter of the group III nitride film: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

In order to grow a group III nitride layer having a high crystal quality, group III nitride film 13 needs a thickness of 50 nm or more, preferably 80 nm or more, more preferably 100 nm or more, still more preferably 120 nm or more, and particularly preferably 150 nm or more. Meanwhile, in order to reduce the cost of the material for group III nitride composite substrate 1, group III nitride film 13 needs a thickness of less than 10 μm, preferably 5 μm or less, more preferably 1 μm or less, still more preferably 500 nm or less, and particularly preferably 250 nm or less.

<Diameter of Group III Nitride Composite Substrate>

Referring to FIG. 1, group III nitride composite substrate 1 in the present reference embodiment has a diameter of 75 mm or more. In order to produce a greater number of semiconductor device chips from one composite substrate, group III nitride composite substrate 1 needs a diameter of 75 mm or more, preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

<Root Mean Square Roughness of Support Substrate Side>

Referring to FIGS. 1 and 2, group III nitride composite substrate 1 in the present reference embodiment has a mean value $m_S$ of the root mean square roughness of support-substrate 11-side main surface 11n of 0.3 nm or more and 20 nm or less, and a ratio $s_S/m_S$ of standard deviation $s_S$ of the root mean square roughness to mean value $m_S$ of the root mean square roughness of support-substrate 11-side main surface 11n of 0.005 or more and 0.4 or less.

Regarding support-substrate 11-side main surface 11n which is the rear side of group III nitride composite substrate 1, in order to grow a uniform group III nitride layer having a high crystal quality on group III-nitride-film 13-side main surface 13m of group III nitride composite substrate 1, support-substrate 11-side main surface 11n needs a mean value $m_S$ of the root mean square roughness of 20 nm or less, preferably 10 nm or less, and more preferably 5 nm or less, and a ratio $s_S/m_S$ of standard deviation $s_S$ of the root mean square roughness to mean value $m_S$ of the root mean square roughness of 0.4 or less, preferably 0.3 or less, and more preferably 0.2 or less.

Regarding support-substrate 11-side main surface 11n which is the rear side of group III nitride composite substrate 1, in order to reduce the cost of surface treatment of main surface 11n, support-substrate 11-side main surface 11n needs a mean value $m_S$ of the root mean square roughness of 0.3 nm or more, preferably 0.5 nm or more, and more preferably 1 nm or more, and a ratio $s_S/m_S$ of standard deviation $s_S$ of the root mean square roughness to mean value $m_S$ of the root mean square roughness of 0.005 or more, preferably 0.01 or more, and more preferably 0.05 or more.

Here, referring to FIG. 2, mean value $m_S$ and standard deviation $s_S$ of the root mean square roughness of support-substrate 11-side main surface 1 in of group III nitride composite substrate 1 are respectively the mean value and the standard deviation that are calculated from the root mean square roughness measured at the 13 measurement points P on main surface 11n of support substrate 11. The 13 measurement points P on main surface 11n of support substrate 11 shown in FIG. 2 are constituted, regardless of the magnitude of the diameter of support substrate 11: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation herein refers to the positive square root of unbiased variance.

The root mean square roughness measured at the 13 measurement points P on main surface 11n of support substrate 11 shown in FIG. 2 refers to the positive square root of the mean of respective squares of the distances to the points from a reference plane which is calculated from each point in a measurement region having a size of 85 μm×85 μm in which measurement point P is located at the center, and is measured by means of an AFM (Atomic Force Microscope), an optical interferometric roughness meter, a laser microscope, a stylus-based roughness meter, or the like.

It should be noted that mean value $m_S$ and standard deviation $s_S$ of the root mean square roughness of support-substrate 11-side main surface 11n of group III nitride composite substrate 1 can be adjusted, as described later herein, by physical properties of abrasives, a surface plate, and a polishing pad for polishing main surface 11n of support substrate 11, the shapes of the surface plate and the polishing pad, and polishing conditions.

<Root Mean Square Roughness of Group III Nitride Film Side>

Referring to FIGS. 1 and 2, group III nitride composite substrate 1 in the present reference embodiment preferably has a mean value $m_{III-N}$ of the root mean square roughness of group III-nitride-film 13-side main surface 13m of 0.4 nm or more and 10 nm or less, and preferably has a ratio $s_{III-N}/m_{III-N}$ of standard deviation $s_{III-N}$ of the root mean square roughness to mean value $m_{III-N}$ of the root mean square roughness of group III-nitride-film 13-side main surface 13m of 0.008 or more and 0.5 or less.

Regarding group III-nitride-film 13-side main surface 13m which is the front side of group III nitride composite substrate 1, in order to grow a uniform group III nitride layer having a high crystal quality on main surface 13m, mean value $m_{III-N}$ of the root mean square roughness is preferably 10 nm or less, more preferably 5 nm or less, and still more preferably 3 nm or less, and the ratio $s_{III-N}/m_{III-N}$ of standard deviation $s_{III-N}$ of the root mean square roughness to mean value $m_{III-N}$ of the root mean square roughness is preferably 0.5 or less, more preferably 0.4 or less, and still more preferably 0.2 or less.

Further, regarding group III-nitride-film 13-side main surface 13m which is the front side of group III nitride composite substrate 1, in order to reduce the cost of surface treatment of main surface 13m, mean value $m_{III-N}$ of the root mean square roughness is preferably 0.4 nm or more, more preferably 1 nm or more, and still more preferably 1.5 nm or more, and the ratio $s_{III-N}/m_{III-N}$ of standard deviation $s_{III-N}$ of the root mean square roughness to mean value $m_{III-N}$ of the root mean square roughness is preferably 0.008 or more, more preferably 0.02 or more, and still more preferably 0.05 or more.

Here, referring to FIG. 2, mean value $m_{III-N}$ and standard deviation $s_{III-N}$ of the root mean square roughness of group III-nitride-film 13-side main surface 13m of group III nitride composite substrate 1 are respectively the mean value and the standard deviation that are calculated from the root mean square roughness measured at the 13 measurement points P on main surface 13m of group III nitride film 13. The 13 measurement points P on main surface 13m of group III nitride film 13 shown in FIG. 2 are constituted, regardless of the magnitude of the diameter of group III nitride film 13: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$. The standard deviation herein refers to the positive square root of unbiased variance.

The root mean square roughness measured at the 13 measurement points P on main surface 13m of group III nitride film 13 shown in FIG. 2 refers to the positive square root of the mean of respective squares of the distances to the points from a reference plane which is calculated from each point in a measurement region having a size of 85 μm×85 μm in which measurement point P is located at the center, and is measured by means of an AFM (Atomic Force Microscope), an optical interferometric roughness meter, a laser microscope, a stylus-based roughness meter, or the like.

It should be noted that mean value $m_{III-N}$ and standard deviation $s_{III-N}$ of the root mean square roughness of group III-nitride-film 13-side main surface 13m of group III nitride composite substrate 1 can be adjusted, as described later herein, by physical properties of abrasives, a surface plate, and a polishing pad for polishing main surface 13m of group III nitride film 13, the shapes of the surface plate and the polishing pad, and polishing conditions.

<Ratio of Warp of Support Substrate Side to Diameter>

Referring to FIG. 1, regarding group III nitride composite substrate 1 in the present reference embodiment, a ratio $W_S/D$ of a warp $W_S$ of support-substrate 11-side main surface 11n to a diameter D is preferably $-7\times10^{-4}$ or more and $8\times10^{-4}$ or less, more preferably $-4\times10^{-4}$ or more and $5\times10^{-4}$ or less, still more preferably $-2.5\times10^{-4}$ or more and $3\times10^{-4}$ or less, and particularly preferably $-1\times10$ or more and $1.5\times10^{-4}$ or less. Here, regarding the signs for warp Ws and the ratio Ws/D, a concave warp of support-substrate 11-side main surface 11n is herein indicated with the + (positive) sign, and a convex warp of support-substrate 11-side main surface 11n is herein indicated with the − (negative) sign. If the ratio $W_S/D$ of warp $W_S$ of support-substrate 11-side main surface 11n to diameter D of group III nitride composite substrate 1 is a small value of preferably $-7\times10^{-4}$ or more and $8\times10^{-4}$ or less, more preferably $-4\times10^{-4}$ or more and $5\times10^{-4}$ or less, still more preferably $-2.5\times10^{-4}$ or more and $3\times10^{-4}$ or less, and particularly preferably $-1\times10^{-4}$ or more and $1.5\times10^{-4}$ or less, heat is uniformly transmitted to the whole of support-substrate 11-side main surface 11n of large-diameter group III nitride composite substrate 1, from the main surface of the susceptor with its temperature increased, when a group III nitride layer is grown on group III-nitride-film 13-side main surface 13m of group III nitride composite substrate 1, and therefore, the whole of group III nitride composite substrate 1 is uniformly heated. Accordingly, the temperature on group III-nitride-film 13-side main surface 13m which is the front side of group III nitride composite substrate 1 has a small variation and has uniformity. Thus, a uniform and large-diameter group III nitride layer having a high crystal quality can be grown on group III-nitride-film 13-side main surface 13m of group III nitride composite substrate 1. Accordingly, group III nitride semiconductor devices having excellent characteristics can be manufactured with a high yield.

<Ratio of Thermal Expansion Coefficient of Group III Nitride Film to Thermal Expansion Coefficient of Support Substrate>

Referring to FIG. 1, regarding group III nitride composite substrate 1 in the present reference embodiment, in order to suppress warp and cracks of group III nitride composite substrate 1 and of a group III nitride layer grown on group III nitride film 13 and thereby increase the yield of group III nitride semiconductor devices, a ratio $\alpha_{III-N}/\alpha_S$ of a thermal expansion coefficient $\alpha_{III-N}$ of group III nitride film 13 to a thermal expansion coefficient $\alpha_S$ of support substrate 11 is preferably 0.75 or more and 1.25 or less, more preferably 0.85 or more and 1.15 or less, and still more preferably 0.95 or more and 1.05 or less. Here, thermal expansion coefficient $\alpha_S$ of support substrate 11 and thermal expansion coefficient $\alpha_{III-N}$ of group III nitride film 13 can be measured with a thermomechanical analysis apparatus.

<Ratio of Thickness of Group III Nitride Film to Thickness of Support Substrate>

Referring to FIG. 1, regarding group III nitride composite substrate 1 in the present reference embodiment, in order to suppress warp and cracks of group III nitride composite substrate 1 and of a group III nitride layer grown on group III nitride film 13 and thereby increase the yield of group III nitride semiconductor devices, a ratio $t_{III-N}/t_S$ of a thickness $t_{III-N}$ of group III nitride film 13 to a thickness $t_S$ of support substrate 11 is preferably $1\times10^{-4}$ or more and $2\times10^{-2}$ or less, more preferably $2\times10^{-4}$ or more and $2\times10^{-3}$ or less, and still more preferably $5\times10^{-4}$ or more and $1\times10^{-3}$ or less. Here, thickness $t_S$ of support substrate 11 can be measured through observation of a cross section of the film with an optical microscope and/or an SEM or with a digital indicator, or the like. Thickness $t_{III-N}$ of group III nitride film 13 can be measured through observation of a cross section of the film with an optical microscope and/or an SEM or by reflectance spectroscopy, or the like.

Thus, in order to suppress warp and cracks of group III nitride composite substrate 1 and of a group III nitride layer grown on group III nitride film 13 and thereby increase the yield of group III nitride semiconductor devices, the ratio $\alpha_{III-N}/\alpha_S$ of thermal expansion coefficient $\alpha_{III-N}$ of group III nitride film 13 to thermal expansion coefficient $\alpha_S$ of support substrate 11 is preferably 0.75 or more and 1.25 or less, and the ratio $t_{III-N}/t_S$ of thickness $t_{III-N}$ of the group III nitride film to thickness $t_S$ of support substrate 11 is preferably $1\times10^{-4}$ or more and $2\times10^{-2}$ or less. It is more preferable that the ratio $\alpha_{III-N}/\alpha_S$ is 0.85 or more and 1.15 or less and the ratio $t_{III-N}/t_S$ is $2\times10^{-4}$ or more and $2\times10^{-3}$ or less, and it is further preferable that the ratio $\alpha_{III-N}/\alpha_S$ is 0.95 or more and 1.05 or less and the ratio $t_{III-N}/t_S$ is $5\times10^{-4}$ or more and $1\times10^{-3}$ or less.

<Support Substrate>

Support substrate 11 included in group III nitride composite substrate 1 in the present reference embodiment is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride.

As described above, group III nitride composite substrate 1 in the present reference embodiment preferably has a ratio $\alpha_{III-N}/\alpha_S$ of thermal expansion coefficient $\alpha_{III-N}$ of group III nitride film 13 to thermal expansion coefficient $\alpha_S$ of support substrate 11 of 0.75 or more and 1.25 or less.

Regarding group III nitride composite substrate 1 in the present reference embodiment, thermal conductivity $\lambda_S$ of support substrate 11 is preferably 3 W·m$^{-1}$·K$^{-1}$ or more and 280 W·m$^{-1}$·K$^{-1}$ or less, more preferably 5 W·m$^{-1}$·K$^{-1}$ or more and 210 W·m$^{-1}$·K$^{-1}$ or less, and still more preferably 10 W·m$^{-1}$·K$^{-1}$ or more and 120 W·m$^{-1}$·K$^{-1}$ or less. Here, thermal conductivity $\lambda_S$ of support substrate 11 can be measured by a laser flash method. Group III nitride composite substrate 1 having support substrate 11 with a thermal conductivity $\lambda_S$ of preferably 3 W·m$^{-1}$·K$^{-1}$ or more, more preferably 5 W·m$^{-1}$·K$^{-1}$ or more, and still more preferably 10 W·m$^{-1}$·K$^{-1}$ or more, can efficiently transmit heat from the main surface of the susceptor to main surface 13m of group III nitride film 13 of group III nitride composite substrate 1, when a group III nitride layer is grown. Group III nitride composite substrate 1 having support substrate 11 with a thermal conductivity $\lambda_S$ of preferably 280 W·m$^{-1}$·K$^{-1}$ or less, more preferably 210 W·m$^{-1}$·K$^{-1}$ or less, still more preferably 120 W·m$^{-1}$·K$^{-1}$ or less, and particularly preferably 50 W·m$^{-1}$·K$^{-1}$ or less, can uniformly transmit heat from the main surface of the susceptor to the whole main surface of group III nitride film 13 of group III nitride composite substrate 1, when a group III nitride layer is grown. Support substrate 11 having a thermal conductivity $\lambda_S$ of 280 W·m$^{-1}$·K$^{-1}$ or less can more uniformly transmit the heat from the main surface of the susceptor to the whole main surface of group III nitride film 13 of group III nitride composite substrate 1 when a group III nitride layer is grown, as compared with the case where an SiC substrate having a thermal conductivity $\lambda_S$ of about 300 W·m$^{-1}$·K$^{-1}$ is used as the support substrate.

Regarding group III nitride composite substrate 1 in the present reference embodiment, support substrate 11 has a Young's modulus $E_S$ of preferably 150 GPa or more and 500 GPa or less, and more preferably 200 GPa or more and 350 GPa or less. Here, Young's modulus $E_S$ of support substrate 11 can be measured by a resonance method. Group III nitride composite substrate 1 having support substrate 11 with a Young's modulus $E_S$ of preferably 150 GPa or more and more preferably 200 GPa or more can suppress occurrence of warp to group III nitride composite substrate 1 and/or a group III nitride layer, when a group III nitride semiconductor device is formed by growing the group III nitride layer on the composite substrate. Group II nitride composite substrate 1 having support substrate 11 with a Young's modulus $E_S$ of preferably 500 GPa or less and more preferably 350 GPa or less can suppress occurrence of warp and/or cracks to group III nitride composite substrate 1 and/or a group III nitride layer, when a group III nitride semiconductor device is formed by growing the group III nitride layer on the composite substrate.

Support substrate 11 is not particularly limited. In view of the above-described respects, however, support substrate 11 preferably satisfies at least one of: the ratio $\alpha_{III-N}/\alpha_S$ of thermal expansion coefficient $\alpha_{III-N}$ of group III nitride film 13 to thermal expansion coefficient $\alpha_S$ of support substrate 11 is 0.75 or more and 1.25 or less; support substrate 11 has a thermal conductivity $\lambda_S$ of 3 W·m$^{-1}$·K$^{-1}$ or more and 280 W·m$^{-1}$·K$^{-1}$ or less; and support substrate 11 has a Young's modulus $E_S$ of 150 GPa or more and 500 GPa or less. Support substrate 11 is preferably a substrate formed of mullite (3Al$_2$O$_3$·2SiO$_2$-2Al$_2$O$_3$·SiO$_2$), a substrate formed of mullite-YSZ (Yttria Stabilized Zirconia), a substrate formed of spinel (MgAl$_2$O$_4$), a substrate formed of a sintered body of an Al$_2$O$_3$—SiO$_2$-based composite oxide, and substrates formed respectively of sintered bodies of them to which oxide, carbonate or the like is added, a molybdenum (Mo) substrate, a tungsten (W) substrate, or the like. Here, preferred elements to be contained in the oxide and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

Support substrate 11 may include any of single crystal, polycrystal, and amorphous material. It preferably includes polycrystal, since removal of support substrate 11 by grinding and/or etching when a semiconductor device is to be formed is easy and the strength by which warp or cracks of the semiconductor device can be suppressed can be maintained.

<Joint Film>

Referring to FIG. 1, a joint film 12 which may be included in group III nitride composite substrate 1 in the present reference embodiment is not particularly limited as long as the joint film can join support substrate 11 and group III nitride film 13 to each other. Joint film 12, however, is preferably SiO$_2$ film, Si$_3$N$_4$ film, TiO$_2$ film, Ga$_2$O$_3$ film, or the like because these films have a high joining ability for joining support substrate 11 and group III nitride film 13 to each other.

<Group III Nitride Film>

Referring to FIG. 1, group III nitride film 13 in the present reference embodiment is a film formed of a group III nitride, specifically an In$_x$Al$_y$Ga$_{1-x-y}$N film (0≤x, 0≤y, x+y≤1) such as GaN film, AlN film, or the like.

In order to form a group III nitride semiconductor device having excellent characteristics, the thickness of group III nitride film 13 needs to be 50 nm or more, preferably 80 nm or more, more preferably 100 nm or more, and still more preferably 120 nm or more, as described above. Meanwhile, in order to reduce the amount of use of the expensive group III nitride, the thickness of group III nitride film 13 needs to be less than 10 μm, preferably 5 μm or less, more preferably 1 μm or less, and particularly preferably 0.25 μm or less, as described above.

The crystal structure of group III nitride film 13 is preferably the wurtzite structure, since it enables semiconductor devices having excellent characteristics to be produced. The predetermined plane orientation to which main surface 13m of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are 15° or less off (displaced by an angle of 15° or less) from these plane orientations, respectively. It may also be any of the plane orientations opposite to the above-listed plane orientations, as well as plane orientations that are 15° or less off from these plane orientations, respectively. Namely, main surface 13m of group III nitride film 13 may be any of polar plane, nonpolar plane, and semipolar plane. Main surface 13m of group III nitride film 13 is preferably the {0001} plane and the opposite plane thereof, since such planes make it easy to increase the diameter, or any of {10-10} plane, {20-21} plane, and the opposite planes thereof, since such planes suppress blue shift of a light-emitting device to be produced.

In order to enhance the crystal quality of a group III nitride layer to be grown on group III nitride film 13 and enhance the characteristics of semiconductor devices to be formed, impurity metal atoms of main surface 13m of group III nitride film 13 are preferably $1\times10^{13}$ atoms/cm$^2$ or less, more preferably $3\times10^{12}$ atoms/cm$^2$ or less, still more preferably $1\times10^{12}$ atoms/cm$^2$ or less, and particularly preferably $1\times10^{11}$ atoms/cm$^2$ or less.

Group III nitride composite substrate 1 which includes support substrate 11 such as a substrate of mullite ($3Al_2O_3 \cdot 2SiO_2$-$2Al_2O_3 \cdot SiO_2$), mullite-YSZ (Yttria Stabilized Zirconia), spinel ($MgAl_2O_4$), a sintered body of an $Al_2O_3$—$SiO_2$-based composite oxide, or the like is preferably subjected to cleaning that suppresses elution of metal atoms from support substrate 11, such as scrub cleaning with a surfactant and/or pure water, two-fluid cleaning, or megasonic cleaning (cleaning with ultrasonic waves in a megasonic frequency range of 500 kHz to 5 MHz), as well as cleaning of a single side (the single side is main surface 13m of group III nitride film 13) such as sheet-fed cleaning with low-concentration acid and/or alkali, for example, to thereby reduce the concentration of impurity metal atoms of main surface 13m of group III nitride film 13. A protective film can also be formed on the support substrate to suppress elution of metal atoms.

Regarding impurities other than impurity metal atoms of main surface 13m of group III nitride film 13, in order to enhance the crystal quality of a group III nitride layer grown on group III nitride film 13 and enhance the characteristics of a semiconductor device to be formed, the impurities are preferably Cl atoms of $2\times10^{14}$ atoms/cm$^2$ or less, and preferably Si atoms of $9\times10^{13}$ atoms/cm$^2$ or less. The dislocation density of group III nitride film 13 is not particularly limited. In order to reduce leak current of the semiconductor device, the dislocation density is preferably $1\times10^8$ cm$^{-2}$ or less, and more preferably $1\times10^7$ cm$^{-2}$ or less. The carrier concentration of group III nitride film 13 is not particularly limited. In order to reduce the resistance of the semiconductor device, the carrier concentration is preferably $1\times10^{17}$ cm$^{-3}$ or more, and more preferably $1\times10^{18}$ cm$^{-3}$ or more.

Reference Embodiment I-2: Laminated Group III Nitride Composite Substrate

Referring to FIG. 3, a laminated group III nitride composite substrate 2 which is another reference embodiment of Reference Invention I includes group III nitride composite substrate 1 of Reference Embodiment I-1, and at least one group III nitride layer 20 disposed on group III-nitride-film 13-side main surface 13m of group III nitride composite substrate 1.

Laminated group III nitride composite substrate 2 in the present reference embodiment includes group III nitride composite substrate 1 having a small mean value $m_S$ and a small standard deviation $s_S$ of the root mean square roughness of support-substrate 11-side main surface 11n, as well as group III nitride layer 20 having a high crystal quality grown and thereby disposed on composite substrate 1. Therefore, semiconductor devices having excellent characteristics can be fabricated with a high yield.

In laminated group III nitride composite substrate 2 of the present reference embodiment, group III nitride layer 20 disposed on group III-nitride-film 13-side main surface 13m varies depending on the type of the semiconductor device to be produced. Referring to FIG. 4, in the case where the semiconductor device to be produced is an SBD (Schottky Barrier Diode) which is an example of electronic devices, group III nitride layer 20 may include, for example, an n$^+$-GaN layer 28 (having a carrier concentration for example of $2\times10^{18}$ cm$^{-3}$) and an n$^-$-GaN layer 29 (having a carrier concentration for example of $5\times10^{15}$ cm$^{-3}$). Referring to FIG. 5, in the case where the semiconductor device to be produced is an HEMT (High Electron Mobility Transistor) which is another example of electronic devices, group III nitride layer 20 may include, for example, a GaN layer 26 and an $Al_{0.2}Ga_{0.8}N$ layer 27. Referring to FIG. 6, in the case where the semiconductor device to be produced is a light-emitting device, group III nitride layer 20 may include, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25.

Reference Embodiment I-3

Group III Nitride Semiconductor Device

Referring to FIGS. 4 to 6, a group III nitride semiconductor device 4 which is still another reference embodiment of Reference Invention I includes group III nitride film 13 in the group III nitride composite substrate of Reference Embodiment I-1, and at least one group III nitride layer 20 disposed on group III nitride film 13.

Group III nitride semiconductor device 4 of the present reference embodiment includes group III nitride composite substrate 1 having a small mean value $m_S$ and a small standard deviation $s_S$ of the root mean square roughness of support-substrate 11-side main surface 11n, as well as group III nitride layer 20 having a high crystal quality grown and thereby disposed on composite substrate 1. Therefore, semiconductor device 4 has excellent characteristics.

In group III nitride semiconductor device 4, group III nitride layer 20 varies depending on the type of group III nitride semiconductor device 4. Referring to FIG. 4, in the case where semiconductor device 4 is an SBD which is an example of electronic devices, group III nitride layer 20 may include, for example, an n$^+$-GaN layer 28 (having a carrier concentration for example of $2\times10^{18}$ cm$^{-3}$) and an n$^-$-GaN layer 29 (having a carrier concentration for example of $5\times10^{15}$ cm$^{-3}$). Referring to FIG. 5, in the case where semiconductor device 4 is an HEMT which is another example of electronic devices, group III nitride layer 20 may include, for example, a GaN layer 26 and an $Al_{0.2}Ga_{0.8}N$ layer 27. Referring to FIG. 6, in the case where semiconductor device 4 is a light-emitting device, group III nitride layer 20 may include, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25. Other examples of electronic devices may include PND (PN diode), transistor, and the like. Above-described semiconductor device 4 may either be a vertical type or be a lateral type.

Referring to FIGS. 4 to 6, preferably group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group III nitride layer 20 so that group III nitride semiconductor device 4 can be formed.

It should be noted that the group III nitride semiconductor device may have a structure corresponding to group III nitride semiconductor device 4 shown in FIG. 4 or 6 from which group III nitride film 13 has been removed. The group III nitride semiconductor device having its structure with group III nitride film 13 removed therefrom can have further improved device characteristics.

Reference Embodiment I-4: Method for Manufacturing Group III Nitride Composite Substrate Referring to FIGS. 7 to 11, a method for manufacturing a group III nitride composite substrate which is a further reference embodiment of Reference Invention I is a method for manufacturing group III nitride composite substrate 1 of Reference Embodiment I-1, including the steps of: forming group III nitride composite substrate 1 by disposing group III nitride film 13 on one main surface 11m side of support substrate 11; and adjusting the root mean square roughness of support-substrate 11-side main surface 11n by polishing support-substrate 11-side main surface 11n of group III nitride composite substrate 1 before, in, or after the step of forming group III nitride composite substrate 1.

The method for manufacturing group III nitride composite substrate 1 in the present reference embodiment can efficiently manufacture low-cost and large-diameter group III nitride composite substrate 1 having a thick group III nitride film and a small temperature variation on the main surface when a group III nitride layer is grown, to enable group III nitride semiconductor devices to be manufactured with a high yield.

{Step of Forming Group III Nitride Composite Substrate}

The method for manufacturing group III nitride composite substrate 1 of the present reference embodiment includes the step of forming group III nitride composite substrate 1 by disposing group III nitride film 13 on one main surface 11m side of substrate 11. In this step, the method for disposing group III nitride film 13 on one main surface 11m side of substrate 11 is not particularly limited and may include first to third methods in the following.

The first method is a method as shown in FIG. 7 according to which a group III nitride film 13 deposited on a main surface 130n of a base substrate 130 is bonded to a main surface 11m of a support substrate 11, and thereafter base substrate 130 is removed. The second method is a method as shown in FIGS. 8 to 10 according to which a group III nitride film donor substrate 13D is bonded to a main surface 11m of a support substrate 11, and thereafter this group III nitride film donor substrate 13D is separated along a plane located at a predetermined depth from a bonded surface, to thereby form a group III nitride film 13 on main surface 11m of support substrate 11. The third method is a method as shown in FIG. 11 according to which a group III nitride film donor substrate 13D is bonded to a main surface 11m of a support substrate 11, and thereafter the thickness of this group III nitride film donor substrate 13D is adjusted by being reduced through at least one of grinding, polishing, and etching of a main surface 13m of group III nitride film donor substrate 13D which is opposite to a bonded surface thereof, to thereby form a group III nitride film 13 on main surface 11m of support substrate 11.

Regarding the first method, the method for bonding group III nitride film 13 to support substrate 11 may for example be a method (see FIG. 7) according to which a main surface 13n of group III nitride film 13 is bonded to main surface 11m of support substrate 11 with a joint film 12 interposed therebetween. Regarding the second and third methods, the method for bonding group III nitride film donor substrate 13D to support substrate 11 may for example be a method (see FIGS. 8 to 11) according to which a main surface 13n of group III nitride film donor substrate 13D is bonded to main surface 11m of support substrate 11 with a joint film 12 interposed therebetween, for example.

FIGS. 7 to 11 each illustrate the method according to which a joint film 12a is formed on support substrate 11 while a joint film 12b is also formed on group III nitride film 13 or group III nitride film donor substrate 13D, and these joint films are bonded to each other. Alternatively, joint film 12 may be formed on only support substrate 11 and bonded to group III nitride film 13 or group III nitride film donor substrate 13D, or joint film 12 may be formed on only group III nitride film 13 or group III nitride film donor substrate 13D and bonded to support substrate 11, for example.

<First Method>

Referring to FIG. 7, the step of forming group III nitride composite substrate 1 by the first method is not particularly limited. In order to efficiently manufacture the composite substrate, however, the step preferably includes: the sub step of preparing support substrate 11 (FIG. 7 (A1)); the sub step of forming joint film 12a on main surface 11m of support substrate 11 (FIG. 7 (A2)); the sub step of forming group III nitride film 13 on main surface 130n of base substrate 130 (FIG. 7 (B1)); the sub step of forming joint film 12b on main surface 13n of group III nitride film 13 formed on base substrate 130 (FIG. 7 (B2)); the sub step of bonding a main surface 12am of joint film 12a formed on support substrate 11 and a main surface 12bn of joint film 12b formed on group III nitride film 13 formed on base substrate 130 to thereby form a joined substrate 1L (FIG. 7 (C)); and the sub step or removing base substrate 130 from joined substrate 1L (FIG. 7 (D)).

The sub step shown in FIG. 7 (A1) of preparing support substrate 11 is not particularly limited, and may be performed for example by mixing, at a predetermined molar ratio, $MO_x$ (x is an arbitrary positive real number) which is an oxide containing a metal element M, $Al_2O_3$ which is an oxide containing Al, and $SiO_2$ which is an oxide containing Si, sintering the resultant mixture, cutting a substrate of a predetermined size from the resultant sintered body, and then polishing a main surface of this substrate.

The sub step shown in FIG. 7 (A2) of forming joint film 12a on main surface 11m of support substrate 11 is not particularly limited. In order to reduce the cost of forming the film, however, it is suitable to perform sputtering, vapor deposition, CVD (Chemical Vapor deposition), or the like.

The sub step shown in FIG. 7 (B1) of forming group III nitride film 13 on main surface 130n of base substrate 130 is not particularly limited. In order to form group III nitride film 13 having a high crystal quality, however, it may be suitable to form group III nitride film 13 by MOCVD (Metal Organic Chemical Vapor Deposition), sputtering, MBE (Molecular Beam Epitaxy), PLD (Pulsed Laser Deposition), HVPE (Hydride Vapor Phase Epitaxy), sublimation method, flux method, high nitrogen pressure solution method, or the like The sub step shown in FIG. 7 (B2) of forming joint film 12b on main surface 13n of group III nitride film 13 formed on base substrate 130 is performed similarly to the sub step of forming joint film 12a on main surface 11m of support substrate 11.

Regarding the sub step shown in FIG. 7 (C) of bonding a main surface 12am of joint film 12a formed on support substrate 11 and a main surface 12bn of joint film 12b formed on group III nitride film 13 formed on base substrate 130 to thereby form a joined substrate 1L, the method for bonding joint film 12a and joint film 12b to each other is not particularly limited, and suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. As to any of these methods of joining, the films having been joined to each other can be heated to approximately 600° C. to 1200° C. so that the joint strength is further increased. In particular, the surface activated bonding method, the high pressure bonding method, and the high vacuum bonding method exhibit a higher effect of increasing the joint strength through the heating to approximately 600° C. to 1200° C. after the joint films are joined together.

The sub step shown in FIG. 7 (D) of removing base substrate 130 from joined substrate 1L is not particularly limited. In order to efficiently remove base substrate 130, however, it is suitable to perform a method according to which base substrate 130 is dissolved in an etchant such as hydrofluoric acid and thereby removed, a method according to which the exposed main surface side of base substrate 130 is ground or polished and thereby the base substrate is removed. Here, in the case where base substrate 130 is removed by being dissolved in an etchant such as hydrofluoric acid, a protective member 140 for protecting support substrate 11 is preferably formed around support substrate 11.

In this way, group III nitride composite substrate 1 which includes support substrate 11, joint film 12 disposed on main surface 11m of support substrate 11, and group III nitride film 13 disposed on main surface 12m of joint film 12 is obtained.

<Second Method>

Referring to FIGS. 8 to 10, the step of forming group III nitride composite substrate 1 by the second method is not particularly limited. In order to efficiently manufacture the composite substrate, however, it is suitable to use a cutting method shown in FIGS. 8 and 9 or an ion implantation method shown in FIG. 10. In the following, the cutting method and the ion implantation method will be described.

<Cutting Method>

Referring to FIGS. 8 and 9, the step of forming group III nitride composite substrate 1 by the cutting method is not particularly limited. In order to efficiently manufacture the composite substrate, however, the step preferably includes: the sub step of forming joint film 12a on main surface 11m of support substrate 11 (FIG. 8 (A) and FIG. 9 (A)); the sub step of forming joint film 12b on main surface 13n of group III nitride film donor substrate 13D (FIG. 8 (B) and FIG. 9 (B)); the sub step of bonding main surface 12am of joint film 12a formed on support substrate 11 and main surface 12bn of joint film 12b formed on group III nitride film donor substrate 13D to each other to form joined substrate 1L, 1LS (FIG. 8 (C) and FIG. 9 (C)); and the sub step of cutting group III nitride film donor substrate 13D of joined substrate 1L, 1LS along a plane located inwardly at a predetermined depth from main surface 13n which is a bonded surface of group III nitride film donor substrate 13D (FIG. 8 (D) and FIG. 9 (D)).

Here, group III nitride film donor substrate 13D is a donor substrate separated in a later step to thereby provide group III nitride film 13. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method. Further, the cutting method used in the sub step of cutting group III nitride film donor substrate 13D is not particularly limited, and it is suitable to use wire saw, inner circumferential blade, outer circumferential blade, laser processing, electrical discharge processing, water jet, or the like.

In this way, joined substrate 1L, 1LS is separated along a plane located inwardly at a predetermined depth from main surface 13n, which is a bonded surface of group III nitride film donor substrate 13D, and accordingly group III nitride composite substrate 1 including support substrate 11, joint film 12 disposed on main surface 11m of support substrate 11, and group III nitride film 13 disposed on main surface 12m of joint film 12 is obtained.

<Use of Support-Incorporated Group III Nitride Film Donor Substrate>

Referring to FIG. 9 (B) to (D), a support-incorporated group III nitride film donor substrate 5D in which a group III nitride film donor substrate support 15 is bonded to group III nitride film donor substrate 13D can be used to manufacture a group III nitride composite substrate 1 in a similar manner to the above. Support-incorporated group III nitride film donor substrate 5D has group III nitride film donor substrate support 15 which supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 5D, the form in which group III nitride film donor substrate support 15 and group III nitride film donor substrate 13D are bonded to each other is not particularly limited. In order to increase the joint strength of the bonding, however, it is preferable to dispose a joint film 14 therebetween. Group III nitride film donor substrate support 15 is also not particularly limited. In order to increase the support strength and prevent occurrence of crack and warp, however, it is preferable that support 15 is formed of a material having similar physical properties to support substrate 11. While joint film 14 is not particularly limited, it may preferably be any of $SiO_2$ film, $Si_3N_4$ film, $TiO_2$ film, $Ga_2O_3$ film, and the like, since these films provide a good joint to group III nitride film donor substrate support 15 and group III nitride film donor substrate 13D.

<Ion Implantation Method>

Referring to FIG. 10, the step of forming group III nitride composite substrate 1 by the ion implantation method is not particularly limited. In order to efficiently manufacture the composite substrate, however, this step preferably includes: the sub step of forming joint film 12a on main surface 11m of support substrate 11 (FIG. 10 (A)); the sub step of forming an ion implantation region 13i to a plane located inwardly at a predetermined depth from main surface 13n by implanting ions I from main surface 13n side of group III nitride film donor substrate 13D and forming joint film 12b on main surface 13n (FIG. 10 (B)); the sub step of forming joined substrate 1L by bonding main surface 12am of joint film 12a formed on support substrate 11 and main surface 12bn of joint film 12b formed on group III nitride film donor substrate 13D (FIG. 10 (C)); and the sub step of separating group III nitride film donor substrate 13D of joined substrate 1L along ion implantation region 13i (FIG. 10 (D)).

Here, the method for forming group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Ions I implanted in group III nitride film donor substrate 13D are not particularly limited. In order to suppress deterioration of the quality of the film and make the gasification temperature of ions I implanted in ion implantation region 13i lower than the decomposition temperature of group III nitride film 13, ions of low-mass atoms such as hydrogen ions, helium ions, and the like are preferred. The method for separating group III nitride film donor substrate 13D along its ion implantation region 13i is not particularly limited as long as it is a method that gasifies ions I implanted in ion implantation region 13i. For example, the method is carried out by applying heat or ultrasonic waves for example to gasify ions I implanted in ion implantation region 13i formed at the position of a predetermined depth from the main surface which is the bonded surface of group III nitride film donor substrate 13D of joined substrate 1L, to thereby cause sudden volume expansion.

In this way, joined substrate 1L is separated along a plane located inwardly at a predetermined depth from main surface 13n which is the bonded surface of group III nitride film donor substrate 13D, and accordingly group III nitride composite substrate 1 is obtained including support substrate 11, joint film 12 disposed on main surface 11m of support substrate 11, and group III nitride film disposed on main surface 12m of joint film 12. It should be noted that support-incorporated group III nitride film donor substrate 5D as shown in FIG. 9 can also be used for this ion implantation method.

<Third Method>

Referring to FIG. 11, the step of forming group III nitride composite substrate 1 by the third method is not particularly limited. In order to efficiently manufacture the composite substrate, however, this step preferably includes: the sub step of forming joint film 12a on main surface 11m of support substrate 11 (FIG. 11 (A)); the sub step of forming joint film 12b on main surface 13n of group III nitride film donor substrate 13D (FIG. 11 (B)); the sub step of bonding main surface 12am of joint film 12a formed on support substrate 11 and main surface 12bn of joint film 12b formed on group I nitride film donor substrate 13D to each other to thereby form joined substrate 1L (FIG. 11 (C)); and the sub step of performing at least any of grinding, polishing, and etching from main surface 13m opposite to main surface 13n which is the bonded surface of group III nitride film donor substrate 13D of joined substrate 1L (FIG. 11 (D)).

Here, group III nitride film donor substrate 13D is a donor substrate providing group III nitride film 13 in a later step through at least any of grinding, polishing, and etching, other than through separation by the second method. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Further, the method for grinding group III nitride film donor substrate 13D is not particularly limited, and may be grinding with a grinding wheel (surface grinding), shot blast, or the like. The method for polishing group III nitride film donor substrate 13D is not particularly limited, and may be mechanical polishing, CMP (chemical mechanical polishing), or the like. The method for etching group III nitride film donor substrate 13D is not particularly limited, and may be wet etching with a chemical solution, dry etching such as RIE (Reaction Ion Etching), or the like.

{Step of Adjusting Root Mean Square Roughness of Support-Substrate-Side Main Surface of Group III Nitride Composite Substrate}

The method for manufacturing group III nitride composite substrate 1 in the present reference embodiment includes the step of adjusting the root mean square roughness of support-substrate 11-side main surface 11n by polishing support-substrate 11-side main surface 11n of group III nitride composite substrate 1 before, in, or after the step of forming group III nitride composite substrate 1. Through this step, support-substrate 11-side main surface 1 in can have a mean value $m_S$ of the root mean square roughness of 0.3 nm or more and 20 nm or less, and support-substrate 11-side main surface 11n can have a ratio $s_S/m_S$ of standard deviation $s_S$ of the root mean square roughness to mean value $m_S$ of the root mean square roughness of 0.005 or more and 0.4 or less.

Here, mean value $m_S$ of the root mean square roughness of support-substrate 11-side main surface 1 in can be controlled by means of the viscosity of the abrasive, the size of abrasive grains, the material and the surface shape of a surface plate and a polishing pad, and the polishing conditions. In order to make smaller mean value $m_S$ of the root mean square roughness, oil-base abrasives are more preferred relative to water-base abrasives, a higher viscosity of the abrasive is more preferred, a smaller abrasive grain size is more preferred, and a soft surface plate and a soft polishing pad are more preferred. As to the surface shape of the surface plate and the polishing pad, a shape having grooves formed therein for sludge removal is preferred. The grooves for sludge removal refer to grooves having a relatively wide width and a relatively wide pitch that are formed for removing away sludge and/or aggregated abrasive grains on the polishing interface. The polishing conditions are preferably a low pressure and a low circumferential velocity.

In order to control the ratio $s_S/m_S$ of standard deviation $s_S$ of the root mean square roughness to mean value $m_S$ of the root mean square roughness of support-substrate 11-side main surface 11n, a viscosity η (unit: mPa·S) and a flow rate Q (unit: m³/s) of a polishing solution, and an area S (unit: m²) of a surface plate, a polishing pressure P (unit: kPa), and a circumferential velocity V (unit: m/s) are used so that an action coefficient FE (unit: m²/s) defined by a formula: FE=η×Q×V/S×P is in a predetermined range, specifically $4 \times 10^{-17}$ or more and $1 \times 10^{-16}$ or less. As to the surface shape of the surface plate and the polishing pad, a shape having grooves formed for making the abrasive uniform is preferred. The grooves for making the abrasive uniform refer to grooves having a relatively narrow width and a relatively narrow pitch that are formed for uniformly holding the abrasive in a central portion of the substrate.

{Step of Adjusting Root Mean Square Roughness of Group III-Nitride-Film-Side Main Surface of Group III Nitride Composite Substrate}

The method for manufacturing group III nitride composite substrate 1 in the present reference embodiment preferably includes the step of adjusting the root mean square roughness of group III-nitride-film 13-side main surface 13m by polishing group III-nitride-film 13-side main surface 13m of group III nitride composite substrate 1 after the step of forming the group III nitride composite substrate. Through the step of adjusting the root mean square roughness of group III-nitride-film 13-side main surface 13m of group III nitride composite substrate 1, group III-nitride-film 13-side main surface 13m can have a mean value $m_{III-N}$ of the root mean square roughness of 0.4 nm or more and 10 nm or less, and group III-nitride-film 13-side main surface 13m can have a ratio $s_{III-N}/m_{III-N}$ of standard deviation $s_{III-N}$ of the root mean square roughness to mean value $m_{III-N}$ of the root mean square roughness of 0.008 or more and 0.5 or less.

Here, mean value $m_S$ of the root mean square roughness of group III-nitride-film 13-side main surface 13m can be controlled by means of the viscosity of the abrasive, the size of abrasive grains, the material and the surface shape of a surface plate and a polishing pad, and the polishing conditions. In order to make smaller mean value $m_{III-N}$ of the root mean square roughness, a higher viscosity of the abrasive is more preferred, a smaller abrasive grain size is more preferred, and a soft surface plate and a soft polishing pad are more preferred. As to the surface shape of the surface plate and the polishing pad, a shape having grooves formed therein for sludge removal is preferred. The polishing conditions are preferably a low pressure and a low circumferential velocity.

For the ratio $s_{III-N}/m_{III-N}$ of standard deviation $s_{III-N}$ of the root mean square roughness of group III-nitride-film 13-side main surface 13m, to mean value $m_{III-N}$ of the root mean square roughness thereof, it is preferable that action coefficient FE (unit: m²/s) defined by a formula: FE=η×Q×V/S×P, where η (unit: mPa·S) is the viscosity of a polishing solution, Q (unit: m³/s) is the flow rate of the polishing solution, S (unit: m²) is the area of a surface plate, P (unit: kPa) is the polishing pressure of the surface plate, and V (unit: m/s) is the circumferential velocity of the surface plate, falls within a predetermined range, specifically $4 \times 10^{-14}$ m²/s or more and $1 \times 10^{-13}$ m²/s or less. As for the surface shape of the surface plate and the polishing pad, a shape in which grooves are formed for making the polishing agent uniform is preferred.

Reference Embodiment I-5: Method for Manufacturing Group III Nitride Semiconductor Device Referring to FIG. 12, a method for manufacturing a group III nitride semiconductor device, which is a still further reference embodiment of Reference Invention I, includes the steps of: preparing group III nitride composite substrate 1 of Reference Embodiment I-1 (FIG. 12 (A)); and growing at least one group III nitride layer 20 on group III-nitride-film 13-side main surface 13m of group III nitride composite substrate 1 (FIG. 12 (A)). The method for manufacturing a group III nitride semiconductor device in the present reference embodiment can be used to manufacture group III nitride semiconductor devices having excellent characteristics with a high yield, since the group III nitride layer is grown on main surface 13m of group III nitride composite substrate 1 where the temperature distribution on main surface 13m is small when the group III nitride layer is grown.

The method for manufacturing a group III nitride semiconductor device in the present reference embodiment may further include the step of removing support substrate 11 from group III nitride composite substrate 1 (FIG. 12 (C)) after the step of growing group III nitride layer 20 (FIG. 12 (A)). This step enables group III nitride semiconductor devices of a variety of forms to be manufactured.

Further, the method for manufacturing a group III nitride semiconductor device in the present reference embodiment may further include the step of bonding device support substrate 40 onto group III nitride layer 20 (FIG. 12 (B)) after the step of growing the group III nitride layer (FIG. 12 (A)) and before the step of removing the support substrate (FIG. 12 (C)). This step enables group III nitride semiconductor devices having a high mechanical strength and excellent characteristics and supported by device support substrate 40 to be manufactured with a high yield.

The method for manufacturing a group III nitride semiconductor device in the present reference embodiment may specifically be performed through the following steps.

<Step of Preparing Group III Nitride Composite Substrate>

Referring to FIG. 12 (A), the step of preparing group III nitride composite substrate 1 is similar to that in the method for manufacturing group III nitride composite substrate 1 as described above.

<Step of Growing Group III Nitride Layer>

Referring to FIG. 12 (A), in the step of growing at least one group III nitride layer 20 on group III-nitride-film 13-side main surface 13m of group III nitride composite substrate 1, suitable methods for growing group III nitride layer 20 are gas phase methods such as MOCVD, MBE, HVPE, and sublimation method, as well as liquid phase methods such as flux method, in order to epitaxially grow group III nitride layer 20 having a high crystal quality, and a particularly suitable method is MOCVD.

The structure of group III nitride layer 20 varies depending on the type of group III nitride semiconductor device 4. In the case where group III nitride semiconductor device 4 is an SBD (Schottky Barrier Diode), group III nitride layer 20 may be configured by successively growing, for example, an n⁺-GaN layer 28 (having a carrier concentration for example of $2 \times 10^{18}$ cm⁻³) and an n⁻-GaN layer 29 (having a carrier concentration for example of $5 \times 10^{15}$ cm⁻³) on main surface 13m of group III nitride film 13.

In this way, at least one group III nitride layer 20 is grown on group III-nitride-film 13-side main surface 13m of group III nitride composite substrate 1, and accordingly laminated group III nitride composite substrate 2 is obtained.

<Step of Bonding Device Support Substrate>

Referring to FIG. 12 (B), the step of bonding device support substrate 40 onto group III nitride layer 20 is performed by forming a first electrode 30 which is to serve as a Schottky electrode and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through this step, laminated substrate 3 is obtained. As device support substrate 40, Si substrate, Mo substrate, CuW substrate, or the like is used.

<Step of Removing Support Substrate>

Referring to FIG. 12 (C), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed. The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (GaN for example), or the like, since the support substrate 11 of the polycrystalline material is easier to remove.

It should be noted that, regarding manufacturing of a group III nitride semiconductor device using a free-standing group III nitride substrate, a rear surface of the free-standing group III nitride substrate (the rear surface refers to a main surface opposite to a main surface on which a group III nitride layer is formed, and this definition is applied as well hereinafter) is subjected to grinding or the like for the purpose of reducing the thickness of the device. In contrast, regarding manufacturing of a group III nitride semiconductor device using a group III nitride composite substrate, it is easy to remove the support substrate by etching, grinding, or the like for the purpose of reducing the thickness of the device, and therefore, the cost of manufacturing the group III nitride semiconductor device can be reduced.

When support substrate 11 is removed and joint film 12 is further removed, group III nitride film 13 can be removed. Improvement of the crystallinity, reduction of the dislocation density, and adjustment of the carrier concentration of group III nitride layer 20 are easier as compared with those of group III nitride film 13. Group III nitride film 13 can be removed to further improve the device characteristics. For removal of group III nitride film 13, polishing or etching can be used. It is preferable to use dry etching since control of the thickness to be removed is easy.

<Step of Forming Electrode>

Referring to FIG. 12 (D), on group III nitride film 13 which has been exposed after removal of support substrate 11 and joint film 12 from laminated substrate 3, a second electrode 50 is formed and, on device support substrate 40, a device support substrate electrode 46 is formed.

In this way, group III nitride semiconductor devices having excellent characteristics can be manufactured with a high yield.

<Reference Invention II>

Reference Invention II relates to a group III nitride composite substrate, a laminated group III nitride composite substrate, a group III nitride semiconductor device, and a method for manufacturing the same.

[Background Art Regarding Reference Invention II]

Group III nitrides such as GaN have superior semiconductor properties and are therefore used as materials suitable for semiconductor devices.

For example, Japanese Patent Laying-Open No. 2009-126722 discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof, a free-standing GaN substrate having a diameter of 100 mm and a thickness of 400 μm.

Problems to be Solved by Reference Invention II

The free-standing group III nitride substrate disclosed in Japanese Patent Laying-Open No. 2009-126722, however, is very expensive. This is chiefly for the reason that the group III nitride does not form a liquid phase and therefore a liquid-phase growth method which is a low-cost manufacturing method cannot be employed, namely it is inevitable to employ a vapor-phase growth method of a low yield. In addition, the group III nitride is a low-fracture-toughness material which is highly susceptible to fracture. Due to this, it is difficult to increase the diameter of the substrate. Further, if the thickness of the substrate is reduced, the substrate is susceptible to warp. Accordingly, in the step of growing an epitaxial layer on the substrate, the crystal quality may be deteriorated or substrate peeling may occur, which reduces the yield of manufacture of semiconductor devices. It has therefore been difficult to produce a high-value-added semiconductor device.

An object of Reference Invention II is to solve the above problems and provide a group III nitride composite substrate that can be manufactured at a low cost, has a large diameter and a small thickness, and has a group III nitride film with a high crystal quality, a laminated group III nitride composite substrate, and a group III nitride semiconductor device and a method for manufacturing the same.

[Solution to the Problems]

According to an aspect, Reference Invention II is a group III nitride composite substrate with a diameter of 75 mm or more including a support substrate and a group III nitride film having a thickness of 50 nm or more and less than 10 μm that are bonded to each other, the group III nitride composite substrate includes a joint film interposed between the support substrate and the group III nitride film and joining the support substrate and the group III nitride film to each other, and the joint film has a thickness variation of 2% or more and 40% or less.

According to another aspect, Reference Invention II is a group III nitride composite substrate with a diameter of 75 mm or more including a support substrate and a group III nitride film having a thickness of 50 nm or more and less than 10 μm that are bonded to each other, the group III nitride composite substrate includes a joint film interposed between the support substrate and the group III nitride film and joining the support substrate and the group III nitride film to each other, a shear joint strength between the support substrate and the group III nitride film is 4 MPa or more and 40 MPa or less, and a ratio of a joint area between the support substrate and the group III nitride film is 60% or more and 98% or less.

Regarding the group III nitride composite substrates according to these aspects of Reference Invention II, a ratio $\alpha_{III-N}/\alpha_S$ of a thermal expansion coefficient $\alpha_{III-N}$ of the group III nitride film to a thermal expansion coefficient $\alpha_S$ of the support substrate may be 0.75 or more and 1.25 or less, and a ratio $t_{III-N}/t_S$ of a thickness $t_{III-N}$ of the group III nitride film to a thickness $t_S$ of the support substrate may be 0.0002 or more and 0.02 or less.

The support substrate may have a thermal conductivity $\lambda_S$ of 3 $W \cdot m^{-1} \cdot K^{-1}$ or more and 280 $W \cdot m^{-1} \cdot K^{-1}$ or less.

The support substrate may have a Young's modulus $E_S$ of 150 GPa or more and 500 GPa or less.

Further, the diameter of the group III nitride composite substrate may be 125 mm or more and 300 mm or less.

According to still another aspect, Reference Invention II is a laminated group III nitride composite substrate including the group III nitride composite substrate according to the above aspect, and at least one group III nitride layer disposed on the group III-nitride-film-side main surface of the group III nitride composite substrate.

According to a further aspect, Reference Invention II is a group III nitride semiconductor device including the group III nitride film in the group III nitride composite substrate according to the above aspect, and at least one group III nitride layer disposed on the group III nitride film.

According to a still further aspect, Reference Invention II is a method for manufacturing a group III nitride semiconductor device, including the steps of preparing a group III nitride composite substrate; and growing at least one group III nitride layer on a group III nitride film of the group III nitride composite substrate.

The method for manufacturing a group III nitride semiconductor device according to this aspect of Reference Invention II may further include the steps of: bonding a device support substrate onto the group III nitride layer; and removing the support substrate from the group III nitride composite substrate.

[Effects of Reference Invention II]

Reference Invention II can provide a group III nitride composite substrate that can be manufactured at a low cost, has a large diameter and a small thickness, and has a group III nitride film with a high crystal quality, a method for manufacturing the group III nitride composite substrate, a laminated group III nitride composite substrate, as well as a group III nitride semiconductor device and a method for manufacturing the same.

Reference Embodiment II-1: Group III Nitride Composite Substrate

Figure 13:
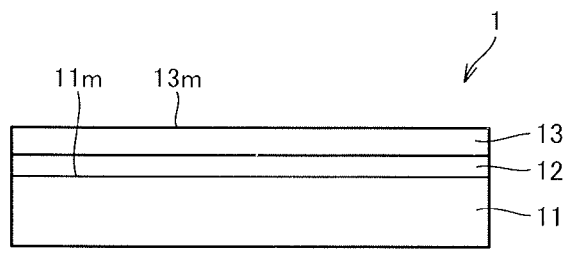
FIG. 13 is a schematic cross-sectional view showing an example of the group III nitride composite substrate according to Reference Invention II.

Referring to FIG. 13, a group III nitride composite substrate 1 which is a reference embodiment of Reference Invention II will be described. Group III nitride composite substrate 1 is a substrate with a diameter of 75 mm or more including a support substrate 11 and a group III nitride film 13 having a thickness of 50 nm or more and less than 10 μm that are bonded to each other. Group III nitride composite substrate 1 includes a joint film 12 interposed between support substrate 11 and group III nitride film 13 and joining support substrate 11 and group III nitride film 13 to each other. The group III nitride composite substrate is characterized in that joint film 12 has a thickness variation of 2% or more and 40% or less.

In contrast to the conventional free-standing group III nitride substrate, the present reference embodiment provides a composite substrate in which group III nitride film 13 is joined to support substrate 11. This feature can be employed to reduce the thickness of the expensive group III nitride film and reduce the cost of the semiconductor device.

Further, joint film 12 is included that has its thickness variation controlled within a specific range as described above. Therefore, in a semiconductor device step of forming an epitaxial layer on group III nitride film 13, heat from a susceptor on which the substrate is mounted is uniformly conveyed in the film. Thus, the epitaxial layer having a good thickness variation and a high crystal quality can be obtained and accordingly the yield of manufacture of semiconductor devices can be increased.

Further, group III nitride composite substrate 1 of the present reference embodiment is characterized in that the shear joint strength between support substrate 11 and group III nitride film 13 joined to each other by joint film 12 is 4 MPa or more and 40 MPa or less, and the ratio of the joint area between support substrate 11 and group III nitride film 13 is 60% or more and 98% or less.

Thus, the joint strength and the ratio of the joint area between support substrate 11 and group III nitride film 13 are controlled so that they fall within specific ranges respectively. Therefore, the stress applied to the joint film is alleviated and occurrence of warp can be suppressed. Accordingly, the yield of manufacture of semiconductor devices can be increased.

Group III nitride composite substrate 1 in the present reference embodiment can have at least one of the above-described feature of the thickness variation of joint film 12; and the above-described feature of the joint strength and the ratio of the joint area between support substrate 11 and group III nitride film 13, to thereby increase the yield of manufacture of semiconductor devices. It is particularly preferable that group III nitride composite substrate 1 has both the above-described features, since respective effects of the features are synergistically produced and thus the effects of the present invention can further be enhanced.

<Diameter of Group III Nitride Composite Substrate>

In order to produce a greater number of semiconductor device chips from one composite substrate, the diameter of group III nitride composite substrate 1 is 75 mm or more, and is preferably 100 mm or more, more preferably 125 mm or more, and still more preferably 150 mm or more. Meanwhile, in order to reduce the warp of the composite substrate and increase the yield of semiconductor devices, the diameter of group III nitride composite substrate 1 is preferably 300 mm or less, and more preferably 200 mm or less.

In the following, each of the parts constituting group III nitride composite substrate 1 in the present reference embodiment will be described.

<Joint Film>

Joint film 12 in the present reference embodiment has a function of absorbing and alleviating unevenness of a joint surface of support substrate 11 and a joint surface of group III nitride film 13 to thereby increase the joint strength between support substrate 11 and group III nitride film 13.

Joint film 12 is not particularly limited as long as joint film 12 can join support substrate 11 and group III nitride film 13 to each other. Joint film 12 is preferably $SiO_2$ film, $Si_3N_4$ film, $TiO_2$ film, $Ga_2O_3$ film, or the like, because these films have a high joining ability for joining support substrate 11 and group III nitride film 13 to each other. While the average thickness of joint film 12 is not particularly limited, the average thickness thereof may for example be approximately 100 nm to 4 μm.

<Thickness Variation of Joint Film>

In the present reference embodiment, the thickness variation of joint film 12 is 2% or more and 40% or less. "Thickness variation" is herein an indicator of the uniformity of the thickness of joint film 12 and calculated in accordance with the following formula, from "maximum value $t_{max}$ of the thickness" and "minimum value $t_{min}$ of the thickness" among the thicknesses measured in the entire main surface of joint film 12.

Formula: thickness variation(%)={$(t_{max}-t_{min})/(t_{max}+t_{min})$}×100

Here, as a reference surface for the thickness of the joint film, main surface 11m of support substrate 11 may be used. The measurement points where the thickness is measured are preferably at least 13 points, and the measurement points adjacent to each other are preferably located at substantially regular intervals.

The thickness of the joint film can be measured with a conventionally known optical-interference film thickness meter, step meter, or the like. The thickness of the joint film can also be measured through observation of a cross section perpendicular to the main surface of joint film 12 with a scanning electron microscope (SEM) or the like.

If the thickness variation is less than 2%, heat conduction from the susceptor on which the substrate is mounted is nonuniform when an epitaxial layer is grown. As a result, the substrate is warped in a concave form and has a large difference between the temperature of a central portion and the temperature of a peripheral portion. In this case, the epitaxial layer with a high quality cannot be grown, the yield of manufacture of semiconductor devices is low, and the characteristics of the semiconductor devices are deteriorated. If the thickness variation is more than 40%, there are a greater number of regions where the joint film is thinner and regions where the joint film is absent (namely non-joined regions). In this case as well, an epitaxial layer with a high quality cannot be grown and the yield of manufacture of semiconductor devices is low. In view of the above, the thickness variation of the joint film in the present reference embodiment is 2% or more and 40% or less. The thickness variation falling within this range produces superior effects that the temperature is distributed uniformly over the whole composite substrate during epitaxial growth and a high-quality epitaxial layer having a high crystal quality can be grown. The thickness variation is more preferably 5% or more and 25% or less, and still more preferably 7% or more and 16% or less. The thickness variation falling within these ranges enables the uniformity of the thickness of the joint film to be further improved and the crystal quality of the epitaxial layer formed on group III nitride film 13 to be further enhanced.

The thickness variation of the joint film can be controlled so that it falls within a desired range, by appropriately adjusting the conditions of chemical mechanical polishing (hereinafter also referred to as "CMP") performed on the surface of the joint film, for example. Examples of the conditions may be the material for the abrasive, the linear velocity of polishing, the material for the polishing pad, and the like.

<Shear Joint Strength>

In the present reference embodiment, the shear joint strength between support substrate 11 and group III nitride film 13 joined together by joint film 12 is 4 MPa or more and 40 MPa or less. In the case where the shear joint strength falls in this range, substrate peeling does not occur and the warp of the substrate is alleviated in a process of manufacturing a semiconductor device. Therefore, the yield of manufacture of semiconductor devices is remarkably increased. The shear joint strength is more preferably 10 MPa or more and 30 MPa or less. This is suitable since such a shear strength tends to further increase the effect of alleviating the warp of the substrate. If the shear joint strength is less than 4 MPa, the joint strength is not sufficient. In this case, substrate peeling occurs during epitaxial growth, because of deformation of the substrate due to heat conduction from the susceptor on which the substrate is mounted, resulting in a lower yield of manufacture of semiconductor devices. If the shear joint strength is more than 40 MPa, a greater stress is applied to joint film 12 and the warp of the substrate tends to be increased, resulting in a lower yield of manufacture of semiconductor devices.

In the present reference embodiment, the shear joint strength can be measured with a die shear tester, tensile tester, or the like, by a method in accordance with JIS K 6850 "Determination of tensile lap-shear strength of rigid-to-rigid bonded assemblies." Specifically, a rectangular composite substrate (6 mm in length×8 mm in width) is prepared as a measurement sample, and the composite substrate is placed flat and secured on a sample stage of a tester so that the support substrate faces downward. After this, a test jig of 9 mm in width is used to apply, to the group III nitride film, a load in the direction parallel to the joint surface between the support substrate and the group III nitride film (namely the shear direction), and a maximum shear load at the time when the joint surface is broken is measured. Then, the maximum shear load is divided by the area of the joint surface ($4.8\times10^{-5}$ m$^2$), to thereby calculate the shear joint strength.

As a method for achieving a shear joint strength of 4 MPa or more and 40 MPa or less between support substrate 11 and group III nitride film 13, a method according to which an annealing treatment is performed before and after support substrate 11 and group III nitride film 13 are joined to each other, for example, can appropriately be used. Namely, a suitable method is as follows. After a joint film is formed on each of one main surface of support substrate 11 and one main surface of group III nitride film 13, each of support substrate 11 and group III nitride film 13 is subjected to an annealing treatment. Annealed support substrate 11 and annealed group III nitride film 13 are joined to each other with the joint film interposed therebetween, and thereafter subjected again to the annealing treatment.

Regarding conditions for the annealing treatment, the annealing treatment is performed preferably in a nitrogen atmosphere at 400° C. or more for one hour or more, more preferably in a nitrogen atmosphere at 600° C. or more for one hour or more, and particularly preferably in a nitrogen atmosphere at 800° C. or more for one hour or more.

In terms of the quality of the joint film, the temperature condition for the annealing treatment is preferably 1200° C. or less, and the time for the treatment is preferably 48 hours or less.

The shear joint strength can also be controlled by means of the surface state (namely the surface roughness) before the joint film is joined.

<Ratio of Joint Area>

Group III nitride composite substrate 1 in the present reference embodiment needs to have a shear joint strength between support substrate 11 and group III nitride film 13 of 4 MPa or more and 40 MPa or less, and a ratio of the joint area between support substrate 11 and group III nitride film 13 of 60% or more and 98% or less as described above. The relation between support substrate 11 and group III nitride film 13 is thus defined in terms of these two respects, and therefore, group III nitride composite substrate 1 in the present reference embodiment enables a warp of the substrate during epitaxial growth to be remarkably reduced and enables a high-flatness and high-quality epitaxial layer to be grown. Accordingly, the composite substrate has superior effects that the frequency of occurrence of substrate peeling is extremely low in the process of manufacturing a semiconductor device and the yield of manufacture of semiconductor devices is high. In the case where the ratio of the joint area is less than 60%, the frequency of occurrence of substrate peeling is high in the process of epitaxial growth and the process of manufacturing a semiconductor device, resulting in a lower yield of manufacture of semiconductor devices. In the case where the ratio of the joint area is higher than 98%, a greater stress is applied to joint film 12 and a warp is likely to occur to the substrate. Therefore, in this case as well, the yield of manufacture of semiconductor devices is lower.

In the present reference embodiment, "ratio of joint area" is a value determined by calculating the sum of areas detected as joint defects (void or peeling) through observation of joint film 12 which is a joint surface between support substrate 11 and group III nitride film 13 with an ultrasonic microscope, dividing the sum by the area of main surface 11m of support substrate 11, and multiplying the quotient by 100. The ratio of the joint area is more preferably 70% or more and 90% or less, and still more preferably 80% or more and 86% or less. In the case where the ratio of the joint area falls in these ranges, the stress applied to joint film 12 is significantly alleviated, and the yield of manufacture of semiconductor devices can further be increased.

As a method for achieving a ratio of the joint area of 60% or more and 98% or less, a method according to which the surface of joint film 12 is cleaned, for example, can be used. Specifically, a method can appropriately be used according to which dirt on the surface of joint film 12 is removed by CMP and thereafter the surface is further subjected to ultrasonic cleaning with water. As a more preferred method, a method can be used according to which dirt on the surface of joint film 12 is removed by CMP and thereafter dirt is further removed by non-abrasive polishing cleaning with a chemical solution such as an aqueous solution of potassium hydroxide (KOH) or water. Both the ultrasonic cleaning and the non-abrasive polishing cleaning, for example, may also be used.

The ratio of the joint area can more precisely be controlled by the thickness variation of joint film 12 defined as 2% or more and 40% or less. Namely, it is particularly preferable that the thickness variation of joint film 12 is 2% or more and 40% or less and the ratio of the joint area is 60% or more and 98% or less.

<Support Substrate>

Support substrate 11 is not particularly limited as long as support substrate 11 can support group III nitride film 13. In order to reduce the amount of use of the expensive group III nitride to thereby lower the cost, however, the support substrate is preferably a hetero-composition substrate whose chemical composition is different from that of the group III nitride. Support substrate 11 may be either transparent or opaque, and one of the transparent one and the opaque one can appropriately be selected depending on a semiconductor device to be used.

As the material forming support substrate 11, a conventionally known ceramic material, semiconductor material, metal material, polycrystalline material, monocrystalline material, or the like can be used. For example, the material for support substrate 11 may be a sintered body material of aluminum nitride (AlN), spinel ($MgAl_2O_4$), mullite ($3Al_2O_3.2SiO_2$-$2Al_2O_3.SiO_2$), alumina ($Al_2O_3$), graphite, or the like, a monocrystalline material such as AlN, sapphire, or the like, a metal material such as molybdenum (Mo), tungsten (W), or the like, or an alloy material such as copper-tungsten (Cu—W), or the like.

Support substrate 11 may be exposed to a high-temperature corrosive gas such as ammonia gas during epitaxial growth for example, and is therefore preferably a substrate resistant to corrosion. Thus, the substrate may be covered with any of various surface protection coatings for improving the corrosion resistance of its surface.

<Thermal Conductivity of Support Substrate>

Support substrate 11 has a thermal conductivity $\lambda_S$ of preferably 3 $W \cdot m^{-1} \cdot K^{-1}$ or more and 280 $W \cdot m^{-1} \cdot K^{-1}$ or less, more preferably 5 $W \cdot m^{-1} \cdot K^{-1}$ or more and 210 $W \cdot m^{-1} \cdot K^{-1}$ or less, and still more preferably 10 $W \cdot m^{-1} \cdot K^{-1}$ or more and 120 $W \cdot m^{-1} \cdot K^{-1}$ or less. Here, thermal conductivity $\lambda_S$ of support substrate 11 can be measured by a laser flash method. Group III nitride composite substrate 1 having support substrate 11 with a thermal conductivity $\lambda_S$ of preferably 3 $W \cdot m^{-1} \cdot K^{-1}$ or more, more preferably 5 $W \cdot m^{-1} \cdot K^{-1}$ or more, and still more preferably 10 $W \cdot m^{-1} \cdot K^{-1}$ or more, can efficiently transmit heat from the main surface of the susceptor to main surface 13m of group III nitride film 13 of group III nitride composite substrate 1, when a group III nitride layer is grown. Group III nitride composite substrate 1 having support substrate 11 with a thermal conductivity $\lambda_S$ of preferably 280 $W \cdot m^{-1} \cdot K^{-1}$ or less, more preferably 210 $W \cdot m^{-1} \cdot K^{-1}$ or less, and still more preferably 120 $W \cdot m^{-1} \cdot K^{-1}$ or less, can uniformly transmit heat from the main surface of the susceptor to the whole main surface of group III nitride film 13 of group III nitride composite substrate 1, when a group III nitride layer is grown. Support substrate 11 having a thermal conductivity $\lambda_S$ of 280 $W \cdot m^{-1} \cdot K^{-1}$ or less can more uniformly transmit the heat from the main surface of the susceptor to the whole main surface of group III nitride film 13 of group III nitride composite substrate 1 when a group III nitride layer is grown, as compared with the case where an SiC substrate having a thermal conductivity $\lambda_S$ of about 300 $W \cdot m^{-1} \cdot K^{-1}$ is used as the support substrate. It should be noted that the thermal conductivity of support substrate 11 may be different from the thermal conductivity of group III nitride film 13.

<Thermal Expansion Coefficient of Support Substrate>

Support substrate 11 is preferably a substrate which is not prone to crack. The thermal expansion coefficient of support substrate 11 is preferably close to the thermal expansion coefficient of group III nitride film 13. Support substrate 11 having such properties is appropriate, since it makes group III nitride composite substrate 1 less prone to crack even when group III nitride composite substrate 1 is heated in the process of epitaxial growth, the process of manufacturing a semiconductor device, or the like.

Specifically, a ratio $\alpha_{III-N}/\alpha_S$ of a thermal expansion coefficient $\alpha_{III-N}$ of group III nitride film 13 to a thermal expansion coefficient $\alpha_S$ of support substrate 11 is preferably 0.75 or more and 1.25 or less, more preferably 0.8 or more and 1.2 or less, still more preferably 0.9 or more and 1.1 or less, and particularly preferably 0.95 or more and 1.05 or less.

<Thickness of Support Substrate 11>

While the thickness itself of support substrate 1 is not particularly limited, it is preferable that the thickness of support substrate 11 and the thickness of group III nitride film 13 satisfy the following relation, in order to suppress warp, crack, or the like of group III nitride film 13 when it is heated. Namely, a ratio $t_{III-N}/t_S$ of a thickness $t_{III-N}$ of group III nitride film 13 to a thickness $t_S$ of support substrate 11 is preferably 0.0002 or more and 0.02 or less. The fact that the ratio $\alpha_{III-N}/\alpha_S$ of the thermal expansion coefficient is 0.75 or more and 1.25 or less and the ratio $t_{III-N}/t_S$ of the thickness is 0.0002 or more and 0.02 or less makes it possible to significantly reduce occurrences of defective pieces due to warp or crack of group III nitride film 13, on various occasions such as a process of manufacturing the composite substrate, a process of epitaxial growth, and a process of manufacturing a semiconductor device. The ratio $t_{III-N}/t_S$ of the thickness is more preferably 0.0005 or more and 0.02 or less.

<Young's Modulus of Support Substrate>

Regarding Young's modulus $E_S$ of support substrate 11, $E_S$ is preferably 150 GPa or more and 500 GPa or less, in order to suppress occurrence of warp when group III nitride composite substrate 1 is heated. If $E_S$ is less than 150 GPa, warp tends to be likely to occur during heating. If $E_S$ is more than 500 GPa, breakage or crack tends to be likely to occur during heating. These $E_s$ are therefore not preferred. $E_S$ is more preferably in a range of 200 GPa or more and 350 GPa or less. The Young's modulus of support substrate 11 may be different from that of group III nitride film 13.

Regarding the material which forms support substrate 11, support substrate 11 may be formed of a material having its thermal expansion coefficient and its Young's modulus that are close to those of group III nitride film 13, such as a substrate formed of mullite ($3Al_2O_3 \cdot 2SiO_2 - 2Al_2O_3 \cdot SiO_2$), a substrate formed of mullite-YSZ (Yttria Stabilized Zirconia), a substrate formed of spinel ($MgAl_2O_4$), a substrate formed of a sintered body of an $Al_2O_3$—$SiO_2$-based composite oxide, and substrates formed respectively of sintered bodies of them to which oxide, nitride, carbonate or the like is added, a molybdenum (Mo) substrate, a tungsten (W) substrate, and the like. Here, preferred elements to be contained in the oxide, the nitride, and the carbonate are Ca, Mg, Sr, Ba, Al, Sc, Y, Ce, Pr, Si, Ti, Zr, V, Nb, Ta, Cr, Mn, Fe, Co, Ni, Cu, Zn, and the like.

<Group III Nitride Film>

Group III nitride film 13 is a film formed of a group III nitride, specifically an $In_xAl_yGa_{1-x-y}N$ film ($0 \leq x$, $0 \leq y$, $x+y \leq 1$) such as GaN film, AlN film, or the like.

The thickness of group III nitride film 13 is 50 nm or more and less than 10 μm. In the case where the thickness is less than 50 nm, group III nitride film 13 has a tendency to crack, which makes it difficult to grow an epitaxial layer of a high quality on the film. The fact that the thickness is less than 10 μm can reduce the amount of use of the expensive group III nitride and enhance the added value of the semiconductor device.

The crystal structure of group III nitride film 13 is preferably the wurtzite structure, since it enables semiconductor devices having excellent characteristics to be produced. The predetermined plane orientation to which main surface 13m of group III nitride film 13 is closest is not limited as long as it is suitable for a desired semiconductor device, and may be any of {0001}, {10-10}, {11-20}, {21-30}, {20-21}, {10-11}, {11-22}, and {22-43}, as well as plane orientations that are displaced by an angle of 15° or less (off by 15° or less) from these plane orientations, respectively. It may also be any of the plane orientations opposite to the above-listed plane orientations, as well as plane orientations that are displaced by an angle of 15° or less (off by 15° or less) from these plane orientations, respectively Namely, main surface 13m of group III nitride film 13 may be any of polar plane, nonpolar plane, and semipolar plane. Main surface 13m of group III nitride film 13 is preferably the {0001} plane and the opposite plane thereof, since such planes make it easy to increase the diameter, or any of {10-10} plane, {20-21} plane, and the opposite planes thereof, since such planes suppress blue shift of a light-emitting device to be produced.

Impurity metal atoms of main surface 13m of group III nitride film 13 are preferably $3 \times 10^{13}$ atoms/cm² or less, more preferably $1 \times 10^{13}$ atoms/cm² or less, and still more preferably $1 \times 10^{12}$ atoms/cm² or less, in order to enhance the crystal quality of a group III nitride layer grown on group III nitride film 13 and enhance the characteristics of a semiconductor device to be formed. Group III nitride composite substrate 1 which includes support substrate 11 such as a substrate of mullite ($3Al_2O_3 \cdot 2SiO_2 - 2Al_2O_3 \cdot SiO_2$), mullite-YSZ (Yttria Stabilized Zirconia), spinel ($MgAl_2O_4$), a sintered body of an $Al_2O_3$—$SiO_2$-based composite oxide, or the like is preferably subjected to cleaning that suppresses elution of metal atoms from support substrate 11, such as scrub cleaning with a surfactant and pure water, two-fluid cleaning, megasonic cleaning, sheet-fed cleaning of a single side with low-concentration acid or alkali, for example, to thereby reduce the concentration of impurity metal atoms of main surface 13m of group III nitride film 13.

Regarding other impurities of main surface 13m of group III nitride film 13, in order to enhance the crystal quality of a group III nitride layer grown on group III nitride film 13 and enhance the characteristics of a semiconductor device to be formed, the impurities are preferably Cl atoms of $2 \times 10^{14}$ atoms/cm² or less, Si atoms of $9 \times 10^{13}$ atoms/cm² or less. The dislocation density of group III nitride film 13 is not particularly limited. In order to reduce leak current of the semiconductor device, the dislocation density is preferably $1 \times 10^8$ cm$^{-2}$ or less. The carrier concentration of group III nitride film 13 is not particularly limited. In order to reduce the resistance of the semiconductor device, the carrier concentration is preferably $1 \times 10^{17}$ cm$^{-3}$ or more.

Reference Embodiment II-2: Laminated Group III Nitride Composite Substrate

Figure 14:
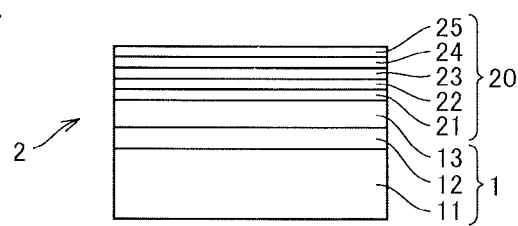
FIG. 14 is a schematic cross-sectional view showing an example of the laminated group III nitride composite substrate according to Reference Invention II.

Referring now to FIG. 14, a laminated group III nitride composite substrate 2 which is still another reference embodiment of Reference Invention II will be described.

Laminated group III nitride composite substrate 2 includes group III nitride composite substrate 1 of Reference Embodiment II-1, and at least one group III nitride layer 20 disposed on group III-nitride-film 13-side main surface 13m of group III nitride composite substrate 1.

Thus, group III nitride layer 20 is disposed on group III-nitride-film 13-side main surface 13m of group III nitride composite substrate 1 and therefore, group III nitride layer 20 can be grown as a high-quality epitaxial layer.

In laminated group III nitride composite substrate 2 of the present reference embodiment, group III nitride layer 20 disposed on group III-nitride-film 13-side main surface 13m varies depending on the type of the semiconductor device to be produced. In the case where the semiconductor device to be produced is a light-emitting device, group III nitride layer 20 may be configured to include, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25. In the case where the semiconductor device to be produced is an HEMT (High Electron Mobility Transistor) which is an example of electronic devices, the group III nitride layer may be configured to include, for example, a GaN layer and an $Al_{0.2}Ga_{0.8}N$ layer. In the case where the semiconductor device to be produced is an SBD (Schottky Barrier Diode) which is another example of electronic devices, the group III nitride layer may be configured to include, for example, an $n^+$-GaN layer (having a carrier concentration for example of $2\times10^{18}$ $cm^{-3}$) and an $n^-$-GaN layer (having a carrier concentration for example of $5\times10^{15}$ $cm^{-3}$).

Reference Embodiment II-3: Group III Nitride Semiconductor Device

Figure 15:
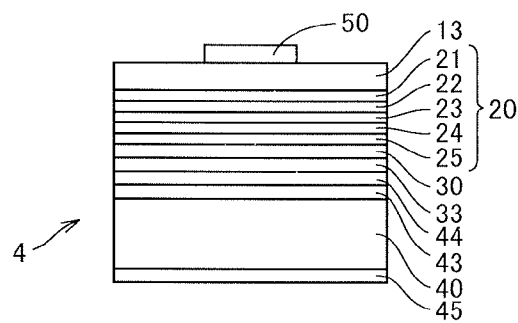
FIG. 15 is a schematic cross-sectional view showing an example of the group III nitride semiconductor device according to Reference Invention II.
Figure 16:
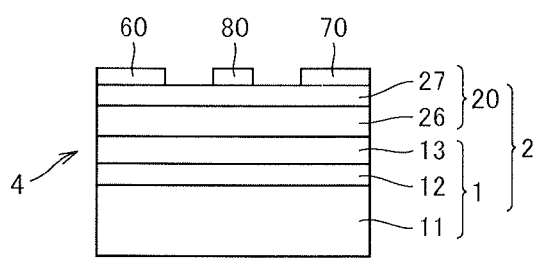
FIG. 16 is a schematic cross-sectional view showing an example of the group III nitride semiconductor device according to Reference Invention II.

Referring now to FIGS. 15 and 16, a group III nitride semiconductor device 4 which is a further reference embodiment of Reference Invention II will be described.

Group III nitride semiconductor device 4 includes group III nitride film 13 in the group III nitride composite substrate of Reference Embodiment II-1, and at least one group III nitride layer 20 disposed on group III nitride film 13.

Thus, group III nitride semiconductor device 4 in the present reference embodiment includes group III nitride composite substrate 1 and group III nitride layer 20 with a remarkably high crystal quality grown and thereby disposed on the composite substrate, and therefore has excellent semiconductor properties.

In group III nitride semiconductor device 4, group III nitride layer 20 varies depending on the type of group III nitride semiconductor device 4. As shown in FIG. 15, in the case where group III nitride semiconductor device 4 is a light-emitting device, group III nitride layer 20 may be configured to include, for example, an n-GaN layer 21, an n-$In_{0.05}Ga_{0.95}N$ layer 22, an active layer 23 having a multiple quantum well structure, a p-$Al_{0.09}Ga_{0.91}N$ layer 24, and a p-GaN layer 25. As shown in FIG. 16, in the case where group III nitride semiconductor device 4 is an HEMT which is an example of electronic devices, group III nitride layer 20 may be configured to include, for example, a GaN layer 26 and an $Al_{0.2}Ga_{0.8}N$ layer 27, and a source electrode 60, a drain electrode 70, a gate electrode 80, and the like can be formed on $Al_{0.2}Ga_{0.8}N$ layer 27. In the case where the semiconductor device is an SBD which is another example of electronic devices, the group III nitride layer may be configured to include, for example, an $n^+$-GaN layer (having a carrier concentration for example of $2\times10^{18}$ $cm^{-3}$) and an $n^-$-GaN layer (having a carrier concentration for example of $5\times10^{15}$ $cm^{-3}$).

As shown in FIGS. 15 and 16, preferably group III nitride semiconductor device 4 further includes at least one of support substrate 11 and a device support substrate 40 for supporting group III nitride layer 20. Here, the shape of device support substrate 40 is not limited to the shape of a flat plate, and may be any as long as it supports group III nitride film 13 and group III nitride layer 20 so that group III nitride semiconductor device 4 can be formed.

Reference Embodiment II-4: Method for Manufacturing Group III Nitride Semiconductor Device Referring now to FIGS. 17 to 21, a method for manufacturing a group III nitride semiconductor device which is a further reference embodiment of Reference Invention II will be described.

The method for manufacturing a group III nitride semiconductor device in the present reference embodiment includes the steps of: preparing group III nitride composite substrate 1; and growing at least one group III nitride layer 20 on group III-nitride-film 13-side main surface 13m of group III nitride composite substrate 1.

<Step of Preparing Group III Nitride Composite Substrate>

Referring first to FIGS. 17 to 20, the step of preparing group III nitride composite substrate 1 will be described.

In the step of preparing group III nitride composite substrate 1, group III nitride composite substrate 1 of Reference Embodiment II-1 is manufactured. The method for manufacturing group III nitride composite substrate 1 is not particularly limited as long as it disposes group III nitride film 13 on main surface 11m side of support substrate 11, and may include first to third methods in the following.

Figure 17:
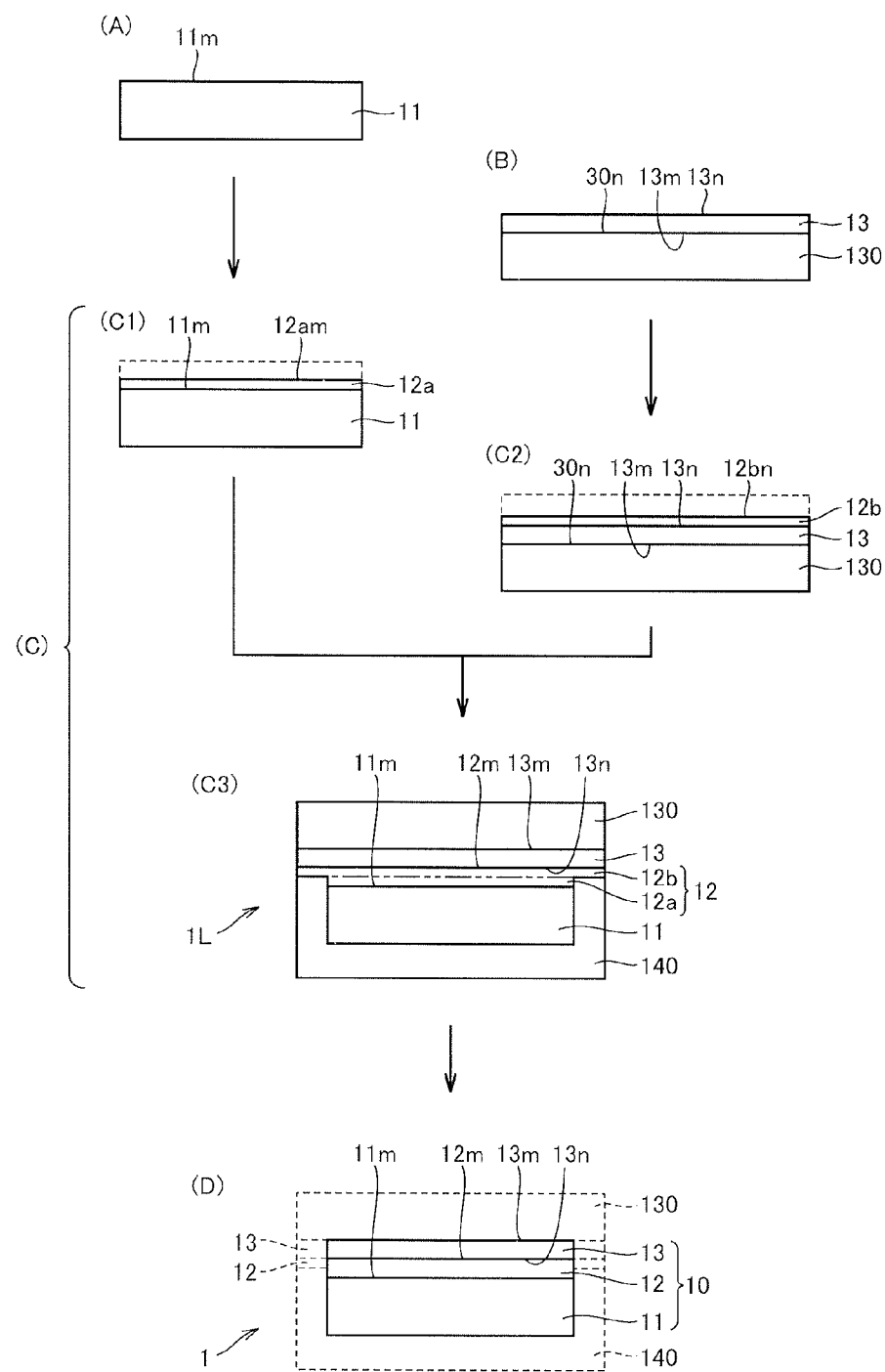
FIG. 17 is a schematic cross-sectional view showing an example of the method for manufacturing a group III nitride composite substrate according to Reference Invention II.
Figure 18:
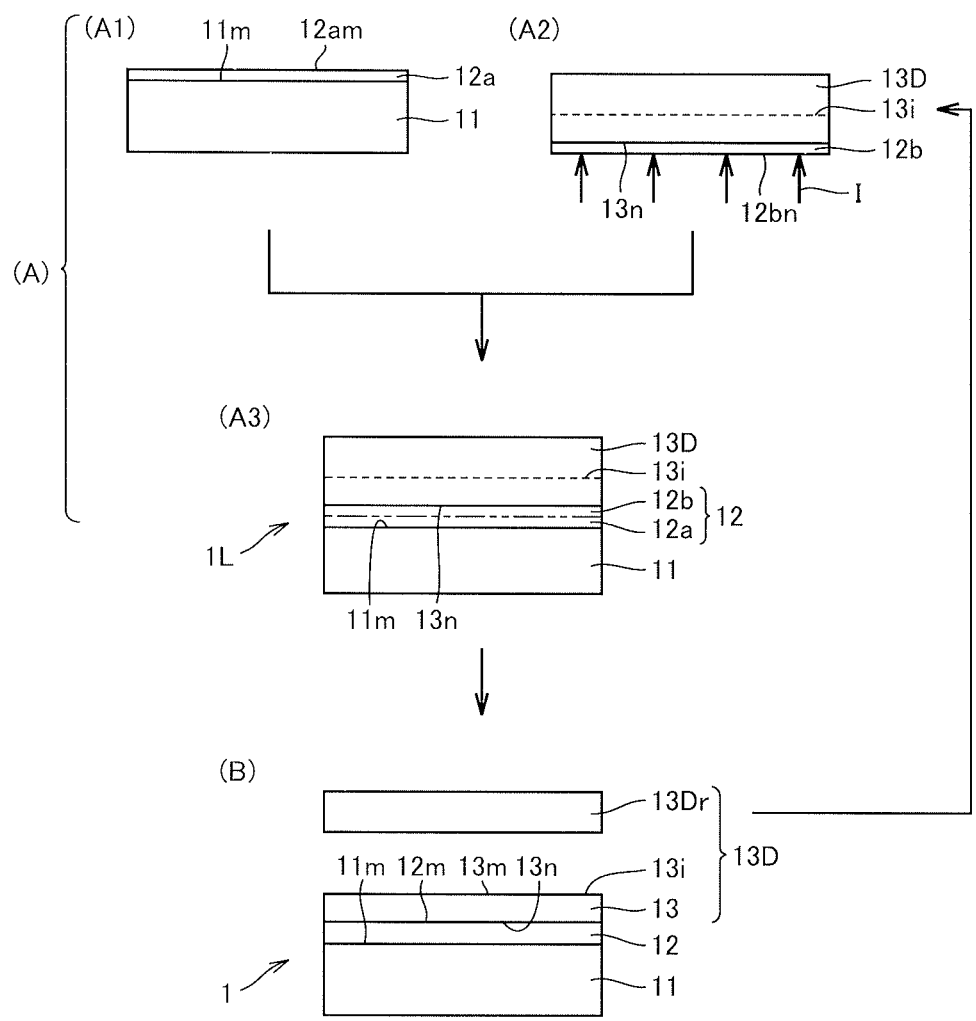
FIG. 18 is a schematic cross-sectional view showing an example of the method for manufacturing a group III nitride composite substrate according to Reference Invention II.
Figure 19:
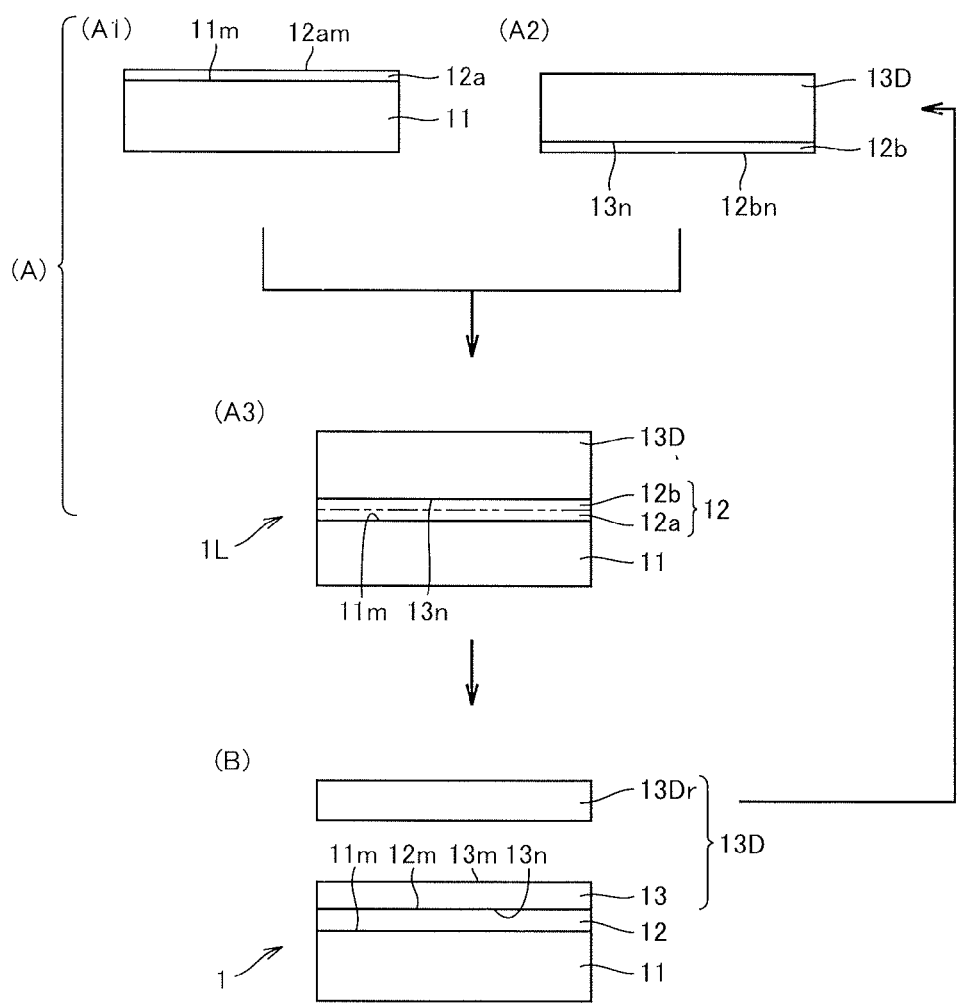
FIG. 19 is a schematic cross-sectional view showing an example of the method for manufacturing a group III nitride composite substrate according to Reference Invention II.
Figure 20:
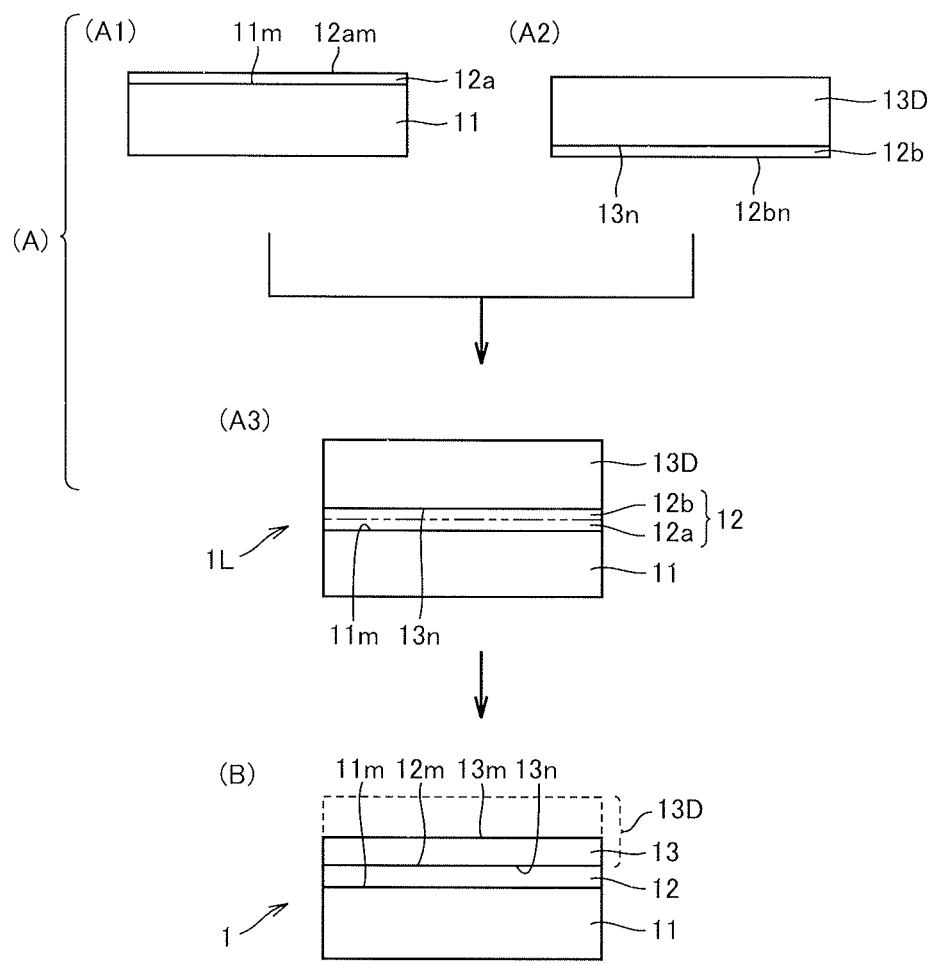
FIG. 20 is a schematic cross-sectional view showing an example of the method for manufacturing a group III nitride composite substrate according to Reference Invention II.

The first method is a method as shown in FIG. 17 according to which a group III nitride film 13 deposited on a main surface 30n of a base substrate 130 is bonded to a main surface 11m of a support substrate 11, and thereafter base substrate 130 is removed. The second method is a method as shown in FIGS. 18 and 19 according to which a group III nitride film donor substrate 13D is bonded to a main surface 11m of a support substrate 11, and thereafter this group III nitride film donor substrate 13D is separated along a plane located at a predetermined depth from a bonded surface, to thereby form a group III nitride film 13 on main surface 11m of support substrate 11. The third method is a method as shown in FIG. 20 according to which a group III nitride film donor substrate 13D is bonded to a main surface 11m of a support substrate 11, and thereafter the thickness of this group III nitride film donor substrate 13D is adjusted by being reduced through at least one of grinding, polishing, and etching of a main surface of group III nitride film donor substrate 13D which is opposite to a bonded surface thereof, to thereby form a group III nitride film 13 on main surface 11m of support substrate 11.

Regarding the first method, the method for bonding group III nitride film 13 to support substrate 11 may for example be a method (see FIG. 17) according to which group III nitride film 13 is bonded to main surface 11m of support substrate 11 with a joint film 12 interposed therebetween. Regarding the second and third methods, the method for bonding group III nitride film donor substrate 13D to support substrate 11 may for example be a method (see FIGS. 18 to 20) according to which group III nitride film donor substrate 13D is bonded to main surface 11m of support substrate 11 with a joint film 12 interposed therebetween, for example.

FIG. 17 illustrates the method according to which a joint film 12a is formed on support substrate 11 while a joint film 12b is also formed on group III nitride film 13, and these joint films are bonded to each other. Alternatively, joint film 12 may be formed on only support substrate 11 and bonded to group III nitride film 13.

<First Method>

As shown in FIG. 17, the method for manufacturing a composite substrate by the first method is not particularly limited. In order to efficiently manufacture the composite substrate, however, it is preferable that the method includes: the step of preparing support substrate 11 (FIG. 17 (A)); the step of forming group III nitride film 13 on main surface 130n of base substrate 130 (FIG. 17 (B)); the step of bonding support substrate 11 and group III nitride film 13 to each other to thereby form a joined substrate 1L (FIG. 17 (C)); and the step or removing base substrate 130 from joined substrate 1L (FIG. 17 (D)).

The step shown in FIG. 17 (A) of preparing support substrate 11 is not particularly limited, and may be performed for example by mixing, at a predetermined molar ratio, $MO_x$ (x is an arbitrary positive real number) which is an oxide containing a metal element M, $Al_2O_3$ which is an oxide containing Al, and $SiO_2$ which is an oxide containing Si, sintering the resultant mixture, cutting a substrate of a predetermined size from the resultant sintered body, and then polishing a main surface of this substrate.

It may be suitable to perform the step shown in FIG. 17 (B) of forming group III nitride film 13 on main surface 130n of base substrate 130 by MOCVD (Metal Organic Chemical Vapor Deposition), sputtering, MBE (Molecular Beam Epitaxy), PLD (Pulsed Laser Deposition), HYPE (Hydride Vapor Phase Epitaxy), sublimation method, flux method, high nitrogen pressure solution method, or the like.

As shown in FIG. 17 (C), the step of bonding support substrate 11 and group III nitride film 13 to each other to thereby form a joined substrate 1L includes the sub step of forming joint film 12a on main surface 11m of support substrate 11 (FIG. 17 (C1)); the sub step of forming joint film 12b on main surface 13n of group III nitride film 13 which is formed on main surface 130n of base substrate 130 (FIG. 17 (C2)); and the sub step of bonding joint film 12a formed on main surface 11m of support substrate 11 and joint film 12b formed on main surface 13n of group III nitride film 13 which is formed on main surface 130n of base substrate 130 to each other (FIG. 17 (C3)). These sub steps are performed to join and thereby integrate joint film 12a and joint film 12b bonded to each other into joint film 12, and support substrate 11 and group III nitride film 13 formed on base substrate 130 are joined to each other with joint film 12 interposed therebetween to thereby form joined substrate 1L.

Here, the method for forming joint films 12a, 12b is not particularly limited. In order to reduce the cost of forming the films, however, suitable methods to be performed are sputtering, vapor deposition, CVD (Chemical Vapor Deposition), and the like. Further, the method for bonding joint film 12a and joint film 12b to each other is not particularly limited, and suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together; a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The step shown in FIG. 17 (D) of removing base substrate 130 from joined substrate 1L is not particularly limited. In order to efficiently remove base substrate 130, however, it is suitable to perform a method according to which base substrate 130 is dissolved in an etchant such as hydrofluoric acid and thereby removed, a method according to which the exposed main surface side of base substrate 130 is ground or polished and thereby the base substrate is removed. Here, in the case where base substrate 130 is removed by being dissolved in an etchant such as hydrofluoric acid, a protective member 140 for protecting support substrate 11 is preferably formed around support substrate 11.

In this way, group III nitride composite substrate 1 which includes support substrate 11, joint film 12 disposed on main surface 11m of support substrate 11, and group III nitride film 13 disposed on a main surface of joint film 12 is obtained.

<Second Method>

The method for manufacturing a composite substrate by the second method shown in FIGS. 18 and 19 is not particularly limited. In order to efficiently manufacture the composite substrate, however, it is preferable that the method includes: the step of bonding support substrate 11 and group III nitride film donor substrate 13D to each other to thereby form joined substrate 1L (FIG. 18 (A) and FIG. 19 (A)); and the step of separating group III nitride film donor substrate 13D of joined substrate 1L along a plane located inwardly at a predetermined depth from main surface 13n which is a bonded surface of group III nitride film donor substrate 13D (FIG. 18 (B) and FIG. 19 (B)). The method for separating group III nitride film donor substrate 13D of joined substrate 1L along a plane located inwardly at a predetermined depth from main surface 13n which is a bonded surface of group III nitride film donor substrate 13D is not particularly limited. For the sake of efficient separation, however, the ion implantation method as shown in FIG. 18, the cutting method as shown in FIG. 19, and the like are preferred.

<Ion Implantation Method>

The ion implantation method shown in FIG. 18 will be described in the following. As shown in FIG. 18 (A), the step of bonding support substrate 11 and group III nitride film donor substrate 13D to each other to thereby form joined substrate 1L includes: the sub step of forming joint film 12a on main surface 11m of support substrate 11 (FIG. 18 (A1)); the sub step of forming an ion implantation region 13i to a plane located inwardly at a predetermined depth from main surface 13n by implanting ions I from main surface 13n side of group III nitride film donor substrate 13D and forming joint film 12b on main surface 13n (FIG. 18 (A2)); and the sub step of bonding joint film 12a formed on main surface 11m of support substrate 11 and joint film 12b formed on main surface 13n of group III nitride film donor substrate 13D (FIG. 18 (A3)). Through these sub steps, joint film 12a and joint film 12b bonded to each other are joined and thereby integrated to form joint film 12, and support substrate 11 and group III nitride film donor substrate 13D are joined to each other with joint film 12 interposed therebetween to thereby form joined substrate 1L. Ions I implanted in group III nitride film donor substrate 13D of group III nitride composite substrate 1 of joined substrate 1L are gasified in a later step to cause sudden volume expansion and accordingly separate group III nitride film donor substrate 13D along ion implantation region 13i.

Group III nitride film donor substrate 13D is a donor substrate separated in a later step to thereby provide group III nitride film 13. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

Ions I implanted in group III nitride film donor substrate 13D are not particularly limited. In order to suppress deterioration of the quality of group III nitride film 13 and make the gasification temperature of ions I implanted in ion implantation region 13i lower than the decomposition temperature of group III nitride film 13, ions of low-mass atoms such as hydrogen ions, helium ions, and the like are preferred.

The method for separating group III nitride film donor substrate 13D of joined substrate 1L along a plane located inwardly at a predetermined depth from main surface 13n which is a bonded surface of group III nitride film donor substrate 13D is not particularly limited as long as it is a method that gasifies ions I implanted in group III nitride film donor substrate 13D. For example, the method is carried out by applying heat or ultrasonic waves for example to gasify ions I implanted in ion implantation region 13i formed at the position of a predetermined depth from the main surface which is the bonded surface of group III nitride film donor substrate 13D of joined substrate 1L, to thereby cause sudden volume expansion.

Accordingly, joined substrate 1L is separated along a plane located inwardly at a predetermined depth from main surface 13n which is a bonded surface of group III nitride film donor substrate 13D to thereby provide group III nitride composite substrate 1 including support substrate 11, joint film 12 disposed on main surface 11m of support substrate 11, and group III nitride film 13 disposed on the main surface of joint film 12.

<Cutting Method>

The cutting method shown in FIG. 19 will be described in the following. The step of bonding support substrate 11 and group III nitride film donor substrate 13D to each other to thereby form joined substrate 1L includes: the sub step of forming joint film 12a on main surface 11m of support substrate 11 (FIG. 19 (A1)); the sub step of forming joint film 12b on main surface 13n of group III nitride film donor substrate 13D (FIG. 19 (A2)); and the sub step of bonding joint film 12a formed on main surface 11m of support substrate 11 and joint film 12b formed on main surface 13n of group III nitride film donor substrate 13D to each other (FIG. 19 (A3)). Through these sub steps, joint film 12a and joint film 12b bonded to each other are joined and thereby integrated to form joint film 12, and support substrate 11 and group III nitride film donor substrate 13D are joined to each other with joint film 12 interposed therebetween to thereby form joined substrate 1L.

The step of separating group III nitride film donor substrate 13D of joined substrate 1L along a plane located inwardly at a predetermined depth from main surface 13n which is a bonded surface of group III nitride film donor substrate 13D is performed by cutting group III nitride film donor substrate 13D along a plane located inwardly at a predetermined depth from main surface 13n which is a bonded surface of group III nitride film donor substrate 13D. The method for cutting the group III nitride film donor substrate is not particularly limited, and it is suitable to use wire saw, inner circumferential blade, outer circumferential blade, or the like.

In this way, joined substrate 1L is separated along a plane located inwardly at a predetermined depth from main surface 13n which is a bonded surface of group III nitride film donor substrate 13D, and accordingly group III nitride composite substrate 1 including support substrate 11, joint film 12 disposed on main surface 11m of support substrate 11, and group III nitride film 13 disposed on the main surface of joint film 12 is obtained.

<Third Method>

As shown in FIG. 20, although the method for manufacturing a composite substrate by the third method is not particularly limited, in order to efficiently manufacture the composite substrate, it is preferable that the method includes the step of bonding support substrate 11 and group III nitride film donor substrate 13D to each other to thereby form joined substrate 1L (FIG. 20 (A)), and the step of performing at least one of grinding, polishing, and etching on main surface 13m opposite to main surface 13n which is a bonded surface of group III nitride film donor substrate 13D of joined substrate 1L (FIG. 20 (B)).

As shown in FIG. 20 (A), the step of bonding support substrate 11 and group III nitride film donor substrate 13D to each other to thereby form joined substrate 1L includes: the sub step of forming joint film 12a on main surface 11m of support substrate 11 (FIG. 20 (A1)); the sub step of forming joint film 12b on main surface 13n of group III nitride film donor substrate 13D (FIG. 20 (A2)); and the sub step of bonding joint film 12a formed on main surface 11m of support substrate 11 and joint film 12b formed on main surface 13n of group III nitride film donor substrate 13D (FIG. 20 (A3)). Through these sub steps, joint film 12a and joint film 12b bonded to each other are joined and thereby integrated to form joint film 12, and support substrate 11 and group III nitride film donor substrate 13D are joined to each other with joint film 12 interposed therebetween to thereby form joined substrate 1L.

Group III nitride film donor substrate 13D is a donor substrate providing group III nitride film 13 by being separated in a later step, like the above-described second method. The method for forming such a group III nitride film donor substrate 13D is similar to the method for forming group III nitride film 13 in the method for manufacturing a composite substrate by means of the first method. Further, the method for forming joint films 12a, 12b is similar to the method for forming joint films 12a, 12b in the method for manufacturing a composite substrate by means of the first method. Further, the method for bonding support substrate 11 and group III nitride film donor substrate 13D to each other is similar to the method for bonding support substrate 11 and group III nitride film 13 to each other in the method for manufacturing a composite substrate by means of the first method.

As shown in FIG. 20 (B), through the step of performing at least one of grinding, polishing, and etching on main surface 13m opposite to main surface 13n which is a bonded surface of group III nitride film donor substrate 13D of joined substrate 1L, the thickness of group III nitride film donor substrate 13D is reduced to form group III nitride film 13 having a desired thickness. Thus, group III nitride composite substrate 1 including support substrate 11, joint film 12 disposed on main surface 11m of support substrate 11, and group III nitride film 13 disposed on the main surface of joint film 12 is obtained.

Here, the method for grinding group III nitride film donor substrate 13D is not particularly limited, and may be grinding with a grinding wheel (surface grinding), shot blast, or the like. The method for polishing group III nitride film donor substrate 13D is not particularly limited, and may be mechanical polishing, chemical mechanical polishing, or the like. The method for etching group III nitride film donor substrate 13D is not particularly limited, and may be wet etching with a chemical solution, dry etching such as RIE (Reaction Ion Etching), or the like.

In this way, group III nitride composite substrate 1 can be manufactured. Group III nitride composite substrate 1 manufactured in the above-described way has superior effects that an epitaxial layer of a good quality can be grown on the group III nitride composite substrate and the yield of manufacture of semiconductor devices is improved.

<Step of Manufacturing Group III Nitride Semiconductor Device>

The step of manufacturing a group III nitride semiconductor device will now be described.

Figure 21:
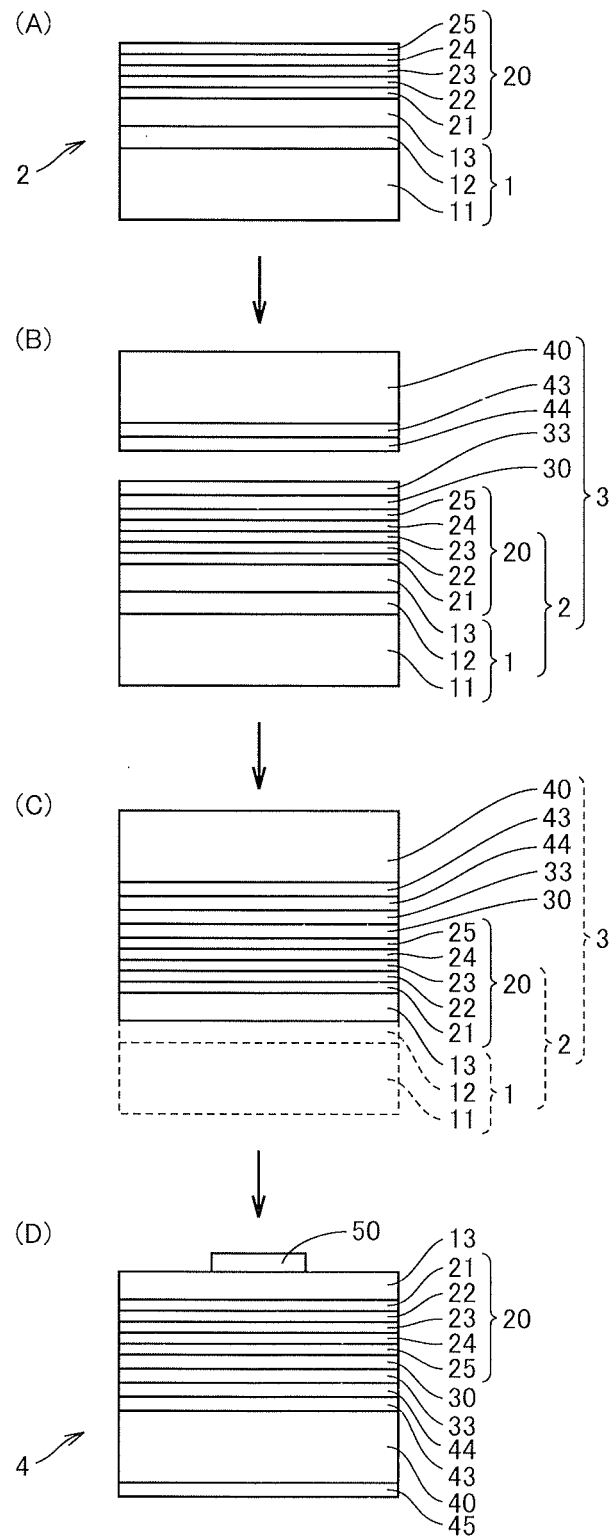
FIG. 21 is a schematic cross-sectional view showing an example of the method for manufacturing a group III nitride semiconductor device according to Reference Invention II.

The method for manufacturing a group III nitride semiconductor device in the present reference embodiment includes the step of preparing above-described group III nitride composite substrate 1 and, as shown in FIG. 21, includes the step of growing at least one group III nitride layer 20 on group III-nitride-film 13-side main surface 13m of group III nitride composite substrate 1 (FIG. 21 (A)). The method for manufacturing a group III nitride semiconductor device in the present reference embodiment grows a group III nitride layer on main surface 13m of group III nitride composite substrate 1 when growing the group III nitride layer, and therefore, group III nitride semiconductor devices having excellent characteristics can be manufactured with a high yield.

The method for manufacturing a group III nitride semiconductor device in the present reference embodiment may further include the steps of: further bonding a device support substrate 40 onto group III nitride layer 20 (FIG. 21 (B)); and removing support substrate 11 from group III nitride composite substrate 1 (FIG. 21 (C)). These steps can be added to manufacture, with a high yield, group III nitride semiconductor devices supported by device support substrate 40 and having a high mechanical strength and excellent characteristics.

The method for manufacturing a group III nitride semiconductor device in the present reference embodiment may specifically be performed through the following steps.

<Step of Growing Group III Nitride Layer>

In the step of growing at least one group III nitride layer 20 on group III-nitride-film 13-side main surface 13m of group III nitride composite substrate 1 shown in FIG. 21 (A), suitable methods for growing group III nitride layer 20 are gas phase methods such as MOCVD, MBE, HVPE, and sublimation method, as well as liquid phase methods such as flux method, in order to epitaxially grow group III nitride layer 20 having a high crystal quality, and a particularly suitable method is MOCVD.

The structure of group III nitride layer 20 varies depending on the type of group III nitride semiconductor device 4. In the case where group III nitride semiconductor device 4 is a light-emitting device, group III nitride layer 20 may be configured by successively growing, on group III nitride film 13, for example, an n-GaN layer 21, an n-In$_{0.05}$Ga$_{0.95}$N layer 22, an active layer 23 having a multiple quantum well structure, a p-Al$_{0.09}$Ga$_{0.91}$N layer 24, and a p-GaN layer 25.

In this way, at least one group III nitride layer 20 is grown on group III nitride film 13 of group III nitride composite substrate 1, and accordingly laminated group III nitride composite substrate 2 is obtained.

<Step of Bonding Device Support Substrate>

The step of further bonding device support substrate 40 onto group III nitride layer 20 shown in FIG. 21 (B) is performed by forming a first electrode 30 and a pad electrode 33 on group III nitride layer 20 of laminated group III nitride composite substrate 2, forming a pad electrode 43 and a joint metal film 44 on device support substrate 40, and bonding joint metal film 44 to pad electrode 33. Through these steps, laminated substrate 3 is obtained. As device support substrate 40, Si substrate, CuW substrate, or the like is used.

<Step of Removing Support Substrate>

The step of removing support substrate 11 from group III nitride composite substrate 1 shown in FIG. 21 (C) is performed by removing support substrate 11 of group III nitride composite substrate 1 from laminated substrate 3. Accordingly, joint film 12 interposed between support substrate 11 and group III nitride film 13 can also be removed at the same time.

The method for removing support substrate 11 and joint film 12 is not particularly limited, and suitable methods to be used are grinding, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (such as GaN), or the like, since the support substrate 11 of the polycrystalline material is easier to remove.

<Step of Forming Electrode>

As shown in FIG. 21 (D), on group III nitride film 13 which has been exposed after removal of support substrate 11 and joint film 12 from laminated substrate 3, a second electrode 50 is formed and, on device support substrate 40, a device support substrate electrode 45 is formed.

In this way, group III nitride semiconductor devices having remarkably excellent characteristics can be manufactured with a high yield.

EXAMPLES

Example A

1. Fabrication of Group III Nitride Composite Substrate

Referring to FIG. 8 (A), a mullite substrate (60 mol % Al$_2$O$_3$ and 40 mol % SiO$_2$ with respect to the whole substrate) having a diameter of 75 mm and a thickness of 400 μm was prepared for use as support substrate 11. Support substrate 11 had a thermal conductivity of 3 W·m$^{-1}$·K$^{-1}$ and a Young's modulus of 200 GPa. Main surfaces 11m, 11n of the two opposite sides respectively of support substrate 11 were subjected to rough polishing with a copper-based surface plate, pre-finish polishing with a tin surface plate, and finish polishing with a nonwoven polishing pad, for which a diamond slurry was used as an abrasive.

Next, on finish-polished main surface 11m of support substrate 11, an SiO$_2$ film of 800 nm in thickness was grown by the PE-CVD (Plasma Enhanced-Chemical Vapor Deposition) method, annealed in a nitrogen atmosphere at 800° C. for an hour, and thereafter subjected to CMP (Chemical Mechanical Polishing) using a slurry with a pH of 10 containing colloidal silica abrasive grains having an average grain size of 40 nm, to thereby form joint film 12a of 400 nm in thickness having its main surface 12am mirror-finished so that the root mean square roughness was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed.

Referring also to FIG. 8 (B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was planarized to have a root mean square roughness of 2 nm or less. After this, an SiO$_2$ film of 800 nm in thickness was grown on this substrate by the PE-CVD method, annealed in a nitrogen atmosphere at 800° C. for an hour, and thereafter subjected to CMP using a slurry with a pH of 10 containing colloidal silica abrasive grains having an average grain size of 40 nm, to thereby form joint film 12b of 500 nm in thickness having its main surface mirror-finished so that the root mean square roughness was 0.3 nm or less. Subsequently, in order to remove the colloidal silica abrasive grains used for the CMP, non-abrasive polishing cleaning with a KOH aqueous solution, polishing cleaning with pure water, and megasonic cleaning with ultrasonic waves in a megasonic frequency range and with pure water were performed. Here, group III nitride film donor substrate 13D was produced through growth by the HVPE method using a GaAs substrate as a base substrate. Group III nitride film donor substrate 13D had its electrical conductivity of n-type, its dislocation density of $1 \times 10^8$ cm$^{-2}$, and its carrier concentration of $1 \times 10^{17}$.

Referring next to FIG. 8 (C), main surface 12am of joint film 12a and main surface 12bn of joint film 12b were bonded together to thereby produce joined substrate 1L in which support substrate 11 and group III nitride film 13 were bonded to each other with joint film 12 interposed therebetween. After they were bonded together, joined substrate 1L, was annealed by being heated in a nitrogen gas atmosphere to 800° C., to thereby increase the joint strength.

Referring next to FIG. 8 (D), group III nitride film donor substrate 13D in joined substrate 1L was cut, with a wire saw, along a plane located inwardly at a depth of 40 μm from the bonded surface where group III nitride film donor substrate 13D was bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire with a diameter of 120 μm on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group III nitride composite substrate 1 was subjected to mechanical polishing and CMP. Rough polishing with a copper-based surface plate and pre-finish polishing with a tin surface plate were performed, using a diamond slurry as an abrasive. Further, finish polishing was performed with a colloidal silica slurry of pH11 (a slurry with a pH of 11 containing colloidal silica abrasive brains having an average grain size of 80 μm) and a nonwoven polishing pad. In order to have a uniform thickness of the group III nitride film, the composite substrate was mounted on a CMP apparatus in the following way. The shape of the substrate was corrected in advance by vacuum chuck suction, and thereafter the composite substrate was suction-fixed onto the apparatus. The pre-finish polishing was performed under the condition that action coefficient FE was $4 \times 10^{-17}$ m$^2$/s to $1 \times 10^{-16}$ m$^2$/s, and the finish polishing was performed under the condition that action coefficient FE was $4 \times 10^{-14}$ m$^2$/s to $1 \times 10^{-13}$ m$^2$/s. After the finish polishing, group III nitride film 13 had a thickness of 0.3 μm.

For group III nitride composite substrate 1 after this finish polishing, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle are summarized in Table 1.

Here, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle were calculated respectively from the thickness of group III nitride film 13 and the absolute value of the off angle between main surface 13m of group III nitride film 13 and a plane of a predetermined plane orientation, at the 13 measurement points P on group III-nitride-film 13-side main surface 13m shown in FIG. 2, constituted of: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

2. Fabrication of Group III Nitride Semiconductor Device

Referring to FIG. 12, an SBD (Schottky Barrier Diode) was fabricated as a group III nitride semiconductor device.

Referring first to FIG. 12 (A), on group III-nitride-film 13-side main surface 13m of group III nitride composite substrate 1, the MOCVD method was used to epitaxially grow n$^+$-GaN layer 28 (having a carrier concentration of $2 \times 10^{18}$ cm$^{-13}$) with a thickness of 2 μm and n$^-$-GaN layer 29 (having a carrier concentration of $5 \times 10^{15}$ cm$^{13}$) with a thickness of 7 μm in this order to form group III nitride layer 20, and accordingly laminated group III nitride composite substrate 2 was obtained.

Referring next to FIG. 12 (B), on n$^-$-GaN layer 29 which was the topmost layer of group III nitride layer 20 of laminated group III nitride composite substrate 2, an Ni layer having a thickness of 4 nm and an Au layer having a thickness of 200 nm were successively formed by the EB (electron beam) deposition method, and annealed into an alloy, to thereby form first electrode 30 serving as a Schottky electrode. The diameter of first electrode 30 was set to 200 µm. On first electrode 30, a Ti layer having a thickness of 200 nm, a Pt layer having a thickness of 100 nm, and an Au layer having a thickness of 1000 nm were successively formed by the EB deposition method to thereby form a pad electrode 33.

As device support substrate 40, an Mo substrate was prepared. On one main surface of device support substrate 40, an AuSn solder film was formed as a joint metal film 44. On the other main surface of device support substrate 40, the EB deposition method was performed to successively form a Ti layer having a thickness of 200 nm, a Pt layer having a thickness of 100 nm, and an Au layer having a thickness of 1000 nm, and thereby form a device support substrate electrode 46.

Next, joint metal film 44 was bonded to pad electrode 33 to thereby produce laminated substrate 3.

Referring next to FIG. 12 (C), from laminated substrate 3, support substrate 11 and joint film 12 were etched away. For the etching, hydrofluoric acid was used.

Referring next to FIG. 12 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50 which was an ohmic electrode. In this way, group III nitride semiconductor device 4 which was an SBD was obtained.

The yield of the obtained SBDs as group III nitride semiconductor devices 4 was calculated in the following way. Specifically, for SBDs, current-voltage characteristics in the reverse direction were measured. The SBDs were classified into non-defective devices meeting a standard that the breakdown voltage was 250 V or more and defective devices failing to meet this standard, and the percentage of the ratio determined by dividing the non-defective devices by the sum of the non-defective devices and the defective devices was defined as a yield. The yield of the group III nitride semiconductor devices is summarized in Table 1.

and a group III nitride film with a thickness of 0.3 µm (this value is 50 nm or more and less than 10 µm), and having a ratio $s_t/m_t$ of standard deviation $s_t$ of the thickness of the group III nitride film, to mean value $m_t$ of the thickness thereof of 0.01 or more and 0.5 or less, and a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.005 or more and 0.6 or less.

Example B

Referring to FIGS. 8, 10, and 12, group III nitride composite substrate 1 and group III nitride semiconductor device 4 were fabricated in a similar manner to Example A, except that: different diameters in a range of 75 mm to 150 mm were used; for Examples B2 to B10, group III nitride film donor substrate 13D of joined substrate 1L was cut with a wire saw along a plane located inwardly at a depth of 50 µm from the bonded surface where group III nitride film donor substrate 13D and joint film 12 were bonded to each other, and polishing and dry etching by ICP-RIE (Inductively Coupled Plasma Reactive Ion Etching) were performed; for Examples B1, B11, and B12, hydrogen ions with a dose of $1\times10^{18}$ cm$^{-2}$ were implanted in group III nitride film donor substrate 13D and the substrate was bonded, and thereafter the substrate was heated to 800° C. to thereby separate group III nitride film donor substrate 13D along ion implantation region 13i, and further dry etching by ICP-RIE was done; group III-nitride-film 13-side main surface 13m was finish-polished with an action coefficient FE of $5.0\times10^{-14}$ m$^2$/s; and group III nitride composite substrates 1 were fabricated in which respective group III nitride films 13 after finish-polished had different thicknesses in a range of 0.03 µm to 9.5 µm.

In a similar manner to Example A, for group III nitride composite substrate 1, the ratio $s_t/m_t$ of standard deviation $s_t$ of the thickness of group III nitride film 13, to mean value $m_1$ of the thickness thereof, and the ratio $s_o/m_o$ of standard deviation $s_o$ of an absolute value of an off angle between main surface 13m of group III nitride film 13 and a plane of a predetermined plane orientation, to mean value $m_o$ of the

TABLE 1

| Example | A1 | A2 | A3 | A4 | A5 | A6 | A7 | A8 | A9 | A10 | A11 | A12 | A13 |
|---|---|---|---|---|---|---|---|---|---|---|---|---|---|
| ratio $s_t/m_t$ | 0.01 | 0.02 | 0.05 | 0.1 | 0.2 | 0.35 | 0.5 | 0.7 | 0.5 | 0.01 | 0.5 | 0.7 | 0.01 |
| ratio $s_o/m_o$ | 0.005 | 0.008 | 0.05 | 0.2 | 0.4 | 0.5 | 0.6 | 0.6 | 0.7 | 0.6 | 0.005 | 0.005 | 0.7 |
| device yield (%) | 68 | 67 | 64 | 61 | 58 | 54 | 50 | 35 | 31 | 54 | 55 | 30 | 36 |

Referring to Table 1, group III nitride semiconductor devices with a high yield were those fabricated with a group III nitride composite substrate having a diameter of 75 mm (this value is 75 mm or more), including a support substrate absolute value of the off angle were calculated and summarized in Table 2. In a similar manner to Example A, the yield of group III nitride semiconductor devices 4 was also calculated and summarized in Table 2.

TABLE 2

| Example | B1 | B2 | B3 | B4 | B5 | B6 | B7 | B8 | B9 | B10 | B11 | B12 |
|---|---|---|---|---|---|---|---|---|---|---|---|---|
| the way to form group III nitride composite substrate | ion implantation | cut | cut | cut | cut | cut | cut | cut | cut | cut | ion implantation | ion implantation |
| diameter D (mm) | 75 | 75 | 75 | 75 | 75 | 75 | 75 | 100 | 100 | 150 | 100 | 75 |
| thickness of group III nitride film (µm) | 0.03 | 0.05 | 0.08 | 0.11 | 0.25 | 1 | 9.5 | 0.05 | 0.2 | 0.15 | 0.2 | 0.11 |
| ratio $s_t/m_t$ | 0.3 | 0.3 | 0.3 | 0.3 | 0.3 | 0.3 | 0.3 | 0.3 | 0.3 | 0.3 | 0.3 | 0.3 |

TABLE 2-continued

| Example | B1 | B2 | B3 | B4 | B5 | B6 | B7 | B8 | B9 | B10 | B11 | B12 |
|---|---|---|---|---|---|---|---|---|---|---|---|---|
| ratio $s_o/m_o$ | 0.45 | 0.45 | 0.45 | 0.45 | 0.45 | 0.45 | 0.45 | 0.45 | 0.45 | 0.45 | 0.45 | 0.45 |
| device yield (%) | 0 | 63 | 65 | 70 | 71 | 72 | 72 | 62 | 70 | 68 | 63 | 64 |

Referring to Table 2, group III nitride semiconductor devices with a high yield were those fabricated with a group III nitride composite substrate having a diameter of 75 mm to 150 mm (namely 75 mm or more), including a group III nitride film with a thickness of 0.05 μm to 9.5 μm (namely 50 nm or more and less than 10 μm), and having a ratio $s_t/m_t$ of standard deviation $s_t$ of the thickness of group III nitride film 13, to mean value m of the thickness thereof of 0.3 (this value is 0.01 or more and 0.5 or less), and a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.45 (this value is 0.005 or more and 0.6 or less).

Example C

Group III nitride composite substrates were prepared as substrates for semiconductor devices that were fabricated in a similar manner to Example A except that: group III nitride free-standing substrates were prepared; different diameters in a range of 75 mm to 150 mm were used as diameters of the substrates; and group III-nitride-film 13-side main surface 13m was finish-polished with an action coefficient FE of $5.5 \times 10^{-14}$ m²/s. The group III nitride free-standing substrates were prepared by cutting a GaN crystal body having a predetermined diameter with a wire saw and polishing the cut crystal body to thereby produce substrates having diameters and thicknesses shown in Tables 3 and 4.

Group III nitride semiconductor devices were fabricated in a similar manner to Example A except that the group III nitride composite substrates and the group III nitride free-standing substrates as described above were used. For Examples C1 to C15, the group III nitride composite substrates were used to fabricate group III nitride semiconductor devices. For Examples C16 to C18, the group III nitride free-standing substrates were used to fabricate group III nitride semiconductor devices.

For the obtained group III nitride composite substrates, warp $W_{III-N}$, the ratio $W_{III-N}/D$, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle were calculated and summarized in Tables 3 and 4. For the group III nitride free-standing substrate, warp $W_{III-N}$, the ratio $W_{III-N}/D$, the ratio $s_t/m_t$ of standard deviation $s_t$ of the thickness of the group III nitride free-standing substrate, to mean value $m_t$ of the thickness thereof, and the ratio $s_o/m_o$ of standard deviation $s_o$ of an absolute value of an off angle between main surface 13m of the front side of the group III nitride free-standing substrate and a plane of a predetermined plane orientation, to mean value $m_o$ of the absolute value of the off angle were calculated and summarized in Table 4. Further, in a similar manner to Example A, the yield of group III nitride semiconductor devices 4 was calculated and summarized in Tables 3 and 4.

TABLE 3

| | composite substrate | | | | | | | | |
|---|---|---|---|---|---|---|---|---|---|
| Example | C1 | C2 | C3 | C4 | C5 | C6 | C7 | C8 | C9 |
| diameter D (mm) | 100 | 100 | 100 | 100 | 100 | 100 | 100 | 100 | 100 |
| thickness of group III nitride film (μm) | 0.12 | 0.12 | 0.12 | 0.12 | 0.12 | 0.12 | 0.12 | 0.12 | 0.12 |
| warp $W_F$ (μm) | −100 | −70 | −40 | −25 | 15 | 30 | 50 | 80 | 100 |
| ratio $W_F/D$ (×10⁻⁴) | −10 | −7 | −4 | −2.5 | 1.5 | 3.0 | 5 | 8 | 10 |
| ratio $s_t/m_t$ | 0.4 | 0.4 | 0.4 | 0.4 | 0.4 | 0.4 | 0.4 | 0.4 | 0.4 |
| ratio $s_o/m_o$ | 0.3 | 0.3 | 0.3 | 0.3 | 0.3 | 0.3 | 0.3 | 0.3 | 0.3 |
| device yield (%) | 59 | 64 | 66 | 68 | 70 | 69 | 67 | 64 | 58 |

TABLE 4

| | composite substrate | | | | | | free-standing substrate | | |
|---|---|---|---|---|---|---|---|---|---|
| Example | C10 | C11 | C12 | C13 | C14 | C15 | C16 | C17 | C18 |
| diameter D (mm) | 75 | 150 | 150 | 150 | 150 | 150 | 75 | 100 | 150 |
| thickness of group III nitride film (μm) | 0.2 | 0.18 | 0.18 | 0.18 | 0.18 | 0.18 | 250 | 250 | 320 |
| warp $W_F$ (μm) | 15 | −165 | −105 | −37.5 | 120 | 150 | 105 | 160 | 240 |
| ratio $W_F/D$ (×10⁻⁴) | 2 | −11 | −7 | −2.5 | 8 | 10 | 14 | 16 | 16 |
| ratio $s_t/m_t$ | 0.4 | 0.4 | 0.4 | 0.4 | 0.4 | 0.4 | 0.4 | 0.4 | 0.4 |
| ratio $s_o/m_o$ | 0.3 | 0.3 | 0.3 | 0.3 | 0.3 | 0.3 | 0.3 | 0.3 | 0.3 |
| device yield (%) | 73 | 54 | 60 | 67 | 61 | 53 | crack | crack | crack |

Referring to Tables 3 and 4, in the case where the group III nitride free-standing substrate was used as a substrate for fabricating a group III nitride semiconductor device, a large diameter and a small thickness result in a large warp and thus occurrence of crack. In contrast, in the case where the group III nitride composite substrate was used as a substrate for fabricating a group III nitride semiconductor device, even the substrate of a large diameter and with a small thickness of the group III nitride film was suffered from no crack, and thus group III nitride semiconductor devices were obtained with a high yield.

Example D

Referring to FIGS. 8 and 12, group III nitride composite substrate 1 and group III nitride semiconductor device 4 were fabricated in a similar manner to Example A except that: an $Al_2O_3$—$SiO_2$ composite oxide substrate (with respect to the whole substrate, $Al_2O_3$ was 78% by mass and $SiO_2$ was 22% by mass) having a diameter of 100 mm was used as support substrate 11; a GaN substrate having high electrical conductivity and a diameter of 100 mm, doped with O (oxygen) atoms and Si (silicon) atoms, having no dislocation-concentrated region, having a uniform dislocation density of $5\times10^6$ $cm^{-2}$, and a carrier concentration of $2\times10^{18}$ $cm^{-3}$ was used as group III nitride film donor substrate 13D; group III nitride film donor substrate 13D was cut through electrical-discharge wire processing; group III-nitride-film 13-side main surface 13m was subjected to finish polishing with an action coefficient FE of $6.2\times10^{-14}$ $m^2/s$; and group III nitride film 13 after the finish polishing had a thickness of 0.15 μm. Support substrate 11 had a thermal conductivity of 4 $W \cdot m^{-1} \cdot K^{-1}$ and a Young's modulus of 220 GPa.

For group III nitride composite substrate 1 after the finish polishing, the ratio $s_t/m_t$ of standard deviation $s_t$ of the thickness of group III nitride film 13, to mean value $m_t$ of the thickness thereof, and the ratio $s_o/m_o$ of standard deviation $s_o$ of an absolute value of an off angle between main surface 13m of group III nitride film 13 and a plane of a predetermined plane orientation, to mean value $m_o$ of the absolute value of the off angle were calculated in a similar manner to Example A and summarized in Table 5.

For group III nitride composite substrate 1 after the finish polishing, mean value $m_{III\text{-}N}$ of the root mean square roughness of group III-nitride-film 13-side main surface 13m, and the ratio $s_{III\text{-}N}/m_{III\text{-}N}$ of standard deviation $s_{III\text{-}N}$ of the root mean square roughness of group III-nitride-film 13-side main surface 13m, to mean value $m_{III\text{-}N}$ of the root mean square roughness thereof, were also calculated and summarized in Table 5. Here, mean value $m_{III\text{-}N}$ of the root mean square roughness and the ratio $s_{III\text{-}N}/m_{III\text{-}N}$ of standard deviation $s_{III\text{-}N}$ of the root mean square roughness to mean value $m_{III\text{-}N}$ of the root mean square roughness were calculated from the root mean square roughness of group III-nitride-film 13-side main surface 13m at 13 measurement points P, on group III-nitride-film 13-side main surface 13m shown in FIG. 2, constituted of one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

Further, in a similar manner to Example A, the yield of group III nitride semiconductor devices 4 was calculated and summarized in Table 5.

TABLE 5

| Example | D1 | D2 | D3 | D4 | D5 | D6 | D7 | D8 | D9 | D10 | D11 | D12 | D13 |
|---|---|---|---|---|---|---|---|---|---|---|---|---|---|
| $m_{III\text{-}N}$ (nm) | 0.4 | 1 | 1.5 | 2 | 3 | 5 | 10 | 0.4 | 10 | 15 | 15 | 10 | 9 |
| ratio $s_{III\text{-}N}/m_{III\text{-}N}$ | 0.008 | 0.02 | 0.05 | 0.1 | 0.2 | 0.4 | 0.5 | 0.5 | 0.008 | 0.5 | 0.008 | 0.7 | 0.8 |
| ratio $s_t/m_t$ | 0.15 | 0.15 | 0.15 | 0.15 | 0.15 | 0.15 | 0.15 | 0.15 | 0.15 | 0.15 | 0.15 | 0.15 | 0.15 |
| ratio $s_o/m_o$ | 0.3 | 0.3 | 0.3 | 0.3 | 0.3 | 0.3 | 0.3 | 0.3 | 0.3 | 0.3 | 0.3 | 0.3 | 0.3 |
| device yield (%) | 72 | 72 | 68 | 65 | 62 | 58 | 55 | 63 | 57 | 49 | 50 | 52 | 52 |

Referring to Table 5, group III nitride semiconductor devices with a high yield were those fabricated with a group III nitride composite substrate having a diameter of 100 mm (this value is 75 mm or more), including a group III nitride film with a thickness of 0.15 μm (this value is 50 nm or more and less than 10 μm), and having a ratio $s_t/m_t$ of standard deviation $s_t$ of the thickness of group III nitride film 13, to mean value $m_t$ of the thickness thereof of 0.15 (this value is 0.01 or more and 0.5 or less), a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.3 (this value is 0.005 or more and 0.6 or less), a mean value $m_{III\text{-}N}$ of the root mean square roughness of the group III-nitride-film-side main surface of 0.4 nm or more and 10 nm or less, and a ratio $s_{III\text{-}N}/m_{III\text{-}N}$ of standard deviation $s_{III\text{-}N}$ of the root mean square roughness of the group III-nitride-film-side main surface, to the mean value $m_{III\text{-}N}$ thereof of 0.008 or more and 0.5 or less.

Example E

Referring to FIGS. 8 and 12, group III nitride composite substrate 1 and group III nitride semiconductor device 4 were fabricated in a similar manner to Example A except that: two kinds of mullite substrates different from each other in the ratio between $Al_2O_3$ and $SiO_2$ in the chemical composition and six kinds of $Al_2O_3$—$SiO_2$ composite oxide substrates different from each other in the ratio between $Al_2O_3$ and $SiO_2$ in the chemical composition were used as support substrates 11; group III-nitride-film 13-side main surface 13m was finish-polished with an action coefficient FE of $4.5\times10^{-14}$ $m^2/s$; different ratios $t_{III\text{-}N}/t_S$ of thickness $t_{III\text{-}N}$ of group III nitride film 13 to thickness $t_S$ of support substrate 11 in a range of $5\times10^{-5}$ to $3\times10^{-2}$ were used; and different diameters in a range of 75 mm to 150 mm were used.

For group III nitride composite substrate 1, the ratio $s_1/m_t$ of standard deviation $s_t$ of the thickness of group III nitride film 13 to mean value $m_t$ of the thickness thereof, and the ratio $s_o/m_o$ of standard deviation $s_o$ of an absolute value of an off angle between main surface 13nm of group III nitride film 13 and a plane of a predetermined plane orientation, to mean value $m_o$ of the absolute value of the off angle were calculated in a similar manner to Example A and summarized in Tables 6 and 7. Further, thermal expansion coefficient $\alpha_S$ of support substrate 11 and thermal expansion coefficient $\alpha_{III-N}$ of group III nitride film 13 were measured with a thermomechanical analysis apparatus, the ratio $\alpha_{III-N}/\alpha_S$ of thermal expansion coefficient $\alpha_{III-N}$ of the group III nitride film to thermal expansion coefficient $\alpha_S$ of the support substrate was calculated, and the results were summarized in Tables 6 and 7. Further, thickness $t_S$ of support substrate 11 and thickness $t_{III-N}$ of group III nitride film 13 were measured with a digital indicator and reflectance spectrometry respectively, the ratio $t_{III-N}/t_S$ of thickness $t_{III-N}$ of group III nitride film 13 to thickness $t_S$ of support substrate 11 was calculated, and the results were summarized in Tables 6 and 7. Further, the yield of group III nitride semiconductor devices 4 was calculated in a similar manner to Example A and summarized in Tables 6 and 7.

$\alpha_{III-N}$ of group III nitride film 13 to thermal expansion coefficient $\alpha_S$ of support substrate 11 was 0.75 or more and 1.25 or less, and in the case where the ratio $t_{III-N}/t_S$ of thickness $t_{III-N}$ of the group III nitride film to thickness $t_S$ of support substrate 11 was $1 \times 10^{-4}$ or more and $2 \times 10^{-2}$ or less.

Example F

Referring to FIGS. 8 and 12, group III nitride composite substrate 1 and group III nitride semiconductor device 4 were fabricated in a similar manner to Example A, except that: an $Al_2O_3$—$SiO_2$ composite oxide substrate (with respect to the whole substrate, $Al_2O_3$ was 78% by mass and $SiO_2$ was 22% by mass) was used as support substrate 11; group III-nitride-film 13-side main surface 13m was finish-polished with an action coefficient FE of $8.2 \times 10^{-14}$ m²/s; group III nitride composite substrates 1 were fabricated with different diameters in a range of 75 mm to 150 mm; and obtained group III nitride composite substrate 1 was further

TABLE 6

| Example | E1 | E2 | E3 | E4 | E5 | E6 | E7 | E8 | E9 |
|---|---|---|---|---|---|---|---|---|---|
| diameter D (mm) | 75 | 75 | 75 | 75 | 75 | 75 | 75 | 100 | 100 |
| kind of support substrate | | | | | mullite | | | | |
| ratio $\alpha_{III-N}/\alpha_S$ | 1.2 | 1.2 | 1.2 | 1.2 | 1.2 | 1.2 | 1.2 | 1.2 | 1.2 |
| ratio $t_{III-N}/t_S$ (×10⁻²) | 0.005 | 0.01 | 0.02 | 0.1 | 0.2 | 2 | 3 | 0.03 | 0.05 |
| ratio $s_t/m_t$ | 0.4 | 0.4 | 0.4 | 0.4 | 0.4 | 0.4 | 0.4 | 0.4 | 0.4 |
| ratio $s_o/m_o$ | 0.5 | 0.5 | 0.5 | 0.5 | 0.5 | 0.5 | 0.5 | 0.5 | 0.5 |
| device yield (%) | 48 | 55 | 57 | 60 | 59 | 57 | 51 | 58 | 59 |

TABLE 7

| Example | E10 | E11 | E12 | E13 | E14 | E15 | E16 | E17 | E18 |
|---|---|---|---|---|---|---|---|---|---|
| diameter D (mm) | 100 | 100 | 100 | 100 | 100 | 100 | 100 | 150 | 150 |
| kind of support substrate | | | $Al_2O_3$—$SiO_2$ | | | | mullite | | $Al_2O_3$—$SiO_2$ |
| ratio $\alpha_{III-N}/\alpha_S$ | 1.35 | 1.25 | 1.15 | 1 | 0.85 | 0.75 | 0.65 | 1.2 | 1 |
| ratio $t_{III-N}/t_S$ (×10⁻²) | 0.04 | 0.04 | 0.04 | 0.04 | 0.04 | 0.04 | 0.04 | 0.025 | 0.025 |
| ratio $s_t/m_t$ | 0.4 | 0.4 | 0.4 | 0.4 | 0.4 | 0.4 | 0.4 | 0.4 | 0.4 |
| ratio $s_o/m_o$ | 0.5 | 0.5 | 0.5 | 0.5 | 0.5 | 0.5 | 0.5 | 0.5 | 0.5 |
| device yield (%) | 47 | 56 | 62 | 70 | 61 | 58 | 49 | 57 | 68 |

Referring to Tables 6 and 7, even when group III nitride composite substrate 1 including, as support substrate 11, any of mullite substrates different from each other in chemical composition and $Al_2O_3$—$SiO_2$ composite oxide substrates different from each other in chemical composition was used, group III nitride semiconductor devices with a high yield were those fabricated with a group III nitride composite substrate having a group III nitride film with a thickness of 50 nm or more and less than 10 μm, having a diameter of 75 mm to 150 mm, and having a ratio $s_t/m_t$ of standard deviation $s_t$ of the thickness of group III nitride film 13 to mean value $m_t$ of the thickness thereof of 0.4 (this value is 0.01 or more and 0.5 or less), and a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.5 (this value is 0.005 or more and 0.6 or less). The yield of the fabricated group III nitride semiconductor devices was also high in the case where the ratio $\alpha_{III-N}/\alpha_S$ of thermal expansion coefficient cleaned. Here, support substrate 11 had a thermal conductivity of 4 W·m⁻¹·K⁻¹ and a Young's modulus of 220 GPa. Regarding the cleaning method, a combination of scrub cleaning with a surfactant and pure water, two-fluid cleaning with pure water, and megasonic cleaning with pure water was used.

For group III nitride composite substrate 1, mean value $m_S$ of the root mean square roughness of support-substrate 11-side main surface 11n was calculated in a similar manner to Example A and summarized in Table 8. For group III nitride composite substrate 1, the concentration of impurity metal atoms of group III-nitride-film 13-side main surface 13m was measured by the TXRF (Total Reflection X-ray Fluorescence) method and summarized in Table 8. Here, the measurement by the TXRF method was done by means of a tungsten (W) x-ray source under a condition that the angle of incidence was 0.05°. Further, the yield of group III nitride semiconductor devices 4 was calculated in a similar manner to Example A and summarized in Table 8.

TABLE 8

| Example | F1 | F2 | F3 | F4 | F5 | F6 | F7 | F8 |
|---|---|---|---|---|---|---|---|---|
| diameter D (mm) | 75 | 75 | 75 | 75 | 75 | 100 | 100 | 150 |
| concentration of impurity metal atoms (×10$^{10}$ atoms/cm$^2$) | 10 | 100 | 300 | 1000 | 1800 | 80 | 100 | 10 |
| ratio $s_t/m_t$ | 0.08 | 0.08 | 0.08 | 0.08 | 0.08 | 0.08 | 0.08 | 0.08 |
| ratio $s_o/m_o$ | 0.22 | 0.22 | 0.22 | 0.22 | 0.22 | 0.22 | 0.22 | 0.22 |
| device yield (%) | 68 | 65 | 62 | 57 | 51 | 65 | 63 | 64 |

Referring to Table 8, group III nitride semiconductor devices with a high yield were those fabricated with a group III nitride composite substrate including a group III nitride film with a thickness of 0.3 μm (this value is 50 nm or more and less than 10 μm), having a diameter of 75 mm to 150 mm, and having a ratio $s_t/m_t$ of standard deviation $s_t$ of the thickness of group III nitride film 13 to mean value $m_t$ of the thickness thereof of 0.08 (this value is 0.01 or more and 0.5 or less), a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.22 (this value is 0.005 or more and 0.6 or less), and a concentration of impurity metal atoms of the group III-nitride-film-side main surface of $1\times10^{13}$ atoms/cm$^2$ or less.

Example G

Referring to FIGS. 11 and 12, group III nitride composite substrate 1 and group III nitride semiconductor device 4 were fabricated in a similar manner to Example A except that: a substrate having a diameter of 75 mm and a thermal conductivity in 2 W·m$^{-1}$·K$^{-1}$ to 300 W·m$^{-1}$·K$^{-1}$ was used as support substrate 11; grinding and polishing were performed from main surface 13m opposite to the bonded main surface of group III nitride film donor substrate 13D with a diameter of 75 mm to thereby allow group III nitride film 13 to have a thickness of 0.3 μm; and group III-nitride-film 13-side main surface 13m was finish-polished with an action coefficient FE of 8.8×10$^{-14}$ m$^2$/s. Here, the thermal conductivity of support substrate 11 was obtained by adjusting the oxide material content and the sintering conditions. For grinding of group III nitride film donor substrate 13D, vitrified abrasive grains including diamond abrasive grains having an average grain size of 25 μm to 35 μm were used.

For group III nitride composite substrate 1, the ratio $s_t/m_t$ of standard deviation $s_t$ of the thickness of group III nitride film 13 to mean value $m_t$ of the thickness thereof, and the ratio $s_o/m_o$ of standard deviation $s_o$ of an absolute value of an off angle between main surface 13m of group III nitride film 13 and a plane of a predetermined plane orientation to mean value $m_o$ of the absolute value of the off angle were calculated in a similar manner to Example A and summarized in Table 9. The thermal conductivity of the support substrate of group III nitride composite substrate 1 was measured by the laser flash method and summarized in Table 9. Further, the yield of group III nitride semiconductor devices 4 was calculated in a similar manner to Example A and summarized in Table 9.

TABLE 9

| Example | G1 | G2 | G3 | G4 | G5 | G6 | G7 | G8 | G9 |
|---|---|---|---|---|---|---|---|---|---|
| thermal conductivity of support substrate $\lambda_s$ (W·m$^{-1}$·K$^{-1}$) | 2 | 3 | 5 | 10 | 30 | 120 | 210 | 280 | 300 |
| ratio $s_t/m_t$ | 0.12 | 0.12 | 0.12 | 0.12 | 0.12 | 0.12 | 0.12 | 0.12 | 0.12 |
| ratio $s_o/m_o$ | 0.16 | 0.16 | 0.16 | 0.16 | 0.16 | 0.16 | 0.16 | 0.16 | 0.16 |
| device yield (%) | 50 | 57 | 62 | 66 | 67 | 64 | 61 | 54 | 48 |

Referring to Table 9, group III nitride semiconductor devices with a high yield were those fabricated with a group III nitride composite substrate having a diameter of 75 mm (this value is 75 mm or more), including a group III nitride film with a thickness of 0.3 μm (this value is 50 nm or more and less than 10 μm), and having a ratio $s_t/m_t$ of standard deviation $s_t$ of the thickness of group III nitride film 13 to mean value $m_t$ of the thickness thereof of 0.12 (this value is 0.01 or more and 0.5 or less), a ratio $s_o/m_o$ of standard deviation $s_o$ of an absolute value of an off angle between a main surface of the group III nitride film and a plane of a predetermined plane orientation, to mean value $m_o$ of the absolute value of the off angle of 0.16 (this value is 0.005 or more and 0.6 or less), and a thermal conductivity of the support substrate of 3 W·m$^{-1}$·K$^{-1}$ or more and 280 W·m$^{-1}$·K$^{-1}$ or less.

Reference Example I-A to Reference Example I-G according to Reference Invention I will be illustrated below.

Reference Example I-A

1. Fabrication of Group III Nitride Composite Substrate

Referring to FIG. 8 (A), a mullite substrate (60 mol % Al$_2$O$_3$ and 40 mol % SiO$_2$ with respect to the whole substrate) having a diameter of 75 mm and a thickness of 400 μm was prepared for use as support substrate 11. Support substrate 11 had a thermal conductivity of 3 W·m$^{-1}$·K$^{-1}$ and a Young's modulus of 200 GPa. Main surfaces 11m, 11n of the two opposite sides respectively of support substrate 11 were subjected to rough polishing with a copper-based surface plate, intermediate polishing with a tin surface plate, and finish polishing with a nonwoven polishing pad, for which a diamond slurry was used as an abrasive. The finish polishing was performed under the condition that action coefficient FE was 4×10$^{-17}$ m$^2$/s or more and 1×10$^{-16}$ m$^2$/s or less.

Next, on finish-polished main surface 11m of support substrate 11, an SiO$_2$ film of 800 nm in thickness was grown by the PE-CVD (Plasma Enhanced-Chemical Vapor Deposition) method, annealed in a nitrogen atmosphere at 800° C.

for an hour, and thereafter subjected to CMP (Chemical Mechanical Polishing) using a slurry with a pH of 10 containing colloidal silica abrasive grains having an average grain size of 40 nm, to thereby form joint film 12a of 400 nm in thickness having its main surface 12am mirror-finished so that the root mean square roughness was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed.

Referring also to FIG. 8 (B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was planarized to have a root mean square roughness of 2 nm or less. After this, an $SiO_2$ film of 800 nm in thickness was grown on this substrate by the PE-CVD method, annealed in a nitrogen atmosphere at 800° C. for an hour, and thereafter subjected to CMP using a slurry with a pH of 10 containing colloidal silica abrasive grains having an average grain size of 40 nm, to thereby form joint film 12b of 500 nm in thickness having its main surface 12bn mirror-finished so that the root mean square roughness was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed. Here, group III nitride film donor substrate 13D was produced through growth by the HVPE method using a GaAs substrate as a base substrate. Group III nitride film donor substrate 13D had its electrical conductivity of n-type, its dislocation density of $1 \times 10^8$ $cm^{-2}$, and its carrier concentration of $1 \times 10^{17}$ $cm^{-3}$.

Referring next to FIG. 8 (C), main surface 12am of joint film 12a and main surface 12bn of joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring next to FIG. 8 (D), group III nitride film donor substrate 13D in joined substrate 1L was cut, with a wire saw, along a plane located inwardly at a depth of 40 μm from the bonded surface where group III nitride film donor substrate 13D was bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire with a diameter of 180 μm on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group III nitride composite substrate 1 was subjected to mechanical polishing and CMP. Rough polishing with a copper-based surface plate and intermediate polishing with a tin surface plate were performed, using a diamond slurry as an abrasive. Further, finish polishing was performed with a colloidal silica slurry of pH11 (a slurry with a pH of 11 containing colloidal silica abrasive brains having an average grain size of 60 nm) and a nonwoven polishing pad. In order to have a uniform thickness of group III nitride film 13, the composite substrate was mounted on a CMP apparatus in the following way. The shape of the substrate was corrected in advance by vacuum chuck suction, and thereafter the composite substrate was suction-fixed onto the apparatus. The finish polishing was performed under the condition that action coefficient FE was $7 \times 10^{-14}$ $m^2/s$. After the finish polishing, group III nitride film 13 had a thickness of 0.6 μm.

For group III nitride composite substrate 1 after this finish polishing, mean value $m_S$ of the root mean square roughness of support-substrate 11-side main surface 11n, and the ratio $s_S/m_S$ of standard deviation $s_S$ of the root mean square roughness of support-substrate 11-side main surface 11n to mean value $m_S$ of the root mean square roughness are summarized in Table 10.

Here, mean value $m_S$ of the root mean square roughness and the ratio $s_S/m_S$ of standard deviation $s_S$ of the root mean square roughness to mean value $m_S$ of the root mean square roughness were calculated from the root mean square roughness of support-substrate 11-side main surface 11n at the 13 measurement points P on support-substrate 11-side main surface 11n shown in FIG. 2, constituted of: one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

2. Fabrication of Group III Nitride Semiconductor Device

Referring to FIG. 12, an SBD (Schottky Barrier Diode) was fabricated as a group III nitride semiconductor device.

Referring first to FIG. 12 (A), on group III-nitride-film 13-side main surface 13m of group III nitride composite substrate 1, the MOCVD method was used to epitaxially grow $n^+$-GaN layer 28 (having a carrier concentration of $2 \times 10^{18}$ $cm^{-3}$) with a thickness of 2 μm and $n^-$-GaN layer 29 (having a carrier concentration of $5 \times 10^{15}$ $cm^{-3}$) with a thickness of 7 μm in this order to form group III nitride layer 20, and accordingly laminated group III nitride composite substrate 2 was obtained.

Referring next to FIG. 12 (B), on $n^-$-GaN layer 29 which was the topmost layer of group III nitride layer 20 of laminated group III nitride composite substrate 2, an Ni layer having a thickness of 4 nm and an Au layer having a thickness of 200 nm were successively formed by the EB (electron beam) deposition method, and annealed into an alloy, to thereby form first electrode 30 serving as a Schottky electrode. The diameter of first electrode 30 was set to 200 μm. On first electrode 30, a Ti layer having a thickness of 200 nm, a Pt layer having a thickness of 100 nm, and an Au layer having a thickness of 1000 nm were successively formed by the EB deposition method to thereby form a pad electrode 33.

As device support substrate 40, an Mo substrate was prepared. On one main surface of device support substrate 40, an AuSn solder film was formed as a joint metal film 44. On the other main surface of device support substrate 40, the EB deposition method was performed to successively form a Ti layer having a thickness of 200 nm, a Pt layer having a thickness of 100 nm, and an Au layer having a thickness of 1000 nm, and thereby form a device support substrate electrode 46.

Next, joint metal film 44 was bonded to pad electrode 33 to thereby produce laminated substrate 3.

Referring next to FIG. 12 (C), from laminated substrate 3, support substrate 11 and joint film 12 were etched away. For the etching, hydrofluoric acid was used.

Referring next to FIG. 12 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50 which was an ohmic electrode. In this way, group III nitride semiconductor device 4 which was an SBD was obtained.

The yield of the obtained SBDs as group III nitride semiconductor devices 4 was calculated in the following way. Specifically, for SBDs, current-voltage characteristics in the reverse direction were measured. The SBDs were classified into non-defective devices meeting a standard that the breakdown voltage was 250 V or more and defective devices failing to meet this standard, and the percentage of the ratio determined by dividing the non-defective devices by the sum of the non-defective devices and the defective devices was defined as a yield. The yield of the group III nitride semiconductor devices is summarized in Table 10.

device 4 were fabricated in a similar manner to Reference Example I-A, except that: different diameters in a range of 75 mm to 150 mm were used; for Examples B2 to B10, B12, and B13, group III nitride film donor substrate 13D of joined substrate 1L was cut with a wire saw along a plane located inwardly at a depth of 50 μm from the bonded surface where group III nitride film donor substrate 13D and joint film 12 were bonded to each other, and polishing and dry etching by ICP-RIE (Inductively Coupled Plasma Reactive Ion Etching) were performed; for Examples B1, B11, and B14, hydrogen ions with a dose of $1 \times 10^{18}$ cm$^{-2}$ were implanted in group III nitride film donor substrate 13D and the substrate was bonded, and thereafter the substrate was heated to 800° C. to thereby separate group III nitride film donor substrate 13D along ion implantation region 13i, and further dry etching by ICP-RTE was done; support-substrate 11-side main surface 11n was finish-polished with an action coefficient FE of $9.0 \times 10^{-17}$ m$^2$/s; and group III nitride composite substrates 1 were fabricated in which respective group III nitride films 13 after finish-polished had different thicknesses in a range of 0.03 μm to 9.5 μm. Support substrate 11 had a thermal conductivity of 3 W·m$^{-1}$·K$^{-1}$ and a Young's modulus of 200 GPa.

In a similar manner to Reference Example I-A, for group III nitride composite substrate 1, mean value $m_S$ of the root

TABLE 10

| Example | I-A1 | I-A2 | I-A3 | I-A4 | I-A5 | I-A6 | I-A7 | I-A8 | I-A9 | I-A10 | I-A11 | I-A12 | I-A13 |
|---|---|---|---|---|---|---|---|---|---|---|---|---|---|
| $m_s$ (nm) | 0.3 | 0.5 | 1 | 2 | 5 | 10 | 20 | 0.3 | 20 | 30 | 35 | 20 | 10 |
| ratio $s_s/m_s$ | 0.005 | 0.01 | 0.05 | 0.1 | 0.2 | 0.3 | 0.4 | 0.4 | 0.005 | 0.4 | 0.005 | 0.5 | 0.65 |
| device yield (%) | 72 | 72 | 70 | 68 | 64 | 60 | 52 | 58 | 55 | 29 | 30 | 33 | 34 |

Referring to Table 10, group III nitride semiconductor devices with a high yield were those fabricated with a group III nitride composite substrate having a diameter of 75 mm (this value is 75 mm or more), including a support substrate and a group III nitride film with a thickness of 0.6 μm (this value is 50 nm or more and less than 10 μm), and having a mean value $m_S$ of the root mean square roughness of the support-substrate-side main surface of 0.3 nm or more and 20 nm or less, and a ratio $s_S/m_S$ of standard deviation $s_S$ of the root mean square roughness of the support-substrate-side main surface to the mean value $m_S$ of the root mean square roughness of 0.005 or more and 0.4 or less.

Reference Example I-B

Referring to FIGS. 8, 10, and 12, group III nitride composite substrate 1 and group III nitride semiconductor mean square roughness of support-substrate 11-side main surface 11n, and the ratio $s_S/m_S$ of standard deviation $s_S$ of the root mean square roughness of support-substrate 11-side main surface 1 in to mean value $m_S$ of the root mean square roughness were calculated are summarized in Table 11. In a similar manner to Reference Example I-A, the yield of group III nitride semiconductor devices 4 was also calculated and summarized in Table 11.

TABLE 11

| Example | I-B1 | I-B2 | I-B3 | I-B4 | I-B5 | I-B6 | I-B7 | I-B8 | I-B9 | I-B10 | I-B11 | I-B12 | I-B13 | I-B14 |
|---|---|---|---|---|---|---|---|---|---|---|---|---|---|---|
| the way to form group III nitride composite substrate | ion implantation | cut | cut | cut | cut | cut | cut | cut | cut | cut | ion implantation | cut | cut | ion implantation |
| diameter D (mm) | 75 | 75 | 75 | 75 | 75 | 75 | 75 | 100 | 100 | 100 | 100 | 100 | 150 | 75 |
| thickness of group III nitride film (μm) | 0.03 | 0.05 | 0.08 | 0.11 | 0.25 | 1 | 9.5 | 0.05 | 0.15 | 0.3 | 0.3 | 0.6 | 0.13 | 0.11 |
| $m_s$ (nm) | 1.2 | 1.2 | 1.2 | 1.2 | 1.2 | 1.2 | 1.2 | 1.2 | 1.2 | 1.2 | 1.2 | 1.2 | 1.2 | 1.2 |
| ratio $s_s/m_s$ | 0.06 | 0.06 | 0.06 | 0.06 | 0.06 | 0.06 | 0.06 | 0.06 | 0.06 | 0.06 | 0.06 | 0.06 | 0.06 | 0.06 |
| device yield (%) | 0 | 62 | 64 | 68 | 69 | 70 | 70 | 61 | 69 | 69 | 62 | 68 | 67 | 63 |

Referring to Table 11, group III nitride semiconductor devices with a high yield were those fabricated with a group III nitride composite substrate having a diameter of 75 mm to 150 mm, including a group III nitride film with a thickness of 0.05 μm to 9.5 μm, and having a mean value $m_S$ of the root mean square roughness of the support-substrate-side main surface of 1.2 nm (this value is 0.3 nm or more and 20 nm or less), and a ratio $s_S/m_S$ of standard deviation $s_S$ of the root mean square roughness of the support-substrate-side main surface to mean value $m_S$ of the root mean square roughness of 0.06 (this value is 0.005 or more and 0.4 or less).

Reference Example I-C

Group III nitride composite substrates were prepared as substrates for semiconductor devices that were produced in a similar manner to Reference Example I-A except that: group III nitride free-standing substrates with different diameters in a range of 75 mm to 150 mm were used; and different diameters in a range of 75 mm to 150 mm were used. The group III nitride free-standing substrates were prepared by cutting a GaN crystal body having a predetermined diameter with a wire saw and polishing the cut crystal body to thereby produce substrates having diameters and thicknesses shown in Table 13.

Group III nitride semiconductor devices were fabricated in a similar manner to Reference Example I-A except that the group III nitride composite substrates and the group III nitride free-standing substrates as described above were used. For Examples C1 to C15, the group III nitride composite substrates were used to fabricate group III nitride semiconductor devices. For Examples C16 to C18, the group III nitride free-standing substrates were used to fabricate group III nitride semiconductor devices.

For the obtained group III nitride composite substrates, warp $W_S$, the ratio $W_S/D$, mean value $m_S$ of the root mean square roughness of support-substrate 11-side main surface 11$n$, and the ratio $s_S/m_S$ of standard deviation $s_S$ of the root mean square roughness of support-substrate 11-side main surface 11$n$ to mean value $m_S$ of the root mean square roughness were calculated and summarized in Tables 12 and 13. For the group III nitride free-standing substrates, warp $W_S$, the ratio $W_S/D$, mean value $m_S$ of the root mean square roughness of the main surface on the rear side, and the ratio $s_S/m_S$ of standard deviation $s_S$ of the root mean square roughness of main surface 11$n$ on the rear side to mean value $m_S$ of the root mean square roughness were also calculated and summarized in Tables 12 and 13. Further, in a similar manner to Reference Example I-A, the yield of group III nitride semiconductor devices 4 was calculated and summarized in Tables 12 and 13.

TABLE 12

| | composite substrate | | | | | | | | |
|---|---|---|---|---|---|---|---|---|---|
| Example | I-C1 | I-C2 | I-C3 | I-C4 | I-C5 | I-C6 | I-C7 | I-C8 | I-C9 |
| diameter D (mm) | 100 | 100 | 100 | 100 | 100 | 100 | 100 | 100 | 100 |
| thickness of group III nitride film (μm) | 0.14 | 0.14 | 0.14 | 0.14 | 0.14 | 0.14 | 0.14 | 0.14 | 0.14 |
| warp $W_S$ (μm) | −100 | −70 | −40 | −25 | 15 | 30 | 50 | 80 | 100 |
| ratio $W_S/D$ (×10$^{-4}$) | −10 | −7 | −4 | −2.5 | 1.5 | 3.0 | 5 | 8 | 10 |
| $m_s$ (nm) | 2.5 | 2.5 | 2.5 | 2.5 | 2.5 | 2.5 | 2.5 | 2.5 | 2.5 |
| ratio $s_s/m_s$ | 0.04 | 0.04 | 0.04 | 0.04 | 0.04 | 0.04 | 0.04 | 0.04 | 0.04 |
| device yield (%) | 61 | 66 | 68 | 70 | 71 | 69 | 68 | 66 | 62 |

TABLE 13

| | composite substrate | | | | | | free-standing substrate | | |
|---|---|---|---|---|---|---|---|---|---|
| Example | I-C10 | I-C11 | I-C12 | I-C13 | I-C14 | I-C15 | I-C16 | I-C17 | I-C18 |
| diameter D (mm) | 75 | 150 | 150 | 150 | 150 | 150 | 75 | 100 | 150 |
| thickness of group III nitride film (μm) | 0.12 | 0.18 | 0.18 | 0.18 | 0.18 | 0.18 | 240 | 250 | 320 |
| warp $W_S$ (nm) | 15 | −165 | −105 | −37.5 | 120 | 150 | 408 | 180 | 300 |
| ratio $W_S/D$ (×10$^{-4}$) | 2 | −11 | −7 | −2.5 | 8 | 10 | 17 | 18 | 20 |
| $m_s$ (nm) | 2.5 | 2.5 | 2.5 | 2.5 | 2.5 | 2.5 | 2.5 | 2.5 | 2.5 |
| ratio $s_s/m_s$ | 0.04 | 0.04 | 0.04 | 0.04 | 0.04 | 0.04 | 0.04 | 0.04 | 0.04 |
| device yield (%) | 70 | 58 | 63 | 69 | 62 | 59 | crack | crack | crack |

Referring to Tables 12 and 13, in the case where the group III nitride free-standing substrate was used as a substrate for fabricating a group III nitride semiconductor device, a large diameter and a small thickness result in a large warp and thus occurrence of crack. In contrast, in the case where the group III nitride composite substrate was used as a substrate for fabricating a group III nitride semiconductor device, even the substrate of a large diameter and with a small thickness of the group III nitride film was suffered from no crack, and thus group III nitride semiconductor devices were obtained with a high yield.

Reference Example I-D

Referring to FIGS. 8 and 12, group III nitride composite substrate 1 and group III nitride semiconductor device 4 were produced in a similar manner to Reference Example I-A except that: an $Al_2O_3$—$SiO_2$ composite oxide substrate (with respect to the whole substrate, $Al_2O_3$ was 82% by mass and $SiO_2$ was 18% by mass) having a diameter of 125 mm was used as support substrate 11; a GaN substrate having high electrical conductivity and a diameter of 125 mm, doped with O (oxygen) atoms and Si (silicon) atoms, having no dislocation-concentrated region, having a uniform dislocation density of $5 \times 10^6$ $cm^{-2}$, and a carrier concentration of $2 \times 10^{18}$ $cm^{-3}$ was used as group III nitride film donor substrate 13D; support-substrate 11-side main surface 11n was finish-polished with an action coefficient FE of $6.5 \times 10^{-17}$ $m^2/s$; group III nitride film donor substrate 13D was cut through electrical-discharge wire processing; group III-nitride-film 13-side main surface 13m was subjected to finish polishing with an action coefficient FE of $4 \times 10^{-14}$ $m^2/s$ or more and $1 \times 10^{-13}$ $m^2/s$ or less, using a slurry containing colloidal silica having a grain size of 20 nm to 400 nm; and the group III nitride film had a thickness of 150 nm. Support substrate 11 had a thermal conductivity of 5 $W \cdot m^{-1} \cdot K^{-1}$ and a Young's modulus of 230 GPa.

For group III nitride composite substrate 1 after the finish polishing, mean value $m_S$ of the root mean square roughness of support-substrate 11-side main surface 11n and the ratio $s_S/m_S$ of standard deviation $s_S$ of the root mean square roughness of support-substrate 11-side main surface 11n to mean value $m_S$ of the root mean square roughness were calculated in a similar manner to Reference Example I-A and summarized in Table 14.

For group III nitride composite substrate 1 after the finish polishing, mean value $m_{III-N}$ of the root mean square roughness of group III-nitride-film 13-side main surface 13m, and the ratio $s_{III-N}/m_{III-N}$ of standard deviation $s_{III-N}$ of the root mean square roughness of group III-nitride-film 13-side main surface 13m, to mean value $m_{III-N}$ of the root mean square roughness, were also summarized in Table 14. Here, mean value $m_{III-N}$ of the root mean square roughness and the ratio $s_{III-N}/m_{III-N}$ of standard deviation $s_{III-N}$ of the root mean square roughness to mean value $m_{III-N}$ of the root mean square roughness were calculated from the root mean square roughness of group III-nitride-film 13-side main surface 13m at 13 measurement points P, on group III-nitride-film 13-side main surface 13m shown in FIG. 2, constituted of one central point $P_C$; four outer points $P_O$ located respectively in the four directions with respect to central point $P_C$ that are orthogonal to each other, the outer points each being located at 5 mm inward from the outer edge of the substrate; and eight middle points $P_M$ including four middle points each between the one central point $P_C$ and one of the four outer points $P_O$ and four middle points each between two of the four outer points $P_O$.

Further, in a similar manner to Reference Example I-A, the yield of group III nitride semiconductor devices 4 was calculated and summarized in Table 14.

TABLE 14

| Example | I-D1 | I-D2 | I-D3 | I-D4 | I-D5 | I-D6 | I-D7 | I-D8 | I-D9 | I-D10 | I-D11 | I-D12 | I-D13 |
|---|---|---|---|---|---|---|---|---|---|---|---|---|---|
| $m_{III-N}$ (nm) | 0.4 | 1 | 1.5 | 2 | 3 | 5 | 10 | 0.4 | 10 | 15 | 15 | 10 | 9 |
| ratio $s_{III-N}/m_{III-N}$ | 0.008 | 0.02 | 0.05 | 0.1 | 0.2 | 0.4 | 0.5 | 0.5 | 0.800 | 0.5 | 0.008 | 0.7 | 0.8 |
| $m_s$ (nm) | 5 | 5 | 5 | 5 | 5 | 5 | 5 | 5 | 5 | 5 | 5 | 5 | 5 |
| ratio $s_s/m_s$ | 0.15 | 0.15 | 0.15 | 0.15 | 0.15 | 0.15 | 0.15 | 0.15 | 0.15 | 0.15 | 0.15 | 0.15 | 0.15 |
| device yield (%) | 74 | 74 | 70 | 67 | 65 | 63 | 58 | 65 | 59 | 51 | 52 | 54 | 53 |

Referring to Table 14, group III nitride semiconductor devices with a high yield were those fabricated with a group III nitride composite substrate having a diameter of 125 mm (this value is 75 mm or more), including a group III nitride film with a thickness of 150 nm (this value is 50 nm or more and less than 10 μm), having a mean value $m_S$ of the root mean square roughness of the support-substrate-side main surface of 5 nm (this value is 0.3 nm or more and 20 nm or less), a ratio $s_S/m_S$ of standard deviation $s_S$ of the root mean square roughness of the support-substrate-side main surface to mean value $m_S$ of the root mean square roughness of 0.15 (this value is 0.005 or more and 0.4 or less), a mean value $m_{III-N}$ of the root mean square roughness of the group III-nitride-film-side main surface of 0.4 nm or more and 10 nm or less, and a ratio $s_{III-N}/m_{III-N}$ of standard deviation $S_{III-N}$ of the root mean square roughness of the group III-nitride-film-side main surface, to the mean value $m_{III-N}$ thereof of 0.008 or more and 0.5 or less.

Reference Example I-E

Referring to FIGS. 8 and 12, group III nitride composite substrate 1 and group III nitride semiconductor device 4 were fabricated in a similar manner to Reference Example I-A except that: two kinds of mullite substrates different from each other in the ratio between $Al_2O_3$ and $SiO_2$ in the chemical composition and six kinds of $Al_2O_3$—$SiO_2$ composite oxide substrates different from each other in the ratio between $Al_2O_3$ and $SiO_2$ in the chemical composition were used as support substrates 11; support-substrate 11-side main surface 11n was finish-polished with an action coefficient FE of $7.2 \times 10^{-17}$ $m^2/s$; different thicknesses of group III nitride films 13 after finish polishing were used; and different diameters in a range of 75 mm to 150 mm were used.

For group III nitride composite substrate 1, mean value $m_S$ of the root mean square roughness of support-substrate 11-side main surface 11n, and the ratio $s_S/m_S$ of standard deviation $s_S$ of the root mean square roughness of support-substrate 11-side main surface 11n to mean value $m_S$ of the root mean square roughness were calculated in a similar manner to Reference Example I-A and summarized in Tables 15 and 16. Further, thermal expansion coefficient $\alpha_s$ of support substrate 11 and thermal expansion coefficient $\alpha_{III\text{-}N}$ of group III nitride film 13 were measured with a thermomechanical analysis apparatus, the ratio $\alpha_{III\text{-}N}/\alpha_S$ of thermal expansion coefficient $\alpha_{III\text{-}N}$ of the group III nitride film to thermal expansion coefficient $\alpha_S$ of the support substrate was calculated, and the results were summarized in Tables 15 and 16. Further, thickness $t_S$ of support substrate 11 and thickness $t_{III\text{-}N}$ of group III nitride film 13 were measured with a digital indicator and reflectance spectrometry respectively, the ratio $t_{III\text{-}N}/t_S$ of thickness $t_{III\text{-}N}$ of group III nitride film 13 to thickness $t_S$ of support substrate 11 was calculated, and the results were summarized in Tables 15 and 16. Further, the yield of group III nitride semiconductor devices 4 was calculated in a similar manner to Reference Example I-A and summarized in Tables 15 and 16.

of thickness $t_{III\text{-}N}$ of the group III nitride film to thickness $t_S$ of support substrate 11 was $1\times10^{-4}$ or more and $2\times10^{-2}$ or less.

Reference Example I-F

Referring to FIGS. 8 and 12, group III nitride composite substrate 1 and group III nitride semiconductor device 4 were fabricated in a similar manner to Reference Example I-A, except that: an $Al_2O_3$—$SiO_2$ composite oxide substrate (with respect to the whole substrate, $Al_2O_3$ was 80% by mass and $SiO_2$ was 20% by mass) was used as support substrate 11; support substrate 11 was ground and finish-polished with an action coefficient FE of $8.9\times10^{-17}$ m²/s to have a thickness of 500 µm; group III nitride film 13 had a thickness of 0.4 µm; group III nitride composite substrates 1 were fabricated with different diameters in a range of 75 mm to 150 mm; and obtained group III nitride composite substrate

TABLE 15

| Example | I-E1 | I-E2 | I-E3 | I-E4 | I-E5 | I-E6 | I-E7 | I-E8 | I-E9 |
|---|---|---|---|---|---|---|---|---|---|
| diameter D (mm) | 75 | 75 | 75 | 75 | 75 | 100 | 100 | 150 | 150 |
| kind of support substrate | | | | | mullite | | | | |
| ratio $\alpha_{III\text{-}N}/\alpha_S$ | 1.2 | 1.2 | 1.2 | 1.2 | 1.2 | 1.2 | 1.2 | 1.2 | 1.2 |
| ratio $t_{III\text{-}N}/t_S$ ($\times10^{-2}$) | 0.005 | 0.01 | 0.02 | 0.1 | 0.2 | 2 | 3 | 0.03 | 0.05 |
| $m_s$ (nm) | 4 | 4 | 4 | 4 | 4 | 4 | 4 | 4 | 4 |
| ratio $s_s/m_s$ | 0.12 | 0.12 | 0.12 | 0.12 | 0.12 | 0.12 | 0.12 | 0.12 | 0.12 |
| device yield (%) | 51 | 57 | 59 | 62 | 61 | 58 | 54 | 59 | 60 |

TABLE 16

| Example | I-E10 | I-E11 | I-E12 | I-E13 | I-E14 | I-E15 | I-E16 | I-E17 | I-E18 |
|---|---|---|---|---|---|---|---|---|---|
| diameter D (mm) | 75 | 75 | 75 | 75 | 75 | 100 | 100 | 150 | 150 |
| kind of support substrate | | $Al_2O_3$—$SiO_2$ | | | | | mullite | | $Al_2O_3$—$SiO_2$ |
| ratio $\alpha_{III\text{-}N}/\alpha_S$ | 1.35 | 1.25 | 1.15 | 1 | 0.85 | 0.75 | 0.65 | 1.2 | 1 |
| ratio $t_{III\text{-}N}/t_S$ ($\times10^{-2}$) | 0.04 | 0.04 | 0.04 | 0.04 | 0.04 | 0.04 | 0.04 | 0.025 | 0.025 |
| $m_s$ (nm) | 4 | 4 | 4 | 4 | 4 | 4 | 4 | 4 | 4 |
| ratio $s_s/m_s$ | 0.12 | 0.12 | 0.12 | 0.12 | 0.12 | 0.12 | 0.12 | 0.12 | 0.12 |
| device yield (%) | 50 | 63 | 69 | 72 | 68 | 63 | 51 | 58 | 70 |

Referring to Tables 15 and 16, even when group III nitride composite substrate 1 including, as support substrate 11, any of mullite substrates different from each other in chemical composition and $Al_2O_3$—$SiO_2$ composite oxide substrates different from each other in chemical composition was used, group III nitride semiconductor devices with a high yield were those fabricated with a group III nitride composite substrate having a group III nitride film with a thickness of 50 nm or more and less than 10 µm, having a diameter of 75 mm to 150 mm, having a mean value $m_S$ of the root mean square roughness of the support-substrate-side main surface of 4 nm (this value is 0.3 nm or more and 20 nm or less), and a ratio $s_S/m_S$ of standard deviation $s_S$ of the root mean square roughness of the support-substrate-side main surface to mean value $m_S$ of the root mean square roughness of 0.12 (this value is 0.005 or more and 0.4 or less). The yield of the fabricated group III nitride semiconductor devices was also high in the case where the ratio $\alpha_{III\text{-}N}/\alpha_S$ of thermal expansion coefficient $\alpha_{III\text{-}N}$ of group III nitride film 13 to thermal expansion coefficient $\alpha_S$ of support substrate 11 was 0.75 or more and 1.25 or less, and in the case where the ratio $t_{III\text{-}N}/t_S$ 1 was further cleaned. Here, support substrate 11 had a thermal conductivity of 4 W·m⁻¹·K⁻¹ and a Young's modulus of 220 GPa. Regarding the cleaning method, a combination of scrub cleaning with a surfactant and pure water, two-fluid cleaning with hydrochloric acid or TMAH (tetramethylammonium hydroxide) and pure water, and megasonic cleaning with hydrochloric acid or TMAH and pure water was used. For group III nitride composite substrate 1, mean value $m_S$ of the root mean square roughness of support-substrate 11-side main surface 11n was calculated in a similar manner to Reference Example I-A and summarized in Table 17. For group III nitride composite substrate 1, the concentration of impurity metal atoms of group III-nitride-film 13-side main surface 13m was measured by the TXRF (Total Reflection X-ray Fluorescence) method and summarized in Table 17. Here, the measurement by the TXRF method was done by means of a tungsten (W) x-ray source under a condition that the angle of incidence was 0.05°. Further, the yield of group III nitride semiconductor devices 4 was calculated in a similar manner to Reference Example I-A and summarized in Table 17.

TABLE 17

| Example | I-F1 | I-F2 | I-F3 | I-F4 | I-F5 | I-F6 | I-F7 | I-F8 |
|---|---|---|---|---|---|---|---|---|
| diameter D (mm) | 75 | 75 | 75 | 75 | 75 | 100 | 100 | 150 |
| concentration of impurity metal atoms ($\times 10^{10}$ atoms/cm$^2$) | 10 | 100 | 300 | 1000 | 2000 | 8 | 100 | 10 |
| $m_s$ (nm) | 7 | 7 | 7 | 7 | 7 | 7 | 7 | 7 |
| ratio $s_s/m_s$ | 0.06 | 0.06 | 0.06 | 0.06 | 0.06 | 0.06 | 0.06 | 0.06 |
| device yield (%) | 66 | 63 | 61 | 58 | 54 | 67 | 62 | 65 |

Referring to Table 17, group III nitride semiconductor devices with a high yield were those fabricated with a group III nitride composite substrate including a group III nitride film with a thickness of 0.4 µm (this value is 50 nm or more and less than 10 µm), having a diameter of 75 mm to 150 mm, and having a mean value $m_S$ of the root mean square roughness of the support-substrate-side main surface of 7 nm (this value is 0.3 nm or more and 20 nm or less), a ratio $s_S/m_S$ of standard deviation $s_S$ of the root mean square roughness of the support-substrate-side main surface to mean value $m_S$ of the root mean square roughness of 0.06 (this value is 0.005 or more and 0.4 or less), and a concentration of impurity metal atoms of the group III-nitride-film-side main surface of $3\times10^{12}$ atoms/cm$^2$ or less.

Reference Example I-G

Referring to FIGS. 11 and 12, group III nitride composite substrate 1 and group III nitride semiconductor device 4 were fabricated in a similar manner to Reference Example I-A except that: a substrate having a diameter of 75 mm and a thermal conductivity in 2 W·m$^{-1}$·K$^{-1}$ to 300 W·m$^{-1}$·K$^{-1}$ was used as support substrate 11; grinding and polishing were performed from main surface 13m opposite to the bonded main surface of group III nitride film donor substrate 13D with a diameter of 75 mm to thereby allow group III nitride film 13 to have a thickness of 1 µm; and support-substrate 11-side main surface 11n was finish-polished with an action coefficient FE of $8.7\times10^{-17}$ m$^2$/s. Here, for grinding of group III nitride film donor substrate 13D, vitrified abrasive grains including diamond abrasive grains having an average grain size of 25 µm to 35 µm were used. The thermal conductivity of support substrate 11 was obtained by adjusting the oxide material content and the sintering conditions.

For group III nitride composite substrate 1, mean value $m_S$ of the root mean square roughness of support-substrate 11-side main surface 11n was calculated in a similar manner to Reference Example I-A and summarized in Table 18. The thermal conductivity of the support substrate of group III nitride composite substrate 1 was measured by the laser flash method and summarized in Table 18. Further, the yield of group III nitride semiconductor devices 4 was calculated in a similar manner to Reference Example I-A and summarized in Table 18.

Referring to Table 18, group III nitride semiconductor devices with a high yield were those fabricated with a group III nitride composite substrate having a diameter of 75 mm (this value is 75 mm or more), including a group III nitride film with a thickness of 1 µm (this value is 50 nm or more and less than 10 µm), having a mean value $m_S$ of the root mean square roughness of the support-substrate-side main surface of 3 nm (this value is 0.3 nm or more and 20 nm or less), a ratio $s_S/m_S$ of standard deviation $s_S$ of the root mean square roughness of the support-substrate-side main surface to the mean value $m_S$ of the root mean square roughness of 0.07 (this value is 0.005 or more and 0.4 or less), and a thermal conductivity of the support substrate of 3 W·m$^{-1}$·K$^{-1}$ or more and 280 W·m$^{-1}$·K$^{-1}$ or less.

Reference Example II-A to Reference Example II-H according to Reference Invention II will be illustrated below.

[(1) Fabrication of Group III Nitride Composite Substrate]

Reference Example II-A

In the following, with reference to FIG. 18, a group III nitride composite substrate according to Reference Example II-A will be described.

First, as shown in FIG. 18 (A1), an Al$_2$O$_3$—SiO$_2$ composite oxide substrate (with respect to the whole substrate, Al$_2$O$_3$ was 85% by mass and SiO$_2$ was 15% by mass) having a diameter of 75 mm and a thickness of 500 µm was prepared for use as support substrate 11. Support substrate 11 had a thermal conductivity of 10 W·m$^{-1}$·K$^{-1}$ and a Young's modulus of 250 GPa.

Subsequently, main surfaces 11m of the two opposite sides respectively of support substrate 11 were subjected to rough polishing with a copper-based surface plate, intermediate polishing with a tin-based surface plate, and finish polishing with a nonwoven polishing pad, for which a diamond slurry was used as an abrasive. The finish polishing was performed under the condition that action coefficient FE was $4\times10^{-17}$ m$^2$/s or more and $1\times10^{-16}$ m$^2$/s or less.

Next, on finish-polished main surface 11m of support substrate 11, an SiO$_2$ film of 800 nm in thickness was grown by the PE-CVD (Plasma Enhanced-Chemical Vapor Deposition) method, and annealed in a nitrogen atmosphere at 800° C. for an hour.

TABLE 18

| Example | I-G1 | I-G2 | I-G3 | I-G4 | I-G5 | I-G6 | I-G7 | I-G8 | I-G9 |
|---|---|---|---|---|---|---|---|---|---|
| thermal conductivity of support substrate $\lambda_s$ (W·m$^{-1}$·K$^{-1}$) | 2 | 3 | 5 | 10 | 30 | 120 | 210 | 280 | 300 |
| $m_s$ (nm) | 3 | 3 | 3 | 3 | 3 | 3 | 3 | 3 | 3 |
| ratio $s_s/m_s$ | 0.07 | 0.07 | 0.07 | 0.07 | 0.07 | 0.07 | 0.07 | 0.07 | 0.07 |
| device yield (%) | 54 | 59 | 63 | 65 | 66 | 64 | 62 | 58 | 53 |

Next, CMP using a slurry with a pH of 10 containing colloidal silica abrasive grains having an average grain size of 40 nm was performed to thereby form joint film 12a of 400 nm in thickness having its main surface 12am mirror-finished so that the root mean square roughness (hereinafter also referred to as "RMS (Root-Mean-Square roughness)") was 0.3 nm or less. Subsequently, in order to remove the colloidal silica abrasive grains used for the CMP, non-abrasive polishing cleaning with a KOH aqueous solution, polishing cleaning with pure water, and megasonic cleaning (cleaning with ultrasonic waves in a megasonic frequency range of 500 kHz to 5 MHz) with pure water were performed.

Next, as shown in FIG. 18 (A2), a GaN bulk crystal was used to prepare group III nitride film donor substrate 13D having a diameter of 75 mm and a thickness of 8 mm. Group III nitride film donor substrate 13D is GaN crystal body.

Subsequently, main surface 13n of the bonded surface side of group III nitride film donor substrate 13D was subjected to mechanical polishing and CMP so that it was planarized to have an RMS of 2 nm or less. After this, an $SiO_2$ film of 800 nm in thickness was grown on main surface 13n of the bonded surface side by the PE-CVD method, and annealing was performed in a nitrogen atmosphere at 800° C. for an hour. Subsequently, CMP using a slurry with a pH of 10 containing colloidal silica abrasive grains having an average grain size of 40 nm was performed to thereby form joint film 12b of 500 nm in thickness having its main surface 12bn mirror-finished so that the RMS was 0.3 nm or less. Subsequently, in order to remove the colloidal silica abrasive grains used for the CMP, non-abrasive polishing cleaning with a KOH aqueous solution, polishing cleaning with pure water, and megasonic cleaning with pure water were performed.

Subsequently, an ion implantation apparatus was used to implant, from main surface 13n of the bonded surface side of group III nitride film donor substrate 13D which was GaN crystal body, hydrogen ions as ions I in ion implantation region 13i at a depth t of 110 nm from main surface 13n of the bonded surface side, under the conditions of a dose of $1 \times 10^{17}$ $cm^{-2}$ and an acceleration voltage of 50 keV. It should be noted that "ion implantation region 13i" herein represents a plane where hydrogen ions have been implanted.

Here, group III nitride film donor substrate 13D was produced through growth by the HVPE method using a GaAs substrate as a base substrate. Group III nitride film donor substrate 13D had its electrical conductivity of n-type, its dislocation density of $1 \times 10^8$ $cm^{-2}$, and its carrier concentration of $1 \times 10^{17}$ $cm^{-3}$.

Next, as shown in FIG. 18 (A1) to (A3), main surface 12am of joint film 12a and main surface 12bn of joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Next, as shown in FIG. 18 (B), group III nitride film donor substrate 13D was heat-treated at 400° C. to embrittle ion implantation region 13i and accordingly divide group III nitride film 13 along this plane. Thus, a group III nitride film donor substrate 13Dr and group III nitride composite substrate 1 were obtained.

In this way, group III nitride composite substrate 1 with a diameter of 75 mm was obtained including the support substrate and the GaN thin film with a thickness of 110 nm that were bonded to each other with the $SiO_2$ film interposed therebetween.

Further, the above-described steps were repeated to produce 24 group III nitride composite substrates 1.

[(2) Fabrication of Group III Nitride Semiconductor Device]

In the following, with reference to FIG. 22, an SBD (Schottky Barrier Diode) which is a group III nitride semiconductor device according to the reference example will be described.

First, as shown in FIG. 22 (A), on group III-nitride-film 13-side main surface 13m of group III nitride composite substrate 1, the MOCVD method was used to epitaxially grow $n^+$-GaN layer 28 (having a carrier concentration of $2 \times 10^{18}$ $cm^{-3}$) with a thickness of 2 μm and $n^-$-GaN layer 29 (having a carrier concentration of $5 \times 10^{15}$ $cm^{-3}$) with a thickness of 7 μm in this order to form group III nitride layer 20, and accordingly laminated group III nitride composite substrate 2 was obtained.

Next, as shown in FIG. 22 (B), on $n^-$-GaN layer 29 which was the topmost layer of group III nitride layer 20 of laminated group III nitride composite substrate 2, an Ni layer having a thickness of 4 nm and an Au layer having a thickness of 200 nm were successively formed by the electron beam deposition method (hereinafter also referred to as EB (Electron Beam) deposition method), and annealed into an alloy, to thereby form first electrode 30 serving as a Schottky electrode. At this time, the diameter of first electrode 30 was set to 200 μm. Further, on first electrode 30, a Ti layer having a thickness of 200 nm, a Pt layer having a thickness of 100 nm, and an Au layer having a thickness of 1000 nm were successively formed by the EB deposition method to thereby form a pad electrode 33.

As device support substrate 40, an Mo substrate was prepared. On device support substrate 40, a Ti layer having a thickness of 200 nm, a Pt layer having a thickness of 100 nm, and an Au layer having a thickness of 1000 nm were successively formed by the EB deposition method to thereby form pad electrode 43. On pad electrode 43, an AuSn solder film was formed as joint metal film 44.

Next, joint metal film 44 was bonded to pad electrode 33 to thereby produce laminated substrate 3.

Next, as shown in FIG. 22 (C), from laminated substrate 3, support substrate 11 and joint film 12 in group III nitride composite substrate 1 were etched away by means of hydrofluoric acid.

Next, as shown in FIG. 22 (D), on group III nitride film 13 having been exposed by removal of support substrate 11 and joint film 12 from laminated substrate 3, a Ti layer having a thickness of 20 nm, an Al layer having a thickness of 200 nm, and an Au layer having a thickness of 300 nm were successively formed by the EB deposition method, and then annealed to form second electrode 50 which was an ohmic electrode. On device support substrate 40, a Ti layer having a thickness of 20 nm and an Au layer having a thickness of 300 nm were successively formed by the EB deposition method, and annealed to thereby form device support substrate electrode 45. In this way, group III nitride semiconductor device 4 which was an SBD was obtained.

The yield of group III nitride semiconductor devices 4 thus obtained was calculated in the following way. Specifically, for SBDs, current-voltage characteristics in the reverse direction were measured. The SBDs were classified into non-defective devices meeting a standard that the breakdown voltage was 250 V or more and defective devices failing to meet this standard, and the percentage of the ratio determined by dividing the non-defective devices by the sum of the non-defective devices and the defective devices was defined as a yield.

In accordance with the method as described above, group III nitride composite substrates each including the joint film having a thickness variation shown in Table 19, and group III nitride semiconductor devices for which the composite substrates were used were fabricated.

These group III nitride composite substrates were each a composite substrate having a diameter of 75 mm (namely 75 mm or more) in which a support substrate and a group III nitride film having a thickness of 110 nm (namely 50 nm or more and less than 10 μm) were bonded to each other.

A relation between the thickness variation of the joint film and the yield of the group III nitride semiconductor devices calculated by the above-described method is shown in Table 19.

TABLE 19

|  | II-A1 | II-A2 | II-A3 | II-A4 | II-A5 | II-A6 | II-A7 |
|---|---|---|---|---|---|---|---|
| thickness variation of joint film (%) | 1 | 2 | 5 | 13 | 25 | 40 | 47 |
| device yield (%) | 40 | 69 | 77 | 84 | 76 | 71 | 33 |

As clearly seen from Table 19, the yield of the semiconductor devices (A2 to A6) in which group III nitride composite substrates each having a thickness variation of the joint film of 2% or more and 40% or less were used was higher than that of the semiconductor devices (A1 and A7) in which group III nitride composite substrates failing to satisfy this condition were used.

Reference Example II-B

In a similar manner to Reference Example II-A, group III nitride composite substrates each including a support substrate and a group III nitride film joined to each other with the shear joint strength and the ratio of the joint area shown in Table 20, and group III nitride semiconductor devices for which these composite substrates were used were fabricated.

These group III nitride composite substrates were each a composite substrate having a diameter of 75 mm (namely 75 mm or more) in which a support substrate and a group III nitride film having a thickness of 110 nm (namely 50 nm or more and less than 10 μm) were bonded to each other.

A relation between the shear joint strength and the ratio of the joint area and the yield of the group III nitride semiconductor devices calculated by the above-described method is shown in Table 20.

TABLE 20

|  | II-B1 | II-B2 | II-B3 | II-B4 | II-B5 | II-B6 | II-B7 | II-B8 | II-B9 |
|---|---|---|---|---|---|---|---|---|---|
| shear joint strength (MPa) | 2 | 4 | 4 | 10 | 30 | 33 | 40 | 40 | 60 |
| ratio of joint area (%) | 80 | 60 | 98 | 70 | 90 | 51 | 60 | 98 | 99 |
| device yield (%) | 25 | 66 | 67 | 75 | 84 | 39 | 64 | 74 | 45 |

As clearly seen from Table 20, the yield of the semiconductor devices (B2 to B5, B7, and B8) in which used group III nitride composite substrates each having a shear joint strength between the support substrate and the group III nitride film of 4 MPa or more and 40 MPa or less and a ratio of the joint area between the support substrate and the group III nitride film of 60% or more and 98% or less was higher than that of the semiconductor devices (B1, B6, and B9) in which group III nitride composite substrates failing to satisfy this condition were used.

Reference Example II-C

In a similar manner to Reference Example II-A except for the following conditions (i) to (v), group III nitride composite substrates according to Reference Example II-C and group III nitride semiconductor devices for which these composite substrates were used were fabricated:

(i) a composite oxide substrate selected from an $Al_2O_3$—$SiO_2$ composite oxide substrate (composite oxide substrate in which, with respect to the whole substrate, $Al_2O_3$ was 82% by mass and $SiO_2$ was 18% by mass), a mullite-YSZ substrate, and a mullite substrate was used as support substrate 11;

(ii) different diameters in a range of 75 mm to 150 mm were used;

(iii) joint film 12 was grown by the AP-CVD (Atmospheric Pressure-Chemical Vapor Deposition) method, (iv) support-substrate 11-side main surface 1 in was finish-polished under the condition that action coefficient FE was $8.5 \times 10^{-17}$ m$^2$/s or more and $1 \times 10^{-16}$ m$^2$/s or less; and (v) finish-polished group III nitride films 13 having different thicknesses in a range of 100 nm to 1 μm were used.

It should be noted that the thickness variations of the joint films in group III nitride composite substrates in Reference Example II-C were all 5% (namely 2% or more and 40% or less).

The relation between the characteristics of the group III nitride composite substrates in Reference Example II-C and the yield of group III nitride semiconductor devices for which the composite substrates are used is shown in Table 21.

TABLE 21

|  | II-C1 | II-C2 | II-C3 | II-C4 | II-C5 | II-C6 | II-C7 | II-C8 | II-C9 | II-C10 | II-C11 | II-C12 | II-C13 |
|---|---|---|---|---|---|---|---|---|---|---|---|---|---|
| diameter (mm) | 75 | 75 | 75 | 75 | 100 | 100 | 100 | 100 | 100 | 100 | 100 | 150 | 150 |
| kind of support substrate | Al$_2$O$_3$—SiO$_2$ | | | | mullite | | YSZ | Al$_2$O$_3$—SiO$_2$ | | | mullite | | Al$_2$O$_3$—SiO$_2$ |
| $\alpha_{III-N}/\alpha_S$ (—) | 1 | 1 | 1 | 1 | 1 | 1 | 1 | 1.25 | 0.9 | 0.75 | 1.2 | 1.2 | 1 |
| $t_{III-N}/t_S$ (—) | 0.0001 | 0.002 | 0.005 | 0.02 | 0.002 | 0.005 | 0.02 | 0.002 | 0.002 | 0.002 | 0.002 | 0.002 | 0.005 |
| thickness variation of joint film (%) | 5 | 5 | 5 | 5 | 5 | 5 | 5 | 5 | 5 | 5 | 5 | 5 | 5 |
| device yield (%) | 60 | 70 | 72 | 64 | 76 | 76 | 65 | 68 | 75 | 67 | 62 | 63 | 75 |

In Table 21, $\alpha_{III-N}/\alpha_S$ represents the ratio of thermal expansion coefficient $\alpha_{III-N}$ of the group III nitride film to thermal expansion coefficient $\alpha_S$ of the support substrate, and $t_{III-N}/t_S$ represents the ratio of thickness $t_{III-N}$ of the group III nitride film to thickness $t_S$ of the support substrate.

As clearly seen from Table 21, among the group III nitride composite substrates having a diameter of 75 mm or more and including the support substrate and the group III nitride film with a thickness of 100 nm to 1 µm (namely 50 nm or more and less than 10 µm) that were bonded to each other, where the joint film had a thickness variation of 5% (namely 2% or more and 40% or less), group III nitride composite substrates having $t_{III-N}/t_S$ of 0.0002 or more and 0.02 or less could be used to manufacture group III nitride semiconductor devices with a particularly high yield.

In addition to the above, in the composite substrates having $\alpha_{III-N}/\alpha_S$ of 0.75 or more and 1.25 or less, crack did not occur at all, and their yield was also high.

Reference Example II-D

In a similar manner to Reference Example II-A except that a support substrate having thermal conductivity $\lambda_S$ shown in Table 22 was used, group III nitride composite substrates and group III nitride semiconductor devices for which these composite substrates were used were fabricated.

The relation between thermal conductivity $\lambda_S$ of the support substrate and the yield of group III nitride semiconductor devices is shown in Table 22.

TABLE 22

|  | II-D1 | II-D2 | II-D3 | II-D4 | II-D5 | II-D6 | II-D7 | II-D8 | II-D9 |
|---|---|---|---|---|---|---|---|---|---|
| thermal conductivity of support substrate $\lambda_s$ (W·m$^{-1}$·K$^{-1}$) | 2 | 3 | 5 | 10 | 30 | 120 | 210 | 280 | 300 |
| thickness variation of joint film (%) | 5 | 5 | 5 | 5 | 5 | 5 | 5 | 5 | 5 |
| device yield (%) | 55 | 63 | 65 | 67 | 67 | 66 | 64 | 61 | 55 |

As clearly seen from Table 22, among the group III nitride composite substrates having a diameter of 75 mm or more and including the support substrate and the group III nitride film with a thickness of 100 nm to 1 µm (namely 50 nm or more and less than 10 µm) that were bonded to each other, where the joint film had a thickness variation of 5% (namely 2% or more and 40% or less), group III nitride composite substrates having a thermal conductivity $\lambda_S$ of 3 W·m$^{-1}$·K$^{-1}$ or more and 280 W·m$^{-1}$·K$^{-1}$ or less could be used to manufacture group III nitride semiconductor devices with a particularly high yield.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 group III nitride composite substrate; 1L, 1LS joined substrate; 2 laminated group III nitride composite substrate; 3 laminated substrate; 4 group III nitride semiconductor device; 5D, 5Dr support-incorporated group III nitride film donor substrate; 11 support substrate; 11m, 11n, 12am, 12bn, 12m, 13m, 13n, 130n main surface; 12, 14 joint film; 13 group III nitride film; 13D, 13Dr group III nitride film donor substrate; 13i ion implantation region; 15 group III nitride film donor substrate support; 20 group III nitride layer; 21 n-GaN layer; 22 n-In$_{0.05}$Ga$_{0.95}$N layer; 23 active layer; 24 p-Al$_{0.09}$Ga$_{0.91}$N layer; 25 p-GaN layer; 26 GaN layer; 27 Al$_{0.2}$Ga$_{0.8}$N layer; 28 n$^+$-GaN layer; 29 n$^-$-GaN layer; 30 first electrode; 33, 43 pad electrode; 40 device support substrate; 44 joint metal film; 45, 46 device support substrate electrode; 50 second electrode; 60 source electrode; 70 drain electrode; 80 gate electrode; 130 base substrate; 140 protective member

The invention claimed is:

1. A group III nitride composite substrate with a diameter of 75 mm or more including a support substrate and a group III nitride film, that are bonded to each other, said support substrate being a hetero-composition substrate having a different chemical composition from a group III nitride, a thickness of said group III nitride film being 50 nm or more and less than 10 µm, a ratio $s_t/m_t$ of a standard deviation $s_t$ of the thickness of said group III nitride film, to a mean value $m_t$ of the thickness thereof being 0.01 or more and 0.5 or less, and a ratio $s_o/m_o$ of a standard deviation $s_o$ of an absolute value of an off angle between a main surface of said group III nitride film and a plane of a predetermined plane orientation, to a mean value $m_o$ of the absolute value of the off angle being 0.005 or more and 0.6 or less.

2. The group III nitride composite substrate according to claim 1, wherein a mean value $m_{III-N}$ of a root mean square roughness of a group III-nitride-film-side main surface of the group III nitride composite substrate is 0.4 nm or more and 10 nm or less, and a ratio $s_{III-N}/m_{III-N}$ of a standard deviation $s_{III-N}$ of the root mean square roughness of the group III-nitride-film-side main surface, to the mean value $m_{III-N}$ thereof is 0.008 or more and 0.5 or less.

3. The group III nitride composite substrate according to claim 1, wherein a ratio $W_{III-N}/D$ of a warp $W_{III-N}$ of a group III-nitride-film-side main surface of the group III nitride composite substrate to a diameter D of the group III nitride composite substrate is $7 \times 10^{-4}$ or more and $8 \times 10^{-4}$ or less.

4. The group III nitride composite substrate according to claim 1, wherein a ratio $\alpha_{III-N}/\alpha_S$ of a thermal expansion coefficient $\alpha_{III-N}$ of said group III nitride film to a thermal expansion coefficient $\alpha_s$ of said support substrate is 0.75 or more and 1.25 or less, and a ratio $t_{III-N}/t_S$ of a thickness $t_{III-N}$ of said group III nitride film to a thickness $t_s$ of said support substrate is $1 \times 10^{-4}$ or more and $2 \times 10^{-2}$ or less.

5. The group III nitride composite substrate according to claim 1, wherein impurity metal atoms of the main surface of said group III nitride film are $1 \times 10^{13}$ atoms/cm$^2$ or less.

6. The group III nitride composite substrate according to claim 1, wherein said support substrate has a thermal conductivity $\lambda_S$ of 3 W·m$^{-1}$·K$^{-1}$ or more and 280 W·m$^{-1}$·K$^{-1}$ or less.

7. The group III nitride composite substrate according to claim 1, wherein said support substrate has a Young's modulus $E_S$ of 150 GPa or more and 500 GPa or less.

8. The group III nitride composite substrate according to claim 1, wherein said group III nitride composite substrate has a diameter of 100 mm or more.

9. A laminated group III nitride composite substrate comprising the group III nitride composite substrate as recited in claim 1, and at least one group III nitride layer disposed on a group III-nitride-film-side main surface of said group III nitride composite substrate.

10. A group III nitride semiconductor device comprising said group III nitride film in the group III nitride composite substrate as recited in claim 1, and at least one group III nitride layer disposed on said group III nitride film.

11. A method for manufacturing a group III nitride composite substrate as recited in claim 1, comprising the steps of:
  forming said group III nitride composite substrate by disposing said group III nitride film on a main surface side of said support substrate; and
  adjusting the thickness of said group III nitride film and the off angle between the main surface of said group III nitride film and a plane of a predetermined plane orientation by performing at least one of polishing and etching on a group III-nitride-film-side main surface of said group III nitride composite substrate, after said step of forming said group III nitride composite substrate.

12. A method for manufacturing a group III nitride semiconductor device, comprising the steps of:
  preparing the group III nitride composite substrate as recited in claim 1; and
  growing at least one group III nitride layer on a group III-nitride-film-side main surface of said group III nitride composite substrate.

13. The method for manufacturing a group III nitride semiconductor device according to claim 12, further comprising the step of removing said support substrate from said group III nitride composite substrate, after said step of growing the group III nitride layer.

14. The method for manufacturing a group III nitride semiconductor device according to claim 13, further comprising the step of bonding a device support substrate onto said group III nitride layer, after said step of growing the group III nitride layer and before said step of removing said support substrate.

* * * * *